(12) United States Patent
Becherer et al.

(10) Patent No.: US 8,872,547 B2
(45) Date of Patent: Oct. 28, 2014

(54) NANOMAGNETIC LOGIC GATE AND AN ELECTRONIC DEVICE

(71) Applicant: Technische Universitaet Muenchen, Munich (DE)

(72) Inventors: Markus Becherer, Munich (DE); Josef Kiermaier, Unterdietfurt (DE); Stephen Breitkreutz, Munich (DE); Irina Eichwald, Munich (DE); Doris Schmitt-Landsiedel, Ottobrunn (DE)

(73) Assignee: Technische Universitaet Muenchen, Munich (DE)

( * ) Notice: Subject to any disclaimer, the term of this patent is extended or adjusted under 35 U.S.C. 154(b) by 0 days.

(21) Appl. No.: 13/954,518

(22) Filed: Jul. 30, 2013

(65) Prior Publication Data

US 2014/0028351 A1 Jan. 30, 2014

(30) Foreign Application Priority Data

Jul. 30, 2012 (EP) .................................... 12005539
Jul. 30, 2012 (EP) .................................... 12005540

(51) Int. Cl.
*H03K 19/20* (2006.01)
*H01L 29/82* (2006.01)
*H03K 19/168* (2006.01)
*B82Y 25/00* (2011.01)
*H01L 43/00* (2006.01)
*G11C 11/14* (2006.01)
*H01L 27/22* (2006.01)
*B82Y 10/00* (2011.01)

(52) U.S. Cl.
CPC ............... *H03K 19/20* (2013.01); *H01L 29/82* (2013.01); *B82Y 10/00* (2013.01); *H03K 19/168* (2013.01); *B82Y 25/00* (2013.01); *H01L 43/00* (2013.01); *G11C 11/14* (2013.01); *H01L 27/22* (2013.01); *Y10S 977/94* (2013.01)
USPC ............................ 326/104; 365/158; 977/940

(58) Field of Classification Search
None
See application file for complete search history.

(56) References Cited

U.S. PATENT DOCUMENTS 7,291,892 B2 * 11/2007 Min et al. ...................... 257/421
8,358,153 B2 * 1/2013 Worledge et al. .............. 326/104
(Continued)

FOREIGN PATENT DOCUMENTS

EP 2378664 A1 10/2011

OTHER PUBLICATIONS

Ju, et al. "Computational Model of Partially Irradiated Nanodots for Field-Coupled Computing Devices." 14th International Workshop on Computational Electronics (IWCE). Oct. 26-29, 2010.

(Continued)

*Primary Examiner* — Jany Richardson
(74) *Attorney, Agent, or Firm* — Eschweiler & Associates, LLC

(57) ABSTRACT

A nanomagnetic logic gate arranged on a substrate according to an embodiment includes at least one nanomagnetic first structure, at least one nanomagnetic second structure and at least two layers including a first layer and a second layer, wherein at least one first structure is arranged in the first layer on or parallel to a main surface of the substrate, wherein at least one second structure is arranged in the second layer parallel to the first layer, and wherein at least one second structure includes an artificial nucleation center arranged such that a magnetic field component essentially perpendicular to the main surface provided by at least one first structure couples to the artificial nucleation center such that a magnetization of the second structure is changeable in response to the magnetic field component coupled into the artificial nucleation center, when a predetermined condition is fulfilled.

15 Claims, 27 Drawing Sheets

(56) References Cited

U.S. PATENT DOCUMENTS

2010/0315123 A1* 12/2010 Niemier et al. ................. 326/52
2011/0286255 A1   11/2011 Worledge et al.
2012/0134199 A1    5/2012 Zhu et al.

OTHER PUBLICATIONS

Niemier, et al. "Nanomagnet Logic: Progress Toward System-Level Integration." Journal of Physics: Condensed Matter Published on Nov. 25, 2011.
Philip Teichmann. Adiabatic Logic: Future Trend and System Level Perspective, vol. 34 of Springer Series in Advanced Microelectronics. Springer, Published in 2012. Chapters 5 & 7. 58 Pages.
The International Technology Roadmap for Semiconductors (ITRS): Emerging Research Devices (ERD). http://www.itrs.net, 2011.
DARPA Broad Agency Announcement "Non-Volatile Logic (NV Logic)". https://www.fbo.gov, 2010.
D. A. Allwood, Gang Xiong, M. D. Cooke, C. C. Faulkner, D. Atkinson, N. Vernier, and R. P. Cowburn. Submicrometer ferromagnetic NOT gate and shift register. Science, 296:2003-2006, 2002.
D. A. Allwood, G. Xiong, C. C. Faulkner, D. Atkinson, D. Petit, and R. P. Cowburn. Magnetic domain-wall logic. Science, 309:1688-1692, 2005.
D. A. Allwood, Gang Xiong, and R. P. Cowburn. Magnetic domain wall serial-in parallel-out shift register. Applied Physics Letters, 89:102504, 2006.
H. T. Zeng, D. Read, L. O"Brien, J. Sampaio, E. R. Lewis, D. Petit, and R. P. Cowburn. Asymmetric magnetic NOT gate and shift registers for high density data storage. Journal of Applied Physics Letters, 96:262510, 2010.
E. R. Lewis, D. Petit, L. O"Brien, H. T. Zeng, D. E. Read, and R. P. Cowburn. Chirality dependence of nanoscale ferromagnetic NOT gates. Journal of Applied Physics, 109:053904, 2011.
G. Csaba, W. Porod, and A. I. Csurgay. A computing architecture composed of field-coupled single-domain nanomagnets clocked by magnetic fields. International Journal of Circuit Theory and Applications, 31:67-82, 2003.
A. Imre, G. Csaba, L. Ji, A. Orlov, G.H. Bernstein, and W. Porod. Majority logic gate for magnetic quantum-dot cellular automata. Science, 311:205-208, Jan. 2006.
G. Csaba, W. Porod, P. Lugli, and A. I. Csurgay. Activity in field-coupled nanomagnet arrays. International Journal of Circuit Theory and Applications, 35:281-293, 2007.
A. Dingier, X.S. Niemier, M.and Hu, and M.T. Alam. System-level energy and performance projections for nanomagnet-based logic. In IEEE/ACM International Symposium on Nanoscale Architectures (NANOARCH), 2009.
M. T. Alam, M. J. Siddiq, G. H. Bernstein, M. Niemier, W. Porod, and X. S. Hu. On-chip clocking for nanomagnet logic device. IEEE Transactions on Nanotechnology, 9(3):348-351, 2010.
M. T. Niemier, G.H. Bernstein, G. Csaba, A. Dingier, X.S. Hu, S. Kurtz, S. Liu, J. Nahas, W. Porod, M. Siddiq, and E. Varga. Nanomagnet logic: progress toward system-level integration. Journal of Physics: Condensed Matter, 23:493202, 2011.
S. Kurtz, E. Varga, M. J. Siddiq, M. Niemier, W. Porod, X. S. Hu, and G. H. Bernstein. Non-majority magnetic logic gates: a review of experiments and future prospects for "shape-based" logic. Journal of Physics: Condensed Matter, 23:053202, 2011.
M. Becherer, G. Csaba, W. Porod, R. Emling, P. Lugli, and D. Schmitt-Landsiedel. Magnetic ordering of focused-ion-beam structured Cobalt—Platinum dots for field-coupled computing. IEEE Transactions on Nanotechnology, 7(3):316-320, 2008.
M. Becherer, G. Csaba, R. Emling, W. Porod, P. Lugli, and D. Schmitt-Landsiedel. Field-coupled nanomagnets for interconnect-free nonvolatile computing. In Digest Technical Papers IEEE International Solid-State Circuits Conference, ISSCC, pp. 474-475, Feb. 2009.
J. Kiermaier, S. Breitkreutz, X. Ju, G. Csaba, D. Schmitt-Landsiedel, and M. Becherer. Field-coupled computing: Investigating the properties of ferromagnetic nanodots. Solid-State Electronics, Selected papers of ESSDERC 2010, 65-66:240-245, 2011.
S. Breitkreutz, J. Kiermaier, X. Ju, G. Csaba, D. Schmitt-Landsiedel, and M. Becherer. Nanomagnetic Logic: Demonstration of Directed Signal Flow for Field-coupled Computing Devices. In IEEE Proceedings of the 41st European Solid-State Device Research Conference ESSDERC, pp. 323-326, 2011.
G. Csaba, P. Lugli, M. Becherer, D. Schmitt-Landsiedel, and W. Porod. Field-coupled computing in magnetic multilayers. Journal of Computational Electronics, 7:454-457, 2008.
X. Ju, S. Wartenburg, M. Becherer, J. Kiermaier, S. Breitkreutz, P. Lugli, and G. Csaba. Computational model of partially irradiated nanodots for field-coupled computing devices. In 14th International Workshop on Computational Electronics, IWCE, Pisa, Italy, Oct. 2010.
X. Ju, S. Wartenburg, J. Rezgani, M. Becherer, J. Kiermaier, S. Breitkreutz, D. Schmitt-Landsiedel, W. Porod, P. Lugli, and G. Csaba. Nanomagnet logic from partially irradiated Co/Pt nanomagnets. IEEE Transactions on Nanotechnology, 11(1):97-104, 2012.
D. H. Smith. A magnetic shift register employing controlled domain wall motion. IEEE Transactions on Magnetics, MAG1(4):281-284, 1965.
R. J. Spain. Controlled domain tip propagation. Part I. Journal of Applied Physics, 37(7):2572-2583, 1966.
J.O. Klein, E. Belhaire, C. Chappert, R.P. Cowburn, D. Read, and D. Petit. Magnetic Domain Wall Logic Requires New Synthesis Methodologies. International Journal of Electronics, 95(3):249-252, 2002.
D. A. Allwood, G. Xiong, and R. P. Cowburn. Domain wall cloning in magnetic nanowires. Journal of Applied Physics, 101(024308):1-4, 2007.
D. A. Allwood, G. Xiong, and R. P. Cowburn. Writing and erasing data in magnetic domain wall logic systems. Journal of Applied Physics, 100(123908), 2006.
Jacques-Olivier Klein, Eric Belhaire, Claude Chappert, Russel P. Cowburn, Dorothée Petit, and Dan Read. VHDL Simulation of Magnetic Domain Wall Logic. IEEE Transactions on Magnetics, 42:2754-2756, 2006.
M. Niemier, M. Alam, X. S. Hu, G. Bernstein, W. Porod, M. Putney, and J. DeAngelis. Clocking structures and power analysis for nanomagnet-based logic devices. In Proceedings of the 2007 International Symposium on Low Power Electronics and Design, 2007.
G. Csaba, A. Imre, G. H. Bernstein, W. Porod, and V. Metlushko. Nanocomputing by field-coupled nanomagnets. IEEE Transactions on Nanotechnology, 1(4):209-213, 2002.
M. Graziano, M. Vacca, A. Chiolerio, and M. Zamboni. An NCL-HDL Snake-Clock-Based Magnetic QCA Architecture. IEEE Transactions on Nanotechnology, 10(5):1141-1149, 2011.
M. Crocker, Xiaobo Sharon Hu, M. Niemier, Minjun Yan, and G. Bernstein. PLAs in Quantum-Dot Cellular Automata. IEEE Transactions on Nanotechnology, 7(3):376-386, 2008.
Ch. Augustine, B. Behin-Aein, X. Fong, and K. Roy. A Design Methodology and Device / Circuit / Architecture Compatible Simulation Framework for Low-Power Magnetic Quantum Cellular Automata. In Proceedings of the 2009 Asia and South Pacific Design Automation Conference, 2009.
A. Imre, G. Csaba, V. Metlushko, G. H. Bernstein, and W. Porod. Controlled domain wall motion in micron-scale permalloy square rings. Physica E—Low Dimensional Systems & Nanostructures, 19(1-2):240-245, 2003.
E. Varga, A. Orlov, M. T. Niemier, X. S. Hu, G. H. Bernstein, and W. Porod. Experimental Demonstration of Fanout for Nanomagnetic Logic. IEEE Transactions on Nanotechnology, 9(6):668-670, 2010.
G. Csaba and W. Porod. Behavior of Nanomagnet Logic in the presence of thermal noise. In 14th International Workshop on Computational Electronics (IWCE), 2010.
C. Chappert, H. Bernas, J. Ferrée, V. Kottler, Y. Chen, E. Cambril, T. Devolder, F. Rousseaux, V. Mathet, and H. Launois. Planar patterned magnetic media obtained by ion irradiation. Science, 280:1919-1922, 1998.
T. Aign, P. Meyer, S. Lemerle, J. P. Jamet, J. Ferré, V. Mathet, C. Chappert, J. Gierak, C. Vieu, F. Rousseaux, H. Launois, and H.

(56) References Cited

OTHER PUBLICATIONS

Bernas. Magnetization reversal in arrays of perpendicularly magnetized ultrathin dots coupled by dipolar interaction. Physical Review Letters, 81:5656-5659, 1998.

S. Breitkreutz, J. Kiermaier, I. Eichwald, X. Ju, G. Csaba, D. Schmitt-Landsiedel, and M. Becherer. Majority gate for nanomagnetic logic with perpendicular magnetic anisotropy. In INTERMAG 2012, Vancouver, Canada. Accepted for publication in: IEEE Transactions on Magnetics, vol. 48, No. 11., 2012.

S. Breitkreutz, J. Kiermaier, S. V. Karthik, G. Csaba, D. Schmitt-Landsiedel, and M. Becherer. Controlled reversal of Co/Pt dots for nanomagnetic logic applications. Journal of Applied Physics, 111(7):A715, 2012.

Markus Becherer. Nanomagnetic Logic in Focused Ion Beam Engineered Co/Pt Multilayer Films, vol. 38 of Selected Topics of Electronics and Micromechatronics. Shaker Verlag, 2011.

A. Kahng. System Drivers and Design. Technical report, ITRS Winter Public Conference Presentations, http://www.itrs.net/Links/2011Winter/6_Design.pdf, slide 17, 2011.

K. Yamada, J.-P. Jamet, Y. Nakatani, A. Mougin, A. Thiaville, T. Ono, and J. Ferré. Influence of Instabilities on High Field Magnetic Domain Wall Velocity in (Co/Ni) Nanostrips. Applied Physics Express, 4:113001-1, 2011.

D.S. Gardner, G. Schrom, P. Hazucha, F. Paillet, T. Karnik, S. Borkar, R. Hallstein, T. Dambrauskas, C. Hill, C. Linde, W. Worwag, R. Baresel, and S. Muthukumar. Integrated on-chip inductors using magnetic material (invited). Journal of Applied Physics, 103:07E927:1-7, 2008.

R. P. Cowburn and M. E. Welland. Room temperature magnetic quantum cellular automata. Science, 287:1466-1468, 2000.

C. S. Lent, P. D. Tougaw, W. Porod, and G. H. Bernstein. Quantum cellular automata. Nanotechnology, 4:49-57, 1993.

X. Ju, J. Kiermaier, M. Becherer, S. Breitkreutz, I. Eichwald, D. Schmitt-Landsiedel, W. Porod, P. Lugli, and G. Csaba. Modeling interaction between Co/Pt nanomagnets and Permalloy domain wall for Nanomagnet Logic. In IEEE Nano Conference, Birmingham, UK, 2012.

G. Csaba, M. Becherer, and W. Porod. Development of CAD tools for nanomagnetic logic devices. International Journal of Circuit Theory and Applications, doi: 10.1002/cta.1811:12, 2012.

I. Amlani, A. O. Orlov, G. Toth, G. H. Bernstein, C. S. Lent, and G. L. Snider. Digital Logic Gate Using Quantum-Dot Cellular Automata. Science, 284:289-291, 1999.

B. Taskin, A. Chiu, J. Salkind, and D. Venutolo. A shift-register-based QCA memory architecture. In IEEE International Symposium on Nanoscale Architectures (NANOSARCH), 2007.

J.R. Janulis, P.D. Tougaw, S.C. Henderson, and E.W. Johnson. Serial bit-stream analysis using quantum-dot cellular automata. IEEE Transactions on Nanotechnology, 3(1):158-164, 2004.

V.C. Teja, S. Polisetti, and S. Kasavajjala. QCA based multiplexing of 16 arithmetic & logical subsystems-A paradigm for nano computing. In 3rd IEEE International Conference on Nano/Micro Engineered and Molecular Systems (NEMS 2008), pp. 758-763, 2008.

H. Cho and E.E. Swartzlander. Adder and Multiplier Design in Quantum-Dot Cellular Automata. IEEE Transactions on Computers, 58(6):721-727, 2009.

T. Chia-Ching, R.B. Rungta, and E.R. Peskin. Simulation of a QCA-based CLB and a multi-CLB application. In International Conference on Field-Programmable Technology (FPT 2009), pp. 62-69, 2009.

M. A. Amiri, M. Mandavi, and Mirzakuchaki S. QCA implementation of a MUX-Based FPGA CLB. In International Conference on Nanoscience and Nanotechnology (ICONN 2008), 2008.

G. Csaba, J. Kiermaier, M. Becherer, S. Breitkreutz, X. Ju, P. Lugli, D. Schmitt-Landsiedel, and W. Porod. Clocking Magnetic Field-Coupled Devices by Domain Walls. Journal of Applied Physics, 111:E337, 2012.

G. Csaba, J. Kiermaier, M. Becherer, P. Lugli, and D. Schmitt-Landsiedel. Patent Application, Magnetic Device., 2010.

J. Kiermaier, S. Breitkreutz, I. Eichwald, G. Csaba, D. Schmitt-Landsiedel, and M. Becherer. Programmable Input for Nanomagnetic Logic Devices. In Accepted for Joint European Magnetic Symposia (JEMS), Parma, Italy, 2012.

N. Gupta and N. Gupta. A VLSI Architecture for Image Registration in Real Time. IEEE Transactions on Very Large Scale Integration (VLSI) Systems, 15(9):981-989, 2007.

* cited by examiner

FIB induced modification

TEM-Image
non-irradiated irradiated

FIG 7a
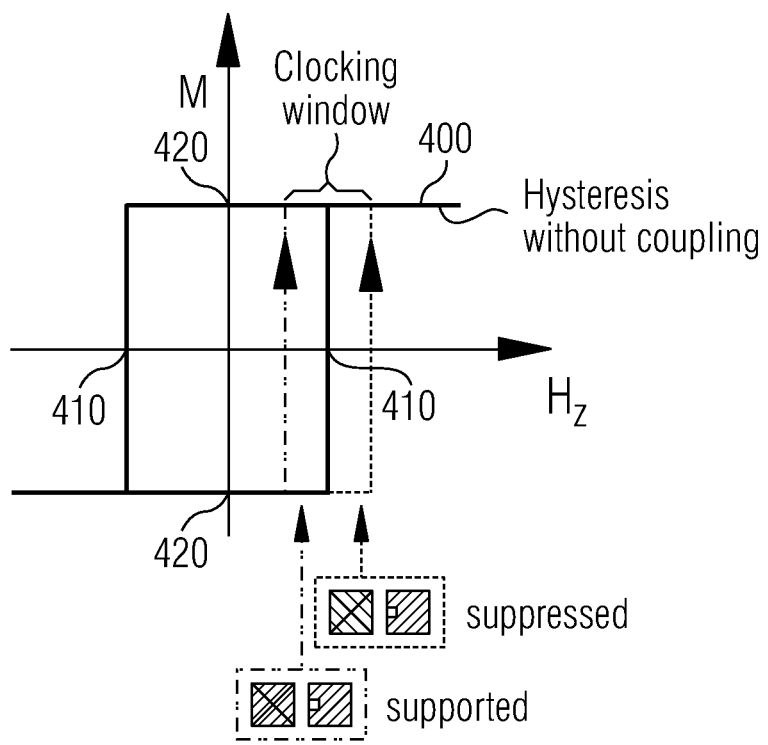
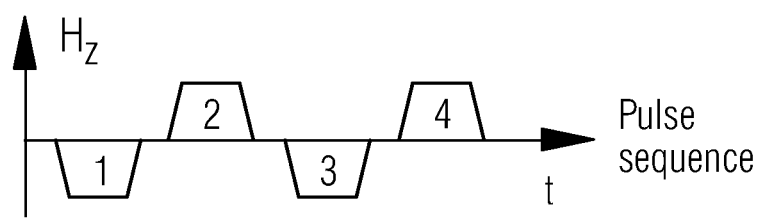

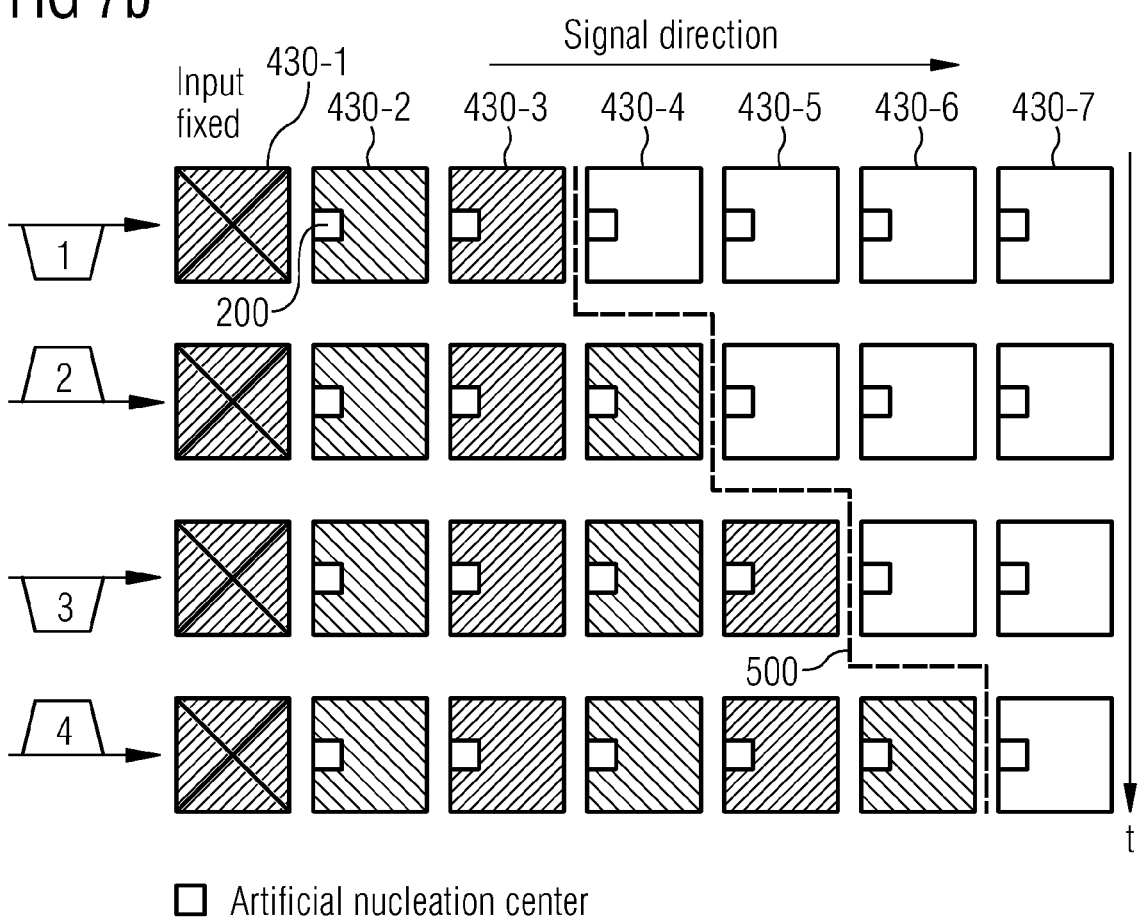

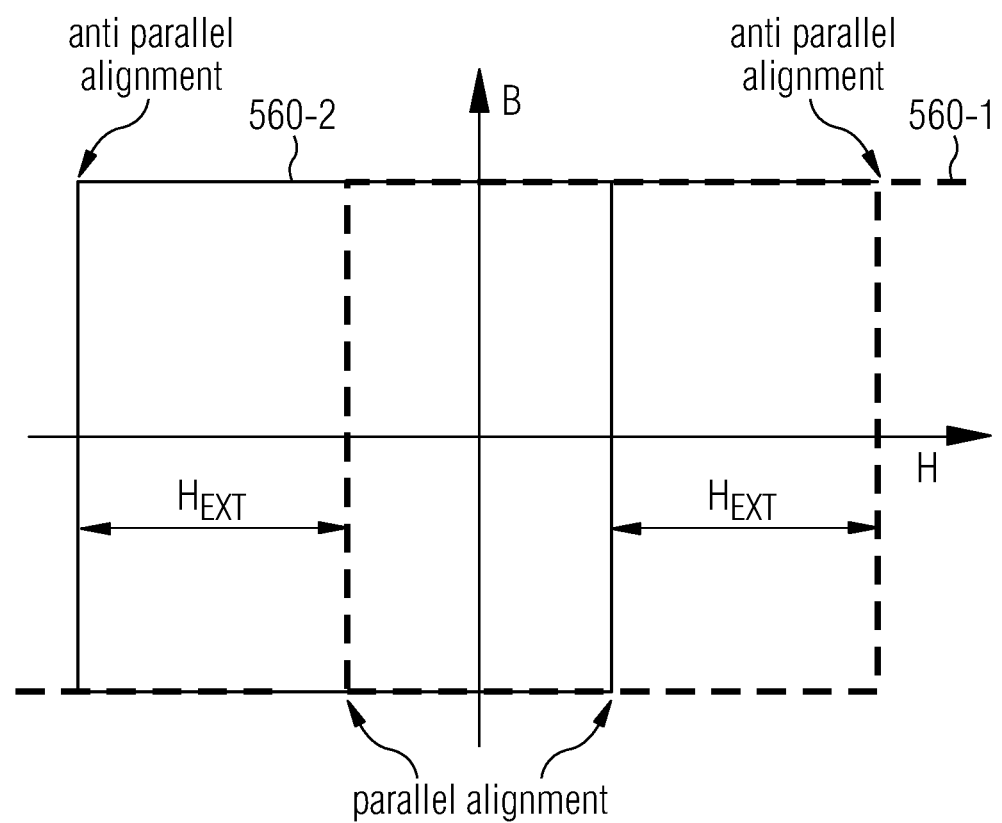

$$c_0 = x_1 \cdot (\overline{\overline{x_1 \cdot \overline{x_1 \cdot x_2}}})$$

$$y = \overline{(\overline{x_1 \cdot (\overline{x_1 \cdot x_2})}) \cdot (\overline{x_2 \cdot (\overline{x_1 \cdot x_2})})}$$

FIG 13

| I1 | I2 | P1 | O2 | |
|---|---|---|---|---|
| ↓ =0 | ↓ =0 | ↓ =0 | ↑ =1 | |
| ↓ =0 | ↑ =1 | ↓ =0 | ↓ =0 | |
| ↑ =1 | ↓ =0 | ↓ =0 | ↓ =0 | NOR |
| ↑ =1 | ↑ =1 | ↓ =0 | ↓ =0 | |
| ↓ =0 | ↓ =0 | ↑ =1 | ↑ =1 | |
| ↓ =0 | ↑ =1 | ↑ =1 | ↑ =1 | |
| ↑ =1 | ↓ =0 | ↑ =1 | ↑ =1 | NAND |
| ↑ =1 | ↑ =1 | ↑ =1 | ↓ =0 | |

AFM topography

Optical micrograph

FIG 16

| D5 ⌀1µS 500µm x 10µm | Pad 1 x 20 | Pad 2 x 20 | Pad 3 (2x50 hyst. loops) | | Pad 4 (2x50 hyst. loops) | |
|---|---|---|---|---|---|---|
| | | | W1 ↑ | W1 → | W1 ↑ | W1 → |
| Mean µ of SF | 160,7 mT | 160,75 mT | 72,79 mT | 73,16 mT | 72,38 mT | 72,01 mT |
| | Lower mag. Wire W1 | | Upper mag. Wire W2 | | | |

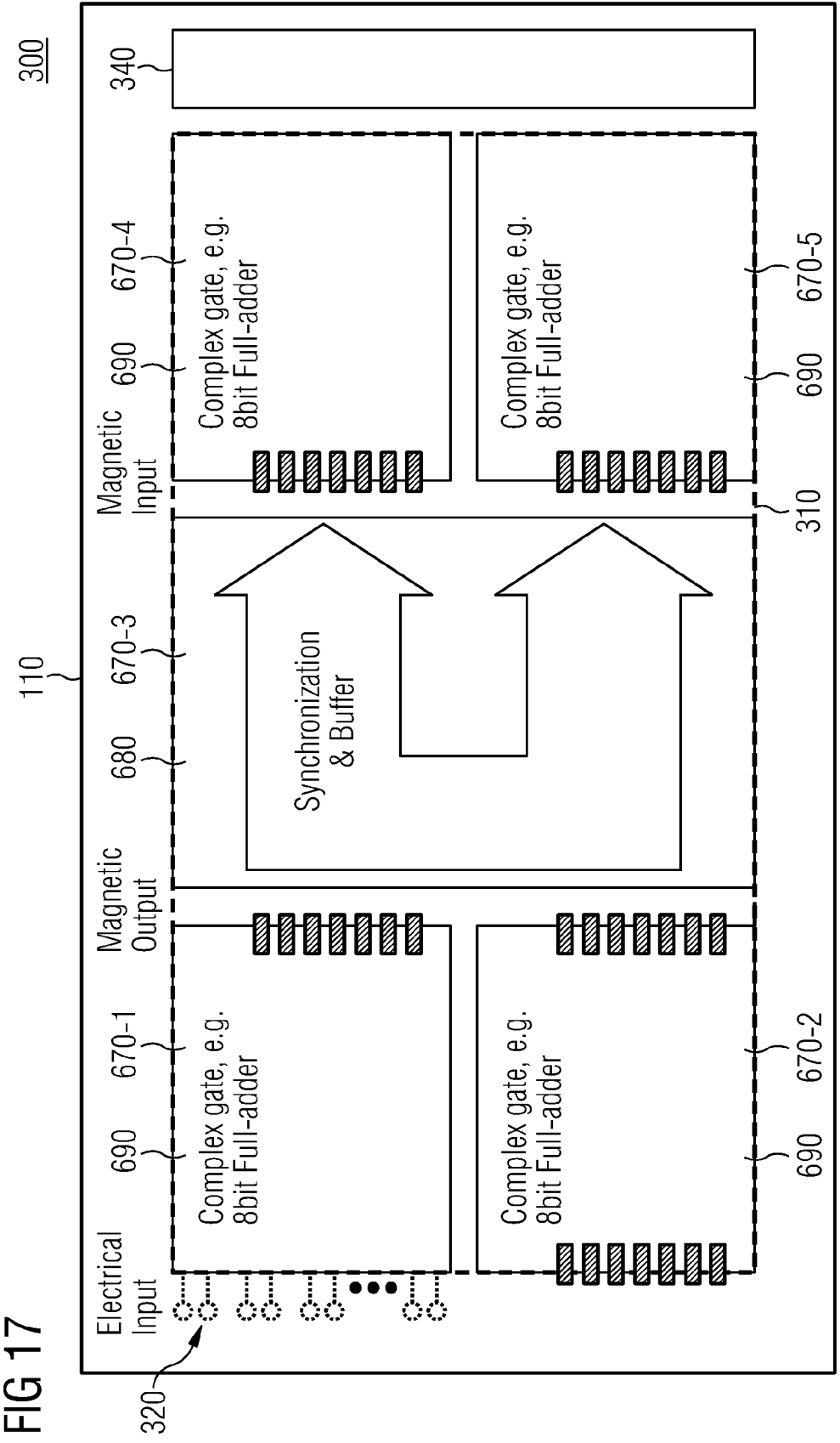

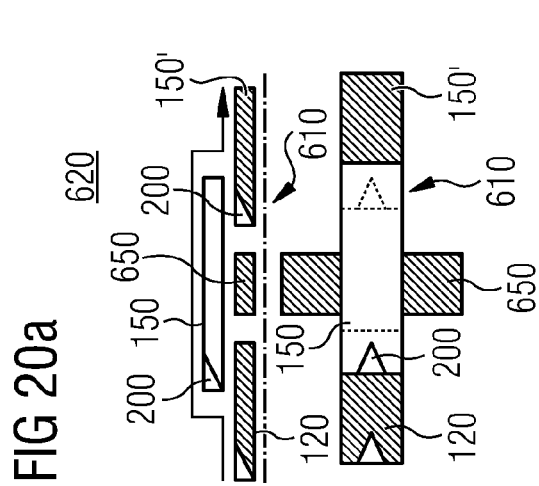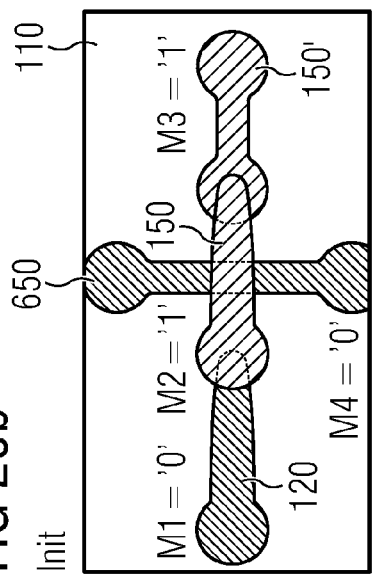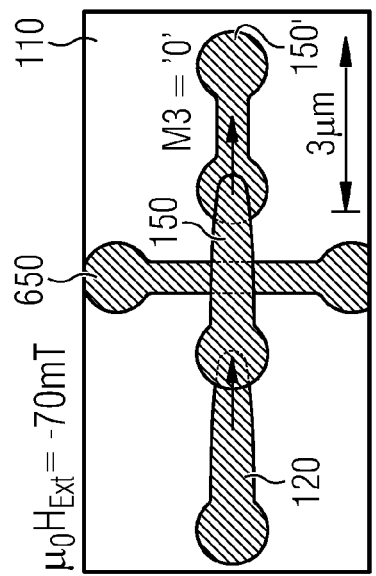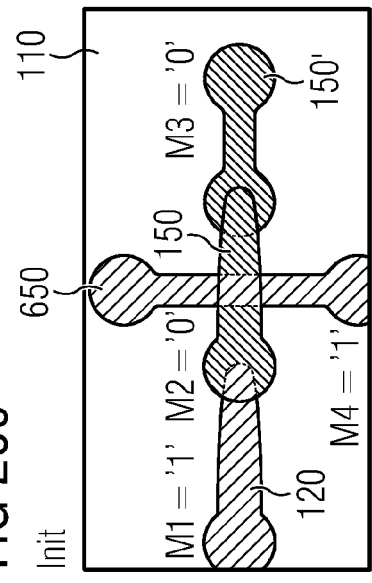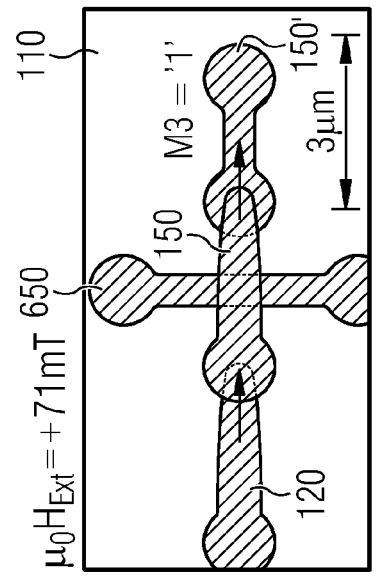

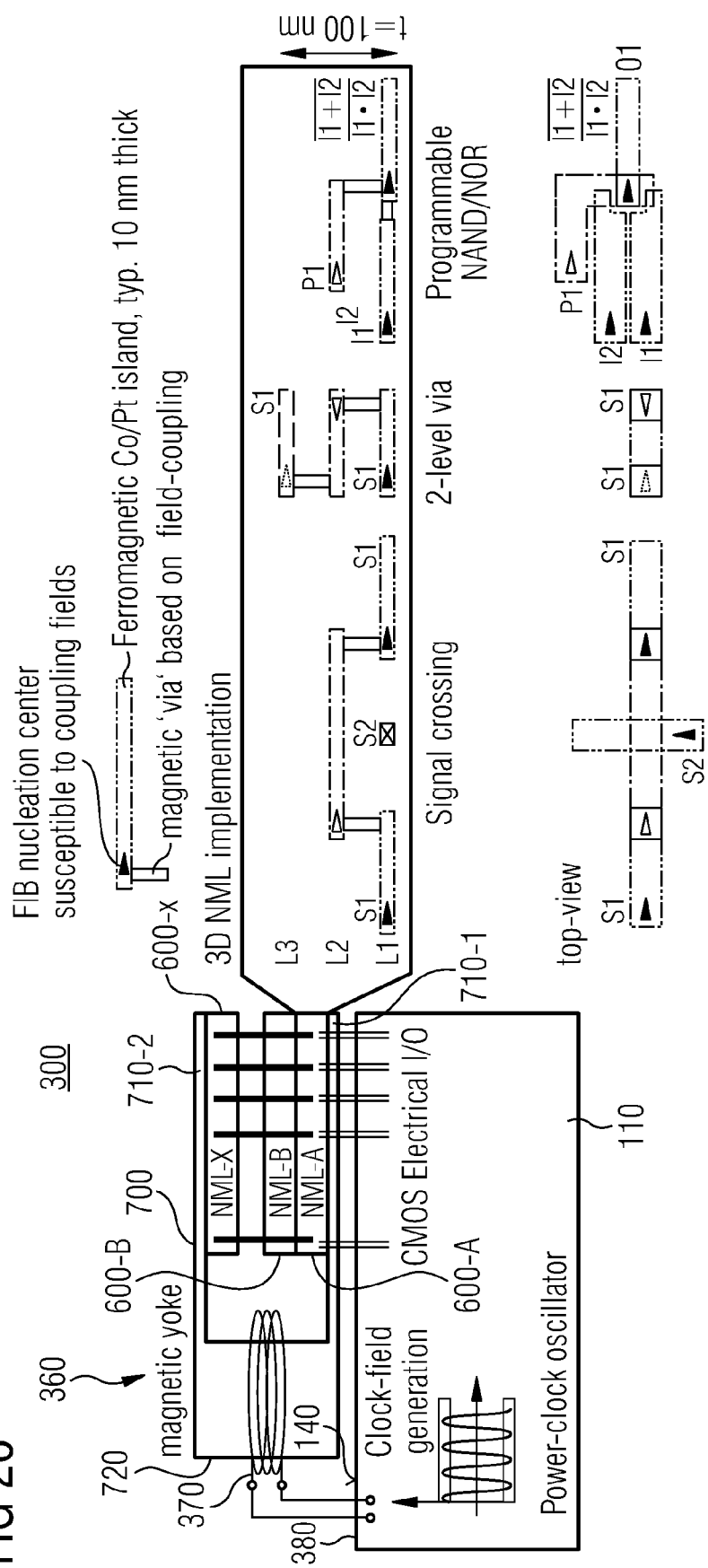

US 8,872,547 B2

NANOMAGNETIC LOGIC GATE AND AN ELECTRONIC DEVICE

CROSS-REFERENCES TO RELATED APPLICATIONS

This application claims priority to European Patent Application, Application Number EP 12 00 55 40, filed Jul. 30, 2012, and to European Patent Application, Application Number EP 12 00 55 39, filed Jul. 30, 2012, the contents of which are incorporated herein by reference in their entirety as if fully set forth herein.

FIELD

Embodiments relate to a nanomagnetic logic gate and an electronic device.

BACKGROUND

Today electronic devices are used for many applications. Depending on the concrete implementation, the boundary conditions under which these electronic devices have been developed and designed may vary strongly. For instance, for mobile applications energy efficiency is very often an issue with a high priority. However, also in other areas of applications, energy efficiency of electronic devices may be an important aspect to be considered.

However, in many fields of applications, improving the performance of electronic devices is also desirable. One approach to increase the performance of such devices is to integrate circuits of the electronic device higher.

Today's electronics and electronic devices are mainly based on employing charge-based circuits. Examples come, for instance, from CMOS-based circuits (CMOS=Complementary Metal-Oxide-Semiconductor). Because of the charge-based concept of these devices, transporting the charge from one structure, such as a logic gate, to another structure, is often inevitable. As a consequence, infrastructure is to be implemented allowing the respective charges to be transported from structure to structure.

Implementing the necessary transport structures may, however, complicate a higher integration since all input terminals of the respective structures as well as their output terminals have to be connected to the previously-mentioned transport structures enabling the charge transport between the respective structures.

Therefore, a demand exists for a logic gate-based circuitry design which enables an easier integration of logic gates.

SUMMARY

A nanomagnetic logic gate according to an embodiment arranged on the substrate comprises at least one nanomagnetic first structure, at least one nanomagnetic second structure and at least two layers comprising a first layer and a second layer, wherein at least one first structure is arranged in the first layer on or parallel to a main surface of the substrate. At least one second structure is arranged in the second layer parallel to the first layer. The structures arranged in the first layer and the second layer are electrically insulated from one another by an insulating layer arranged between the first and second layers. At least one second structure comprises an artificial nucleation center arranged such that a magnetic field component essentially perpendicular to the main surface provided by at least one first structure couples to the artificial nucleation center such that a magnetization of the second structure is changeable in response to the magnetic field component coupled into the artificial nucleation center, when a predetermined condition is fulfilled.

An electronic device according to an embodiment comprises a substrate and at least one nanomagnetic logic gate according to an embodiment arranged on the substrate. It further comprises at least one electrical input circuit arranged and configured to influence a magnetization of at least one first structure of at least one nanomagnetic logic gate in response to an electrical input signal. The electronic device further comprises at least one electrical output circuit configured to sense a magnetization or a change of the magnetization of at least one second structure of at least one nanomagnetic logic gate, wherein the electrical output circuit is further configured to generate an electrical output signal in response to the sensed magnetization or the sensed change of the magnetization.

Embodiments are based on the finding that a higher and yet easier integration of logic gates may be achievable due to the magnetic interaction of the at least one nanomagnetic first structure and the at least one nanomagnetic second structure and the described three-dimensional implementation, wherein at least one first structure and at least one second structure are arranged in different layers parallel to the main surface of the substrate.

BRIEF DESCRIPTION OF THE DRAWINGS

Several embodiments of the present disclosure will be described in the enclosed Figures.

FIG. 5b shows a schematic energy diagram of a nanomagnetic dot of FIG. 5a;

FIG. 7a shows a hysteresis curve along with a pulse sequence of an external magnetic field;

FIG. 7b shows a sequence of nanomagnetic dots along with their magnetizations as a function of time and the pulses of FIG. 7a;

FIG. 8b shows a schematic representation of a magnetization of the inverter ring of FIG. 8a;

FIG. 9 shows two resulting flux density curves;

FIG. 13 shows a truth table for a NAND/NOR-gate according to an embodiment;

FIG. 14b shows an AFM-topography of the sample shown in FIG. 14a;

FIG. 16 shows a table containing values of the sample shown in FIG. 15;

FIG. 17 shows a block diagram of an electronic device according to an embodiment;

FIG. 20a shows a cross-sectional view and a top view of a signal crossing;

FIG. 20b shows results of a MFM-measurement of the signal crossing of FIG. 20a;

FIG. 20c shows results of a MFM-measurement of the signal crossing of FIG. 20a;

FIG. 21 b shows a MFM-measurement of the nanomagnetic logic gate of FIG. 21a;

FIG. 22 illustrates a switching behavior of the nanomagnetic logic gate 100 of FIG. 21a;

FIG. 23b shows a cross-sectional view of the permalloy-input shown in FIG. 23a;

FIG. 26 shows a schematic view of an electronic device according to an embodiment comprising a different magnetic field generator;

FIG. 27b shows a cross-section through the on-chip inductor shown in FIG. 27a.

DETAILED DESCRIPTION

In the following, embodiments according to the present disclosure will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

Figure 1:
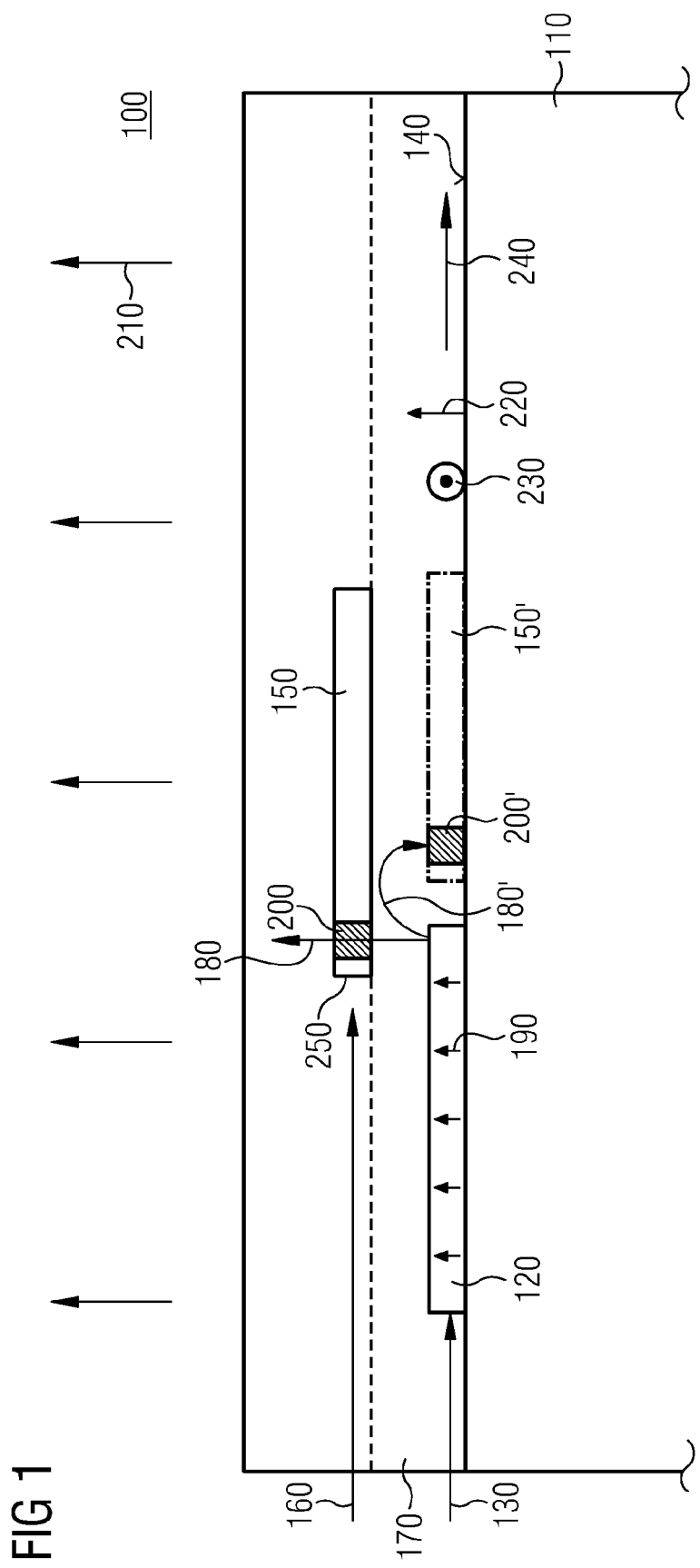
FIG. 1 shows a schematic cross section through a substrate comprising a nanomagnetic logic gate according to an embodiment.

FIG. 1 shows a schematic cross-section through a nanomagnetic logic gate 100 arranged on a substrate 110. The nanomagnetic logic gate 100 comprises at least one nanomagnetic first structure 120, which is arranged in a first layer 130, which is on or parallel to a main surface 140 of a substrate 110. The main surface 140 is typically a surface perpendicular to a direction, along which the substrate 110 comprises its smallest extension. In other words, a substrate 110 often comprises a cubic shape with one direction, typically referred to as the z-direction, along which the cubic shape has its smallest extension. The other two directions, which are parallel to the main surface 140, are often referred to as the x- and y-directions. Optionally, the small x-, the small y- and the z-form an orthogonal coordinate system. In case the substrate 110 is a monocrystalline substrate or a quasi-monocrystalline substrate, the crystal axes of the substrate 110 are not required to be parallel to the x-, y- and z-directions as outlined before.

The nanomagnetic logic gate 100 further comprises at least one second structure 150 arranged in a second layer 160, which is parallel to the first layer 130. In other words, also the second layer 160 is parallel to the main surface 140, but may also be on the main surface 140, provided that the first layer 130 is not arranged on the main surface 140 of the substrate 110.

In between the first and second layers 130, 160, an insulating layer 170 is arranged, which is configured to electrically insulate the structures 120, 150 arranged in the first and second layers 130, 150 from one another. Hence, neither are the first layer 130 and the second layer 160 identical, nor are the first structure 120 and the second structure 150 directly electrically connected, for instance, using an electrically-conductive via. However, it should be noted that depending on the concrete implementation of a nanomagnetic logic gate 100 an electrical connection may exist between the at least one first structure 120 and the at least one second structure 150 via external circuits used, for instance, to couple signals into the first structure 120 or to read out signals from the second structure 150.

In the embodiment shown in FIG. 1, the insulating layer 170 does not only electrically insulate the at least one first structure 120 from the at least one second structure 150, but it also geometrically levels the topology of the first layer 130 comprising the first structure 120.

Naturally, as outlined before, the second layer 160 may be arranged in between the main surface 140 and the first layer 130. In such a case, the insulating layer 170 may optionally level the topology of the second layer 160.

Although the insulating layer 170 electrically insulates the structures (e.g. the first structure 120) of the first layer 130 from the structures (e.g. the second structure 150) of the second layer 160 electrically, the insulating layer 170 allows a magnetic field 180 caused, for instance by the first structure 120, to penetrate the insulating layer 170 and to couple into the second structure 150. The insulating layer 170 may, for instance, be formed by a spin-on insulating layer such as HSQ (hydrogen silsesquioxane), PMMA (poly(methyl methacrylate)) or any other electrically-insulating polymers or copolymers. However, the insulating layer 170 may be also formed from inorganic chemical compounds, such as oxides or nitrides.

In the embodiment shown in FIG. 1, a magnetization 190, which is essentially perpendicular to the main surface 140 of the substrate 110, causes the magnetic field 180 to be also essentially perpendicular to the main surface 140 above the first structure 120. The second structure 150 is arranged along a projection direction essentially perpendicular to the main surface 140 such that a projection of the first structure 120 into the second layer 160 overlaps with the second structure 150. As a consequence, the magnetic field 180 may lead to a ferromagnetic coupling such that a magnetization of the second structure 150 is also essentially parallel to the magnetic field 180.

To allow a magnetization of the second structure 150 to be robustly changed in a controlled manner, the at least one second structure 150 comprises an artificial nucleation center 200 which is arranged such that the magnetic field 180 or its component essentially perpendicular to the main surface 140 provided by the first structure 130 couples to the artificial nucleation center 200 such that the magnetization of the second structure 150 is changeable in response to the magnetic field component coupled into the artificial nucleation center 200, when a predetermined condition is fulfilled. Due to the arrangement previously described and shown in FIG. 1, the magnetic field 180 caused by the first structure 120 may cause the magnetization of the second structure 150 to change such that the magnetization of the second structure 150 is also parallel aligned to the magnetization 190 of the first structure 130, when the previously-mentioned predetermined condition is fulfilled. The predetermined condition will be outlined in more detail below.

However, the nanomagnetic logic gate 100 may further comprise a further second structure 150', which may be arranged in the first layer 130. In this case, the first structure 120 causes an anti-ferromagnetic coupling since the magnetic field 180' caused by the first structure 120 coupling into an artificial nucleation center 200' of the second structure 150' resemble a magnetic field caused by a magnetic dipole. In other words, with respect to a neighboring second structure 150' arranged in the same layer as the first structure 120, the magnetic field 180' may be approximated by a magnetic dipole field causing an anti-ferromagnetic coupling of a magnetization of the further second structure 150'.

Due to the arrangement shown in FIG. 1, the magnetization of the at least one second structure 150 may depend deterministically on the magnetization 190 of the at least one first structure 120. The magnetization here follows a logical relationship, for instance that of a NAND-logic gate, that of a NOR-logic gate, that of a NOT-gate or that of any other corresponding logical relationship provided the first structures 120 and the second structures 150 are arranged accordingly.

As will be outlined in more detail below, the magnetization of the at least one second structure 150 comprises a ferromagnetic-like behavior, such that the behavior comprises a hysteresis-like behavior, which can be defined or characterized by a coercive field strength and, for instance, by a remanence or a remanent magnetization. The coercive field strength is a field strength, above which a magnetization of a corresponding magnetic structure, such as the artificial nucleation center 200 or the second structure 150, follows when the respective magnetic structure is subjected to an external magnetic field 210 having a magnetic field component perpendicular to the main surface 140 which is larger than the coercive field strength. In this case, the magnetization of the second structure 150 will follow or be parallel aligned to the magnetic field 210 or its perpendicular component with respect to the main surface 140.

The remanence or remanent magnetization defines or describes a magnetic field which is caused by the magnetization of a corresponding magnetic structure, when the external magnetic field 210 is removed. In other words, for instance for the first structure 120, the remanence or remanent magnetization causes the magnetic field 180, 180' of the first structure 120 in the absence of the external magnetic field 210.

Naturally, also the at least one first structure 120 may comprise a ferromagnetic-like behavior. However, the coercive field strength as well as other magnetic properties as well as electrical properties may differ from the corresponding properties of other structures, such as the second structure 150.

The artificial nucleation center 200 may comprise a coercive field strength smaller than the coercive field strength of the second structure 150 outside the artificial nucleation center 200. Naturally, the artificial nucleation center of the corresponding second structure 150 is considered here.

As outlined before, both the at least one first structure 120 as well as the at least one second structure 150 are nanomagnetic structures. As a consequence, the nanomagnetic structures 120, 150 comprise a height perpendicular to the main surface and a width parallel to the main surface such that the nanomagnetic structures, in a static case, in a single-domain limit with respect to directions 220, 230 corresponding to the height and the width, respectively. While the direction 220 perpendicular to the main surface 140 is straightforward concerning its definition, the direction 230 corresponding to the width of the respective structure 120 is considered the direction 230 along which the respective structure 120, 150 comprises the smallest extension in a plane or layer (e.g. first or second layers 130, 160) parallel to the main surface 140. At least along these two directions 220, 230 the nanomagnetic structures, hence, comprise a length or extension such that a magnetic domain wall does not form along these directions 220, 230. As a consequence, the magnetic structures, such as the first structure 120 and the second structure 150, may have essentially two well-defined directions of the magnetization with respect to the direction perpendicular to the main surface 140.

However, the nanomagnetic structures, such as the first structure 120 or the second structure 150, may comprise a length or extension along an extension direction 240 such that the extension along the extension direction 240 of a respective nanomagnetic structure is larger or longer than that of the corresponding single-domain limit. In other words, along the extension direction 240, which is by far not restricted to being a straight line in the mathematical sense, the nanomagnetic structure may comprise one or more magnetic domain walls. The extension direction 240 is also oriented parallel to the main surface 140.

The predetermined condition outlined before may, for instance, be fulfilled, when the nanomagnetic logic gate 100 is subjected to an external magnetic field 210 having a component perpendicular to the main surface 140 with a magnetic field strength larger than the coercive field strength of the artificial nucleation center 200, but smaller than the coercive field strength of the second structure 150, outside the artificial nucleation center 200. In this case, the magnetization of the artificial nucleation center follows that of the magnetic fields interacting with the respective artificial nucleation center 200 such that the magnetization or the artificial nucleation center 200 may follow that of the over-all magnetic fields 180 caused by the at least one first structure 120. When the magnetization of the artificial nucleation center 200 switches, a domain wall may form between the artificial nucleation center 200 and the second structure 150. However, since the second structure 150 is a nanomagnetic structure having dimensions along the directions 220, 230 such that typically no domain walls exist in these directions, it might be energetically favorable for the second structure 150 to create a domain wall parallel to the two directions 220, 230 in the vicinity of the artificial nucleation center 200, which may then progress along the extension direction 240 and, therefore, switch the magnetization of the second structure 150.

By forming the artificial nucleation center 200 at an edge 250 or close to the edge 250, the domain wall caused by switching the magnetization of the artificial nucleation center 200 may progress from edge 250 along the extension direction 240. Therefore, it may be possible to create a unidirectional or well-defined flow of a state of a magnetization and, therefore, allow a well-defined transport of information coded in the magnetization of the nanomagnetic structures. Depending on the concrete implementation close to an edge, may, for instance, mean that the artificial nucleation center 200 may be formed along the extension direction 240 with a distance of not more than 10%, not more than 5%, not more than 2% or not more than 1% of an overall extension of the respective nanomagnetic structure (e.g. the second structure 150) along the extension direction 240.

Naturally, it should be noted that a substrate 110 may comprise more than one nanomagnetic logic gate 100 and that a second structure of one nanomagnetic logic gate 100 may be a first structure of another nanomagnetic logic gate 100. Similarly, a first structure 120 of one nanomagnetic logic gate 100 may also be that of another nanomagnetic logic gate 100.

FIG. 1 illustrates one of the most simple nanomagnetic logic gates 100 according to an embodiment when, for instance, just one first structure 120 and just one second structure 150 are implemented as shown in FIG. 1. In other words, in case the further second structure 150' is not implemented and the number of first structures 120 and the number of second structures 150 is one each, the nanomagnetic logic gate 100 is a magnetic via which allows a magnetically-coded signal to be transferred from the first layer 130 to the second layer 160. This nanomagnetic logic gate is sometimes also referred to as a magnetic via.

As outlined before, a first structure 120 of a nanomagnetic logic gate 100 may be a second structure 150 of another nanomagnetic logic gate 100. Accordingly, the first and second layers 130, 160 are typically not globally defined layers, but nanomagnetic logic gate-specific layers. In other words, a part of a vertical stack with respect to a direction perpendicular to the main surface 140 of the substrate 110, which is a specific layer (e.g. the first layer 130 of a specific nanomagnetic logic gate 100, may be the second layer 160 of another nanomagnetic logic gate 100 and vice-versa.

Figure 2:
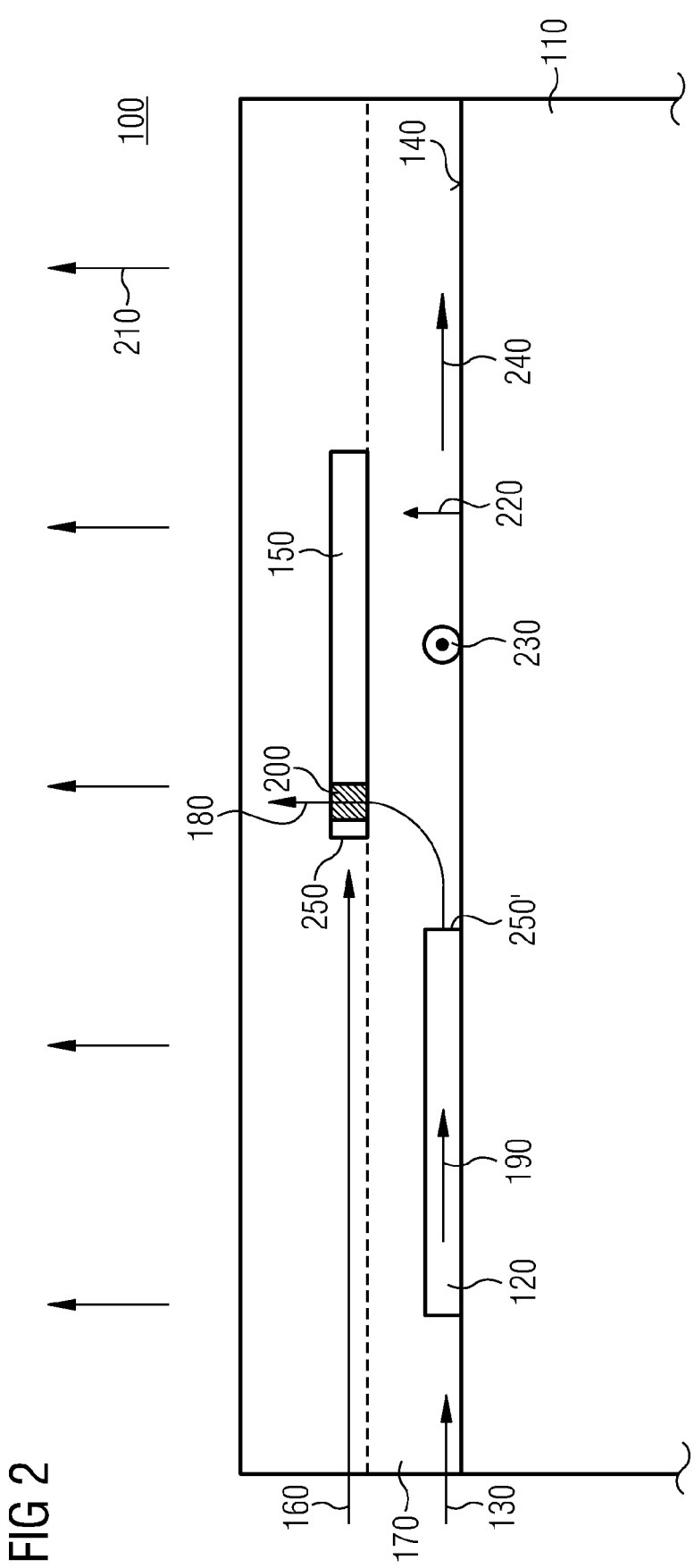
FIG. 2 shows a schematic cross section through a substrate comprising a nanomagnetic logic gate according to another embodiment.

FIG. 2 shows a cross-sectional view through a nanomagnetic logic gate 100 according to a further embodiment, which is similar to the nanomagnetic logic gate as shown in FIG. 1. However, the nanomagnetic logic gate 100 of FIG. 2 differs from the one shown in FIG. 1 by two aspects. First of all, the further output 200' along with its artificial nucleation center 200' and the further magnetic field 180' are not shown.

Furthermore, the magnetization 190 of the first structure 120 is essentially an in-plane magnetization, which is arranged essentially parallel to the main surface 140 of the substrate 110. In other words, the magnetization 190 is essentially parallel to a linear combination of the direction 230 corresponding to the width of the first structure 120 and the second structure 150 and the extension direction 240 of the two structures 120, 150. In the embodiment depicted in FIG. 2, the magnetization 190 is essentially parallel to the extension direction 240. As a consequence, although the magnetic field 180 generated by the first structure 120 leaves the first structure 120 at an edge 250' of the first structure 120 parallel to the main surface 140 of the substrate 110, due to an essentially dipole-like field distribution of the magnetic field 180, the magnetic field 180 couples with a significant component perpendicular to the main surface 140 into the artificial nucleation center 200 of the second structure 150.

To enable this, the second structure 150 may be displaced with respect to the main surface 140 or directions 220, 240, such that a projection along direction 220 being essentially perpendicular to the main surface 140 of the second structure 150 onto the first layer 130 does not overlap with the first structure 120. To be a little more specific, the artificial nucleation center 200 of the second structure 150, which is mainly responsible for the switching behavior of the magnetization of the second structure 150, may be arranged in the embodiment such that a projection of the artificial nuclear center 200 of the second structure 150, along the direction perpendicular to the main surface 140, onto the first layer 130 does not overlap with the at least one first structure 120. In some embodiments, it may even be possible to have an overlap as described of the projection of the second structure 150 and the first structure 120, as long as the artificial nucleation center 200 does not have the described projection in case the magnetization 190 of the at least one first structure is an in-plane magnetization as shown in FIG. 2 or, in other words, parallel to the main surface 140. However, due to the geometry of the magnetic field caused by such an in-plane magnetized structure, even without such a displacement it may be possible to couple a magnetic field component perpendicular to the main surface 140 into the artificial nucleation center 200 of the second structure 150 in question.

However, in contrast, the artificial nucleation center 200 of the second structure 150 as shown in FIG. 1 is arranged such that the projection of the artificial nucleation center 200 of the second structure 150 overlaps with the first structure 120 having the out-of-plane magnetization 190 being essentially perpendicular to the main surface 140.

The artificial nucleation center 200 may be arranged inside the second structure 150 to be located near an edge 250 to allow, for instance, for a unidirectional or well-defined flow of information encoded in the magnetization of the second structure 150. However, by arranging the artificial nucleation center 200 away from an edge 250 with respect to at least one of the directions 230, 240, information included in the magnetization can be distributed or fanned-out through the second structure 150 to several spots. Accordingly, a distribution of information is possible.

Figure 3:
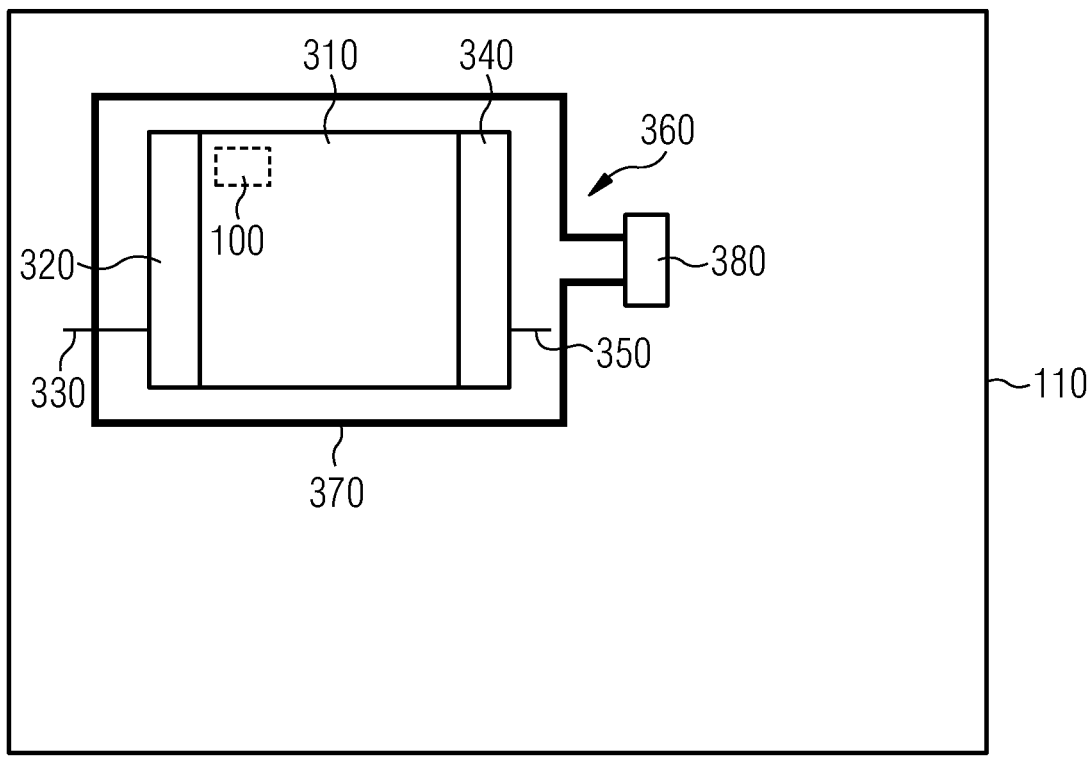
FIG. 3 shows a schematic view of an electronic device according to an embodiment.

FIG. 3 shows a schematic block diagram of an electronic device 300 according to an embodiment. The electronic device 300 comprises a substrate 110 on which an area 310 is arranged which comprises at least one nanomagnetic logic gate 100 according to an embodiment. The electronic device 300 further comprises at least one electrical input circuit 320, which is arranged and configured to influence a magnetization of at least one first structure 150 (not shown in FIG. 3) of at least one of the nanomagnetic logic gate 100 in response to an electrical input signal provided over an electrical connection 330 to the electrical input circuit 320.

The electrical device 300 further comprises at least one electrical output circuit 340 which is configured to sense a magnetization or a change of the magnetization of at least one second structure of at least one of the nanomagnetic logic gates 100. In response to the sensed magnetization or the sensed change of the magnetization, the electrical output circuit 340 further generates an electrical output signal to a further electrical connection 350. The electrical connections 330, 350 may comprise electrical circuitries, storage cells or other circuits capable of allowing an electrical interchange of information-carrying signals or information. In this context, the term "exchange" also includes the case of a unidirectional flow of information-carrying signals or a flow of information.

The electronic device 300 further comprises a magnetic field generator 360 which is capable of providing a clocked external magnetic field 210 (not shown in FIG. 3) to the at least one nanomagnetic logic gate 100 arranged in the area 310. The magnetic field generator 360 may be implemented on the substrate 110, as part of the substrate 110 or may be attached to the substrate 110. However, the magnetic field generator 360 may also be implemented fully or in part as a separate device from the substrate 110.

In the embodiment shown in FIG. 3, the magnetic field generator 360 comprises an electrical conductor 370 in the form of a turn of a coil to provide the external magnetic field 210 (not shown in FIG. 3). The electrical conductor 370 is coupled to a control circuit 380 which is adapted to provide the electrical signals to the electrical conductor 370 in order to provide the clocked external magnetic field 210.

As outlined before, the electrical conductor 370 and/or the control circuit 380 may be part of the substrate 110 or may be implemented in part or fully as a separate device. For instance, the electrical conductor 370 may be mechanically coupled to the substrate 110 in a detachable or non-detachable way. For instance, the electrical conductor 370 may be mechanically connected to the substrate 110, for instance, by using an adhesive. However, the electrical conductor 370 may also be an external coil arranged such that at least the area 310 of the substrate 110 can be provided with a clocked external magnetic field.

Embodiments may be implemented in a large variety of ways. For instance, nanomagnetic logic gates 100 and electrical devices 300 according to embodiments may be implemented using the following design features.

Naturally, a nanomagnetic logic gate according to an embodiment may comprise, independent of one another, more than one nanomagnetic first structure and more than one nanomagnetic second structure. The number of artificial nucleation centers may correspond to the number of nanomagnetic second structures, but may also be larger or smaller. For instance, two or more nanomagnetic second structures may share a single artificial nucleation center to name just one example. Moreover, a logic gate according to an embodiment may comprise more than two layers, in which the nanomagnetic structures are arranged. It is to be noted that the terms "first layer", "second layer" and other layers do not imply a special order of the layers. For instance, a nanomagnetic logic gate according to an embodiment may comprise three layers or more, in which nanomagnetic structures may be arranged, which may be electrically insulated from one another by insulating layers arranged in between the layers comprising the structures. Concerning the arrangement of the layers, for instance, a third layer may be arranged between the first and second layers, wherein the second layer may be arranged closest to the main surface of the substrate. In other words, in an embodiment any permutation of the layers may be present. Moreover, when more than one nanomagnetic logic gate is concatenated or coupled to form a more complex nanomagnetic logic gate or circuit, the roles of the layers may change depending of the nanomagnetic logic gate in question.

In yet other words, optionally, an embodiment may comprise at least a third layer comprising at least one nanomagnetic further first structure arranged such that the magnetic field component essentially perpendicular to the main surface also provided by the further first structure couples to the artificial nucleation center such that the magnetization of the second structure is changeable as previously described. This may optionally also be true for one or more further first structures arranged in any of the first, second, third or further layers.

In some embodiments the at least one first structure carries an information-carrying signal magnetically encoded towards the at least one artificial nucleation center of at least one second structure. As a consequence, at least in some embodiments the at least one first structure may be referred to as an input structure and the at least one second structure as an output structure. In other words, in at least some embodiments the terms "first structure" and "input structure" as well as the terms "second structure" and "output structure" may be used synonymously.

Optionally, in the nanomagnetic logic gate according to an embodiment, a magnetization of the at least one second structure may depend, based on a logic or logical relationship, deterministically on a magnetization of the at least one first structure. As a consequence, it may be possible to implement a logical relationship based on the magnetizations of the nanomagnetic first structures, the result of which may be obtainable at the at least one nanomagnetic second structure.

Additionally or alternatively, in a nanomagnetic logic gate according to an embodiment, a magnetization of the at least one second structure may comprise a ferromagnetic-like behavior, comprising a coercive field strength such that subjecting the second structure to a magnetic field component perpendicular to the main surface larger than its coercive field strength causes the magnetization of the second structure to align essentially parallel to the magnetic field component. As a consequence, it may be possible to enable a more deterministic switching behavior between different states of the magnetization. For instance, it may be possible to implement the at least one second structure having two well-defined magnetizations with respect to a direction perpendicular to the main surface of the substrate such that the nanomagnetic logic gate according to an embodiment may operate more reliably.

A ferromagnetic-like behavior may comprise a characteristic hysteresis curve, which may, for instance be characterized by the previously-mentioned coercive field strength. Applying a magnetic field with a magnetic field strength larger than the coercive field strength may lead to a switching of the magnetization parallel to the external magnetic field or its corresponding component. As a consequence, the ferromagnetic-like behavior may also comprise or be characterized by a remanence or remanent magnetization, which defines the magnetic field caused by the at least one second structure when no external magnetic field is applied.

Optionally, not only the at least one second structure, but also a magnetization of the at least one first structure may comprise a ferromagnetic-like behavior. The coercive field strength of the at least one first structure and of the at least one second structure may be equal or different.

Additionally or alternatively, in a nanomagnetic logic gate according to an embodiment, the artificial nucleation center comprises a coercive field strength smaller than the coercive field strength of the second structure outside the artificial nucleation center. As a consequence, it may be possible to allow a more robust operation of the nanomagnetic logic gate according to an embodiment by defining the coercive field strength of the artificial nucleation center such that a probability of an unwanted switching due to external or internal magnetic stray fields may be reduced, while influencing the magnetization of the at least one second structure is mainly or even exclusively determined by the magnetization or a change of the magnetization of the artificial nucleation center. Once the artificial nucleation center changes its magnetization, the magnetization of the at least one second structure may follow that of the artificial nucleation center due to energetic reasons and the domain walls created inside the respective second structure.

Additionally or alternatively, in a nanomagnetic logic gate according to an embodiment, the predetermined condition may be fulfilled, when the nanomagnetic logic gate is subjected to an external magnetic field component perpendicular to the main surface with a magnetic field strength larger than the coercive field strength of the artificial nucleation center and smaller than the coercive field strength of the second structure outside the artificial nucleation center. This may enable a more robust operation of a nanomagnetic logic gate according to an embodiment under more complex operational circumstances comprising, for instance, magnetic stray fields caused by internal or external sources.

Additionally or alternatively, in a nanomagnetic logic gate according to an embodiment, the nanomagnetic structures may be formed from at least one magnetic film. Optionally, in a nanomagnetic logic gate according to an embodiment, the nanomagnetic structures may be formed, for instance, from at least two magnetic films and a further film sandwiched in between the at least two magnetic films. The film sandwiched in between the at least two magnetic films may, for instance, comprise a non-magnetic or paramagnetic metallic film, an insulating film, a ferromagnetic film or another film. By using an arrangement comprising at least two magnetic films and at least one further film sandwiched in between the at least two magnetic films, it may be possible to tailor the magnetic properties of the nanomagnetic structures more closely. As a consequence, it may be possible to implement a nanomagnetic logic gate according to an embodiment more reliably with more well-defined magnetic properties such as the ferromagnetic-like behavior.

Additionally or alternatively, in a nanomagnetic logic gate according to an embodiment, the artificial nucleation center may comprise a lower structural anisotropy than the second structure outside the artificial nucleation center. In other words, the artificial nucleation center may comprise a higher isotropy compared to an area of the second structure outside the artificial nucleation center. The lower structural anisotropy or higher (structural) isotropy may, for instance, be caused by subjecting a part of the corresponding second structure to an external influence during the manufacturing process. For instance, an artificial nucleation center may be fabricated by irradiating the corresponding area of the at least one second structure with a focused ion beam. Depending on the concrete implementation, the lower structural anisotropy may be caused by damaging or destructing the corresponding structure of the artificial nucleation center in terms of its arrangement of films or the like. Moreover, this lower structural anisotropy may be caused, by oxidizing the corresponding area of the second structure or otherwise chemically changing the composition of the second structure. However, it may also be possible to implement the artificial nucleation center by fabricating the same in one more separate process steps, for instance, by locally depositing material.

However, by implementing the artificial nucleation center with a lower structural anisotropy compared to the second structure outside the nucleation center, it may be possible to simplify the manufacturing process.

Additionally or alternatively, in a nanomagnetic logic gate according to an embodiment, the artificial nucleation center may be located at an edge or close to the edge of the second structure. As a consequence, a more well-defined coupling of an external magnetic field into the artificial nucleation center and, hence, into the second structure may be achievable leading to a more well-defined signal transport inside the second structure. Depending on a concrete implementation, the artificial nucleation center may, for instance, be arranged with respect to an edge of the corresponding second structure having a maximum distance from that edge of less than 10%, 5%, 2% or 1% of a length of the second structure along an extension direction perpendicular to the edge and parallel to the main surface of the substrate.

Additionally or alternatively, in a nanomagnetic logic gate according to an embodiment, the nanomagnetic structure may comprise a height perpendicular to the main surface and a width parallel to the main surface, such that the nanomagnetic structures are in a static case in a single-domain limit with respect to directions corresponding to the height and the width. As a consequence, the nanomagnetic structures may comprise at least locally a well-defined magnetization such that the nanomagnetic structures may also work as non-volatile storage locations. In other words, by implementing the nanomagnetic logic gates accordingly, it may be possible to use the at least one first structure and/or the at least one second structure further as non-volatile storage cells to store logic states in a non-volatile manner.

However, optionally, the nanomagnetic structures may extend at least locally along an extension direction parallel to the main surface longer than the single-domain limit. The extension direction may then be at least locally perpendicularly arranged with respect to the direction corresponding to the width of the structure. Using such an implementation may therefore enable a signal transport along the extension direction, which is by far not limited to a straight line in the mathematical sense. However, in terms of their widths and heights, the nanomagnetic structures may be implemented as single-domain structures such that along the directions corresponding to the height and the width, no domain walls will be crossed. In such an embodiment, the transport of information may, for instance, be accomplished by a domain wall movement.

Additionally or alternatively, the nanomagnetic logic gate according to an embodiment may be a programmable NAND/NOR-gate comprising an output structure as one of the at least one second structures, a mode input structure as one of the at least one first structures, a first input structure and a second input structure arranged such that magnetic field components are provided by the mode input structure, the first input structure and the second input structure coupled to the artificial nucleation center of the output structure. Moreover, the artificial nucleation center may be arranged such that the magnetization of the output structure is changeable according to a NAND-relationship or according to a NOR-relationship in response to the magnetic field components provided by the first input structure and the second input structure depending on the magnetic field component provided by the mode input structure. It may therefore be possible to implement easily a programmable logic gate allowing an easy implementation of a programmable logic array, such as a field-programmable gate array or FPGA.

Optionally, in a nanomagnetic logic gate according to an embodiment, the first input structure, the second input structure and the output structure may be arranged in the second layer, wherein the mode input structure may be arranged in the first layer. Optionally, the mode input structure may comprise a nanomagnetic structure comprising a magnetization essentially parallel to the main surface. By implementing the nanomagnetic logic gate this way, it may be possible to program it essentially independently from programming or influencing the first and second input structures during operation. In other words, it may be possible to allow a more robust implementation of a FPGA-like device.

Additionally or alternatively, a nanomagnetic logic gate according to an embodiment may comprise an input structure as one of the at least one first structures in the first layer, an output structure as one of the at least one second structures in the second layer and a nanomagnetic transfer structure in the first or the second layer, wherein the nanomagnetic transfer structure crosses a projection of the output structure along a direction perpendicular to the main surface into the first layer, when the nanomagnetic transfer structure is comprised in the first layer, and wherein the nanomagnetic transfer structure crosses a projection of the input structure along a direction perpendicular to the main surface into the second layer, when the nanomagnetic transfer structure is comprised in a second layer. As a consequence, it may be possible using a nanomagnetic logic gate according to an embodiment to implement information-carrying signal lines carrying magnetically-coded information crossing each other in a direction perpendicular to the main surface of the substrate. Implementing a logic gate in such a way may further allow more easily integrating one or more nanomagnetic logic gates into a given surface area of the substrate.

As outlined before, an electronic device according to an embodiment comprises a substrate and at least one nanomagnetic logic gate according to an embodiment arranged on the substrate. The device further comprises at least one electrical input circuit arranged and configured to influence a magnetization of the at least one first structure of the at least one nanomagnetic logic gate in response to an electrical input signal. Still further, the device comprises at least one electrical output circuit configured to sense a magnetization or a change of the magnetization of the at least one second structure of the at least one nanomagnetic logic gate. The electrical output circuit is then further configured to generate an electrical output signal in response to the sensed magnetization or the sensed change of the magnetization.

Optionally, in an electronic device according to an embodiment, at least one first structure may also comprise an artificial nucleation center, which is arranged such that by providing a magnetic field component perpendicular to the main surface of the substrate, a magnetization of the corresponding first structure is changeable, when the predefined condition is fulfilled. In such a case, the electrical input circuit may be arranged and configured to provide a magnetic field with a magnetic field component perpendicular to the main surface of the substrate such that the magnetic field component may cause the magnetization of the artificial nucleation center of the at least one corresponding nanomagnetic first structure to change, when the predefined condition is fulfilled. For instance, the electrical input circuit may comprise an electrical conductor arranged such that the corresponding magnetic field is generated, when a current of sufficient strength is passed through the electrical conductor.

Additionally or alternatively, the at least one electrical input circuit may also comprise at least one of a spin-transfer torque structure (STT) and a magnetic tunnel junction (MTJ) capable of influencing the magnetization of the at least one first structure by providing a spin-polarized current to the corresponding first structure. However, also other electrical circuits capable of influencing the magnetization of at least one first structure in response to an electrical input signal may be used.

Additionally or alternatively, the at least one electrical output circuit may comprise a magnetic field sensor element, such as a Hall sensor element, a magneto-resistive element, a magnetic tunnel junction (MTJ), a micro-electromechanical system (MEMS) or the like, capable of detecting a magnetization or a change of the magnetization of at least one of the second structures of the corresponding nanomagnetic logic gate. However, the at least one electrical output circuit additionally or alternatively may comprise a magnetic-sensitive sensor arrangement capable of detecting a magnetization or a change of a magnetization by use of other physical effects. For instance, the at least one electrical output circuit may comprise a magnetic sensor arrangement based on the magneto-optic Kerr effect (MOKE). However, also other physical effects sensitive to the magnetization or a change of the magnetization may be used.

Additionally or alternatively, an electronic device according to an embodiment may further comprise a magnetic field generator arranged and configured to provide a clocked external magnetic field to the at least one nanomagnetic logic gate. The magnetic field generator may optionally be implemented on the substrate or is part of the substrate, but may also be implemented independently of the substrate and arranged such that the magnetic field generated by the magnetic field generator is essentially homogeneous with respect to the at least one nanomagnetic logic gate. In other words, the magnetic field generator may be configured to provide an essentially homogeneous field with respect to length and scale of the nanomagnetic logic gates and their extensions In the following, principles of an out-of-plane nanomagnetic logic (oop-NML) will be explained and outlined in more detail.

Figure 4:
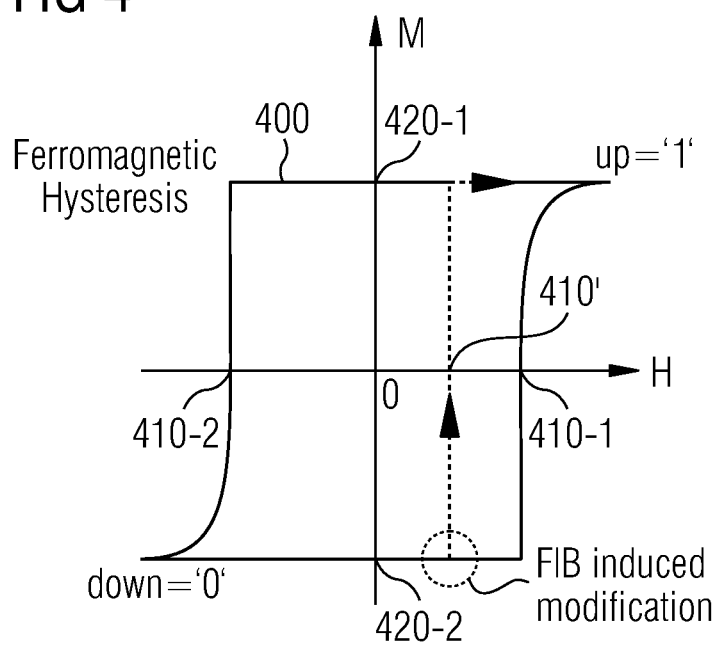
FIG. 4 shows a schematic representation of a magnetization-curve.

FIG. 4 shows a schematic magnetization-curve 400 exhibiting a ferromagnetic-like behavior. To be more precise, the magnetization-curve 400 shows a dependency of a magnetization M on an external magnetic field as a solid line.

The magnetization curve 400 shows a clear hysteresis characterized by two coercive field strengths 410-1, 410-2 and two remanent magnetizations 420-1, 420-2. The coercive field strengths 410 are field strengths of the external magnetic field at which the magnetization M of a structure in question changes abruptly and follows the external magnetic field. For instance, starting from a down magnetization, which may, for instance, be associated with a binary state 0, by increasing the external magnetic field, the magnetization changes abruptly when reaching the coercive field strength 410-1 and assumes an up magnetization, which may, for instance, be associated with a binary state 1. When the external magnetic field is removed (H=0), the remanent magnetization 420-1 will remain.

When the external magnetic field is further reduced, the magnetization M will once again assume the down magnetization, when the coercive field strength 410-2 is in terms of its absolute value passed. If the external magnetic field is then once again removed, the remanent magnetization 420-2 will be present.

The magnetization curve 400 is a schematic representation of a magnetization curve, which may, for instance, be exhibited by the nanomagnetic structures such as the first structures 120 and the second structures 150. As will be outlined below, the nanomagnetic structures may be formed from at least one magnetic film or, for instance, from at least two magnetic films and a further film sandwiched in between the at least two magnetic films. In such a case, the artificial nucleation centers 200 having a lower coercive field strength 410' may, for instance, be formed by reducing the structural anisotropy of such a nanomagnetic structure. This may, for instance, be done by a focused ion beam induced modification (FIB induced modification). The dotted line in FIG. 4 illustrates a possible reduction of the coercive field strength 410' due to a focused ion beam interaction.

Figure 5A:
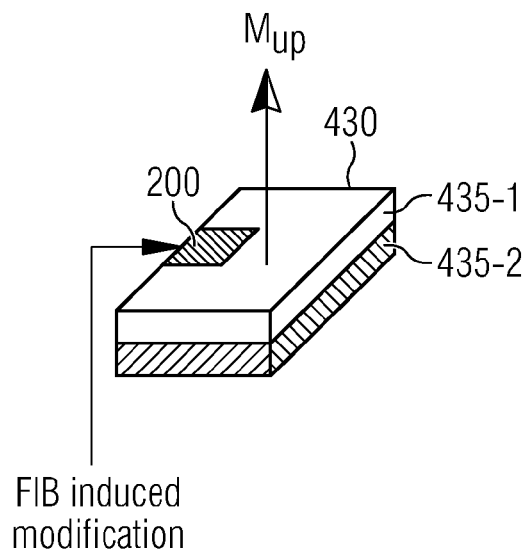
FIG. 5a shows a schematic perspective view of a nanomagnetic dot comprising an artificial nucleation center.

FIG. 5a shows a schematic perspective view of a nanomagnetic dot 430 comprising an artificial nucleation center 200 fabricated by a focused ion beam induced modification comprising a magnetization essentially perpendicular to a main surface 140 (not shown in FIG. 5a) such that a magnetic pole 435-1 and an opposite magnetic pole 435-2 form. The nanomagnetic dot 430 may, for instance, comprise at least two magnetic films 440-1, 440-2 (not shown in FIG. 5a) and a further film 450 (not shown in FIG. 5a) sandwiched in between the two magnetic films 440. In the situation shown in FIG. 5a, the nanomagnetic dot 430 comprises a magnetization in an up-direction ($M_{up}$).

Figure 5B:
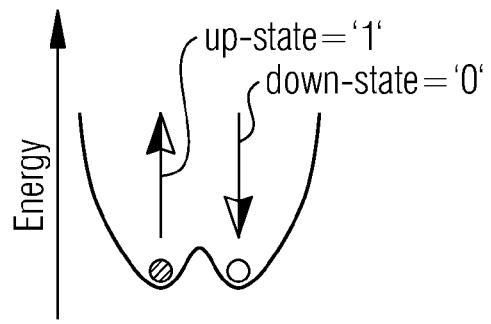

FIG. 5b shows a schematic energy diagram of the nanomagnetic dot 430. The energy curve shown in FIG. 5b clearly shows that the nanomagnetic dot can assume two different and clearly distinguishable stable states corresponding to an up-state of the magnetization and a down-state of the magnetization, which may be associated with a binary state 1 and 0, respectively. In other words, the magnetic dot can have a variable state incorporated by its magnetic domain and its magnetization ($M_{up}$ and $M_{down}$).

Inside the nanomagnetic dot 430 but also inside other nanomagnetic structures, a signal propagation can be achieved by a magnetostatic field-coupling, wherein a directed signal flow may be achieved by a local focused ion beam modification.

Figure 5C:
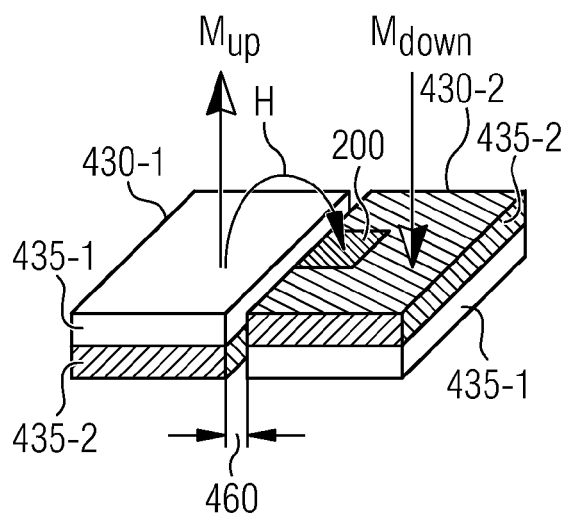
FIG. 5c shows an arrangement of two separated magnetic dots, one comprising an artificial nucleation center.

To illustrate this further, FIG. 5c shows a perspective view of two nanomagnetic dots 430-1, 430-2 each of which may once again comprise two magnetic films 440-1, 440-2 (not shown in FIG. 5c) and a further film 450 (not shown in FIG. 5c) sandwiched in between the two magnetic films 440 such that the previously described magnetic poles 435-1, 435-2 form. The two nanomagnetic dots 430 are separated by a gap 460 of typically some nanometers up to several hundred nanometers, for instance 10 to 30 nm.

While the nanomagnetic dot 430-1 does not comprise an artificial nucleation center 200, the magnetic dot 430-2 does comprise an artificial nucleation center arranged at an edge of the nanomagnetic dot 430-2. Assuming, as shown in FIG. 5c, that the nanomagnetic dot 430-1 comprises a magnetization $M_{up}$ a magnetic field H is generated which anti-ferromagnetically couples into the artificial nucleation center of the magnetic dot 430-2. As a consequence, the magnetization of the nanomagnetic dot 430-2 may anti-ferromagnetically couple to the nanomagnetic dot 430-1 and have a magnetization $M_{down}$.

Figure 5D:
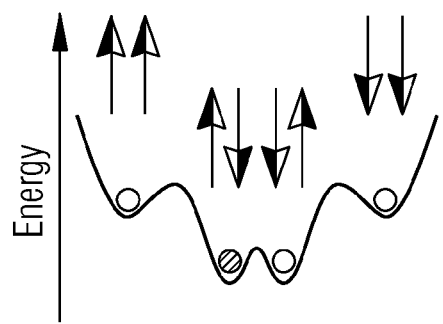
FIG. 5d shows a simplified energy diagram of the overall energy of the arrangement of FIG. 5c.

FIG. 5d shows an energy diagram of an overall energy of the arrangement shown in FIG. 5c. The anti-ferromagnetic orientations with magnetization of the two nanomagnetic dots 430 being arranged anti-parallel have a lower energy compared to a parallel alignment of the two magnetizations. Therefore, the anti-ferromagnetic coupling of the two nanomagnetic dots is energetically preferable.

Figure 6A:
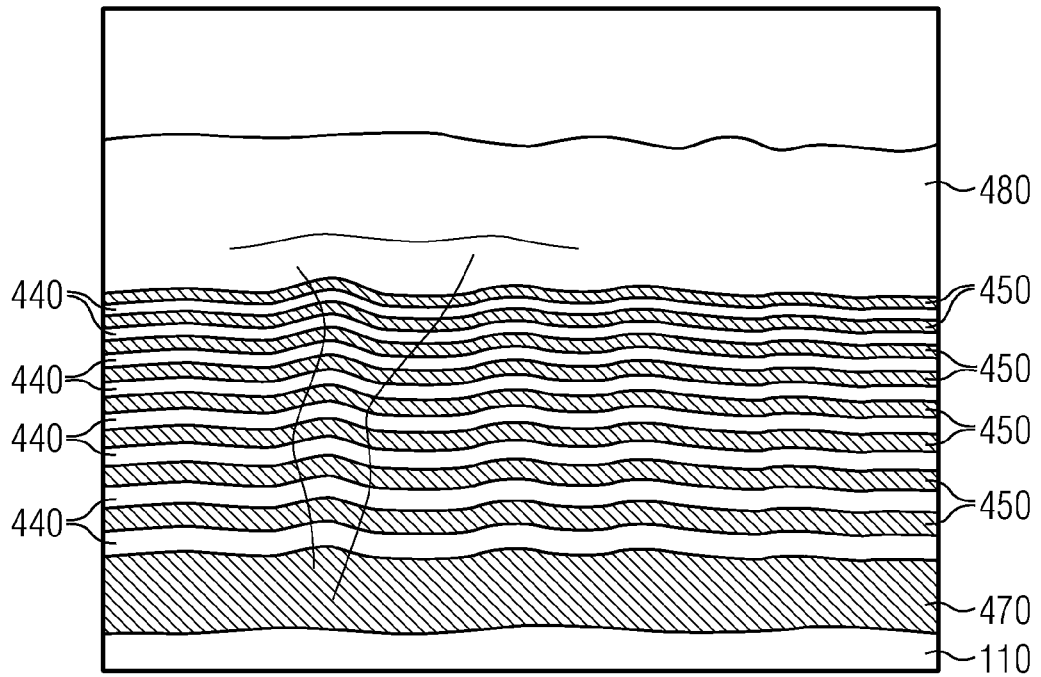
FIG. 6a shows a schematic tunneling electron microscope image of a nanomagnetic structure outside an artificial nucleation center.

FIG. 6a shows a schematic view of a tunneling electron microscopy image (TEM image) of a nanomagnetic structure comprising a plurality of magnetic films and further films 450 sandwiched in between the magnetic films 440. The magnetic films may, for instance, comprise nickel (Ni), iron (Fe), cobalt (Co) or an alloy such permalloy being an alloy comprising nickel and iron, to name just a few examples. The material the magnetic films may be fabricated from, may, for instance, be soft-magnetic in bulk form. For instance, a magnetic film may be formed from or comprise CoFeB, a cobalt-iron-boron alloy. The further films 450 may be magnetic films, for instance of a different chemical composition than the magnetic films 440, or paramagnetic or non-magnetic films, such as palladium (Pd), platinum (Pt), gold (Au), silver (Ag), titanium (Ti), aluminum (Al) or any alloy. For instance, the films 440 and the further films 450 may form CoPd- CoPt- or CoNi-multilayers, to name just a few.

The stack of magnetic films 440 and further films 450 is arranged on a seed layer 470, which may be any suitable material, for instance, the material used for the further film 450. The seed layer 470 may be arranged on the substrate 110.

As FIG. 6a shows, the films 440, 450 form a well-defined stack of films, which is covered for the purpose of producing the TEM-image (Tunneling Electron Microscopy) with a cover layer 480, which may, for instance, serve to conduct excess charges and to prevent severe damage during fabrication of a lamella for the TEM-image.

Figure 6B:
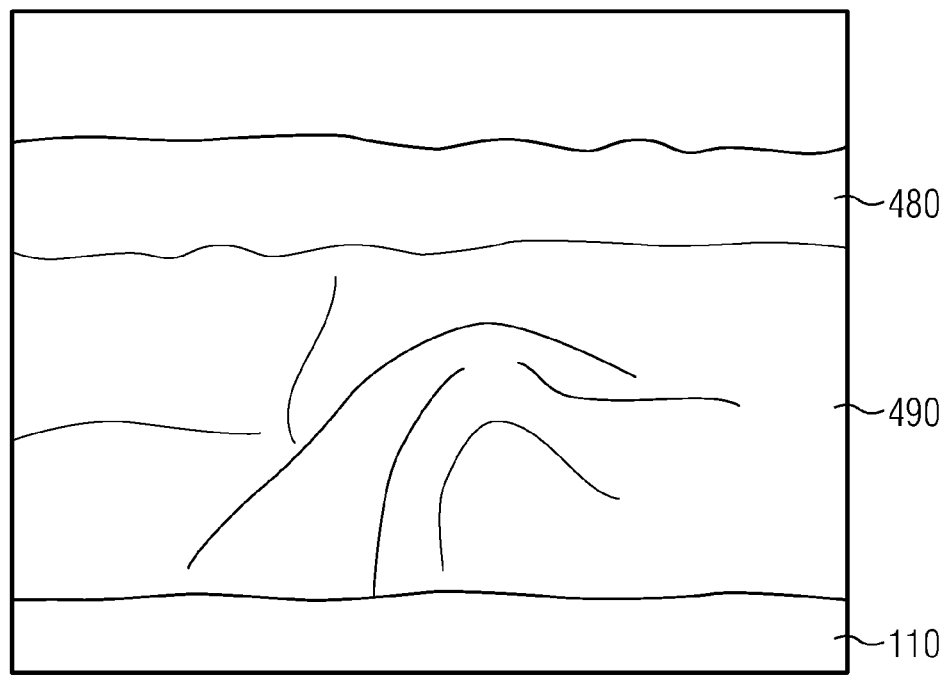
FIG. 6b shows a schematic tunneling electron microscope image of a nanomagnetic structure inside an artificial nucleation center.

While FIG. 6a shows a typical nanomagnetic structure in a non-irradiated state, FIG. 6b shows a similar cross-sectional view as a TEM-image of an irradiated area, which may be, for instance, served as an artificial nucleation center 200. Once again, FIG. 6b shows the substrate 110 and the cover layer 480. However, due to the interaction of the focused ion beam, the stack of films 440, 450 and 470 is widely dissolved or destroyed leading to a layer or film 490 having, compared with the stack shown in FIG. 6a, a higher isotropy or a lower anisotropy. This may lead to a lower coercive field and, therefore, may be used to create an artificial nucleation center 200 as outlined before. Therefore, by irradiating such a stack of films 440, 450, 470, a weak spot may be generated allowing a magnetization reversal starting in that weakest spot. In other words, for instance, by a focused ion beam irradiation an artificial nucleation center 200 may be creatable.

FIG. 7a shows in an upper part a magnetization curve 400 exhibiting the previously-described hysteresis. As will be outlined below, a directed signal flow of a magnetic signal can be induced from nanomagnetic dot to nanomagnetic dot as a function of an externally-applied, clocked magnetic field. The upper part of FIG. 7a shows a clocking window, which illustrates a magnetic field strength provided by, for instance, a magnetic field generator 360 or another source for an external magnetic field, which interacts with a magnetic field of a nanomagnetic dot. Depending on the orientation of the external magnetic field and the magnetic field generated by the respective nanomagnetic dot, either the coercive field strength 410 is exceeded, causing the magnetization to change or switch, or to remain when the coercive field strength 410 is not exceeded.

As a consequence, by applying an external magnetic field as a pulsed sequence as shown in the lower part of FIG. 7a, it may be possible to switch a linear array of nanomagnetic dots 430 as depicted in FIG. 7b.

To be more precise, FIG. 7b shows as a function of time t a chain of nanomagnetic dots 430-1, . . . , 430-7, along with their magnetizations as a function of the time t. The upper row of FIG. 7b shows the situation during the first pulse 1, the second row the magnetization of the chain after pulse 2, the third row after pulse 3 and the fourth row after pulse 4.

While the nanomagnetic dot 430-1 is a nanomagnetic dot with a fixed input magnetization, the further nanomagnetic dots 430-2, . . . , 430-7 each comprise an artificial nucleation center 200 such that these nanomagnetic dots 430 are switchable in response to the pulsed sequence of the external magnetic field.

Due to the previously-described anti-ferromagnetic coupling of the neighboring nanomagnetic dots 430, with the progression of the pulsed sequence, an undefined magnetization state of the nanomagnetic dots 430 indicated in FIG. 7*b* by a lack of a hatching is anti-ferromagnetically switched with a progression of each pulse of the pulsed sequence. The two different magnetizations are indicated by a rising or falling hatching, respectively. After a complete cycle comprising two pulses, the magnetic information is moved by two nanomagnetic dots 430 in the arrangement shown in FIG. 7*b* and indicated by the line 500.

Figure 8A:
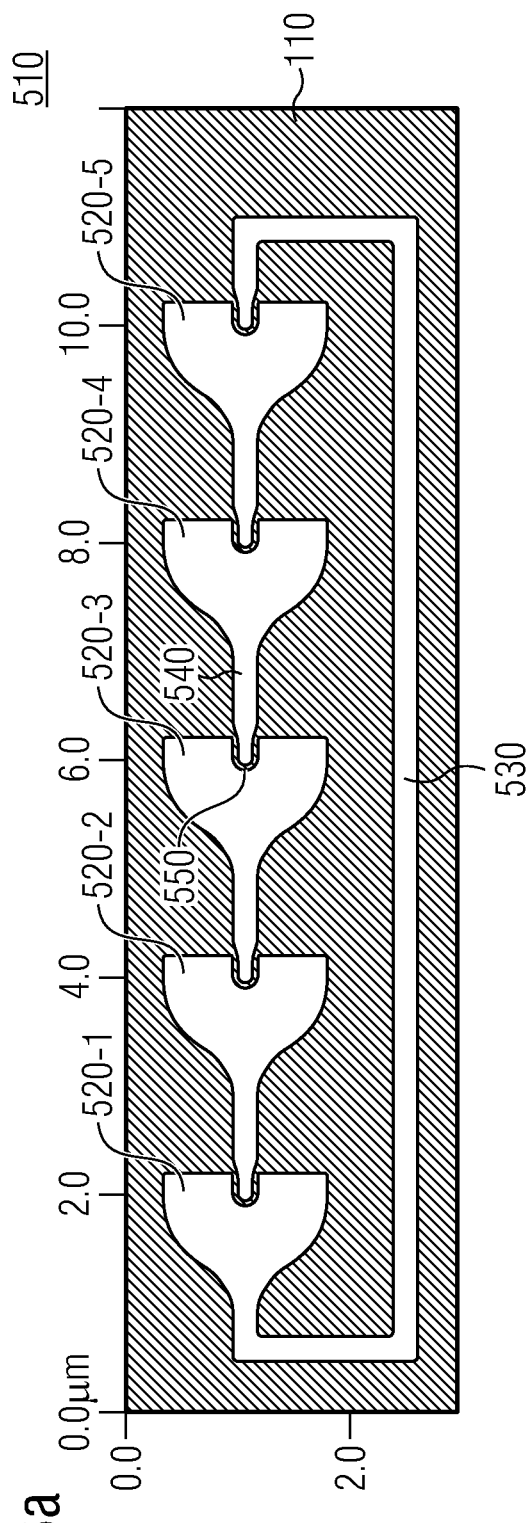
FIG. 8a shows a topography of an inverter ring.

To illustrate this further, an inverter ring 510 has been fabricated as shown in FIG. 8*a*. The inverter ring 510 comprises an uneven number of magnets or nanomagnetic structures 520-1, . . . , 520-5 and a feedback structure 530 being integrally formed with the first nanomagnetic structure 520-1. Each of the nanomagnetic structures 520 comprises a finger-like structure 540, which is separated by a gap of a few ten nanometers only inside a recess 550 of the neighboring or following nanomagnetic structure. In the case of the first nanomagnetic structure 520-1, the finger-like structure 540 is part of a feedback structure 530. The nanomagnetic structures 520 are arranged on the substrate 110.

Figure 8B:
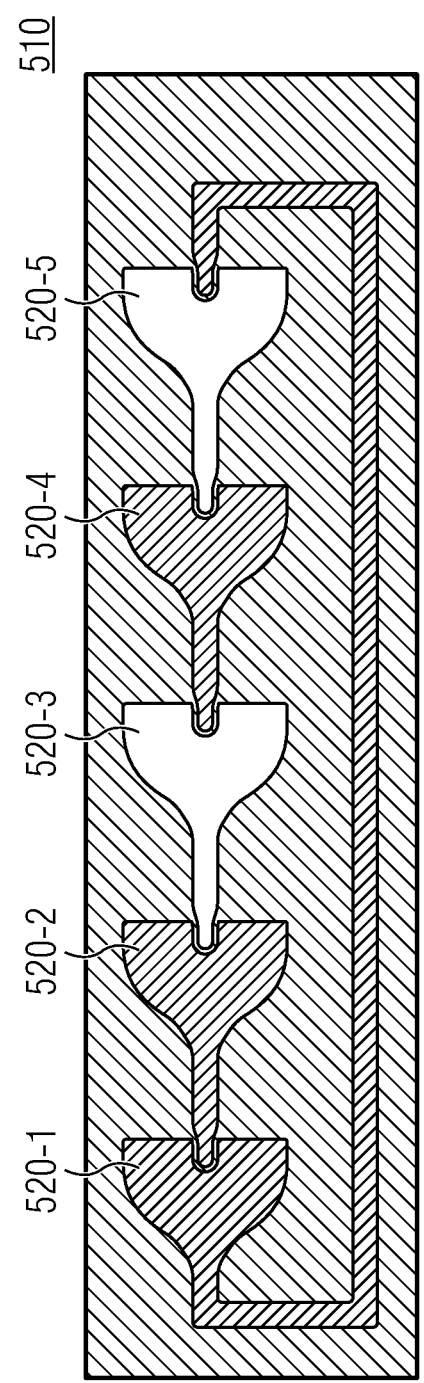

FIG. 8*b* shows a schematic representation of a MFM measurement (Magnetic Force Microscopy) of the inverter ring 510 shown in FIG. 8*a*. The different magnetizations measured or determined by the MFM-measurement is illustrated by different hatches in FIG. 8*b*.

In the situation depicted in FIG. 8*b*, apart from the first and second nanomagnetic structure 520-1, 520-2, neighboring nanomagnetic structures 520 each comprise alternating magnetizations according to the previously-described anti-ferromagnetic coupling. However, due to the uneven or odd number of nanomagnetic structures 520, there is always a metastable pair of nanomagnetic structures, which are in the case as depicted in FIG. 8*b*, the first two nanomagnetic structures 520-1, 520-2. Due to an external clocking using an external magnetic field as described before, a data injection every second clocking cycle can be performed via the feedback structure 530. This may, eventually, require at least five magnets or at least five nanomagnetic structures 520.

The inverter ring 510 therefore illustrates the possibility of an information transport in an endless magnetic inverter chain.

As the previous description has shown, the superposition of the magnetic field caused by the magnetic structures along with the external magnetic field, for instance, generated by the magnetic field generator 360 leads to a magnetic flux at the position of the artificial nucleation centers 200, which may cause their magnetization to switch. This can be described by flux density curves 560-1, 560-2 and depicted in FIG. 9, which are based on the magnetization curve 400 as, for instance, shown in FIG. 4, but displaced by an external magnetic field with respect to its symmetrical position as depicted in FIG. 4.

As outlined before, embodiments may relate to a 3D-integration of non-volatile nanomagnetic logic and 3D integrated circuits and systems in nanomagnetic logic.

In nanomagnetic logic (NML), a logic state may be represented by the magnetization direction of a single nanomagnet. An interaction between neighboring nanomagnets via magnetic field coupling may be used for logic or logical operations. This principle was up to now used for nanomagnets within one magnetic layer only. The process technology and all needed basic components for Systems with out-of-plane magnetization are in a mature state. A novel technique for tailoring the magnetic properties of the nanomagnetic dots and controlling the direction of signal flow between neighboring dots by local FIB irradiation was developed by us. Thus, we could demonstrate a chain of magnetic dots with unidirectional signal flow, as described above, and a functional majority gate. This is a universal gate programmable for NAND- and NOR-functionality, and is the basic building block of nanomagnetic logic.

In the herewith described embodiments, we extend these methods to realize field coupling between nanomagnets in 3D-topologies. With this, field-coupling in all directions may be used for logic gates and signal propagation, leading the way to a true and very dense 3D integration. Using the local irradiation technique combined with the 3D geometrical arrangements according to embodiments, directed signal flow in three dimensions can be realized. This enables signal crossing, which is now a main obstacle in building complex NML-systems. Preliminary experimental results have already shown that magnetic multilayer growth in 3D is achievable and that there is sufficient vertical coupling.

Input and output signal interfaces for embedding NML blocks in a microelectronic environment have been demonstrated in 2D NML. We describe new embodiments of these interfaces transferring this functionality to the 3D architecture. For clocking and energy supply, an external magnetic clocking field may be exploited to operate devices according to an embodiment. The use of a sinusoidal clock waveform may allow for adiabatic energy recycling using a resonant power-clock oscillator.

The final system level embodiment that will be described is a complex function block consisting of or comprising several majority gates, and extending over three or more magnetic functional layers. In contrast to CMOS-based microelectronics, NML does not require signal and supply wiring in the magnetically active areas, it typically has no leakage currents, it is non-volatile, and may provide an easy way for global clocking, avoiding local clock-skew disturbances. Thus, a disruptive logic technology especially suited for robust low power Systems may be provided by embodiments.

Nanomagnetic logic (NML) may be composed of nanomagnetic dots interacting by magnetic field coupling, and thus is a non-charge-based, beyond CMOS technology. It may provide exceptionally dense, robust and low power integrated systems without or with only low leakage currents. The availability of non-volatile logic states enables instant on/off capability as well as new architectures and functionalities. Our group has developed a technology for NML that uses nanomagnets with perpendicular, out-of-plane magnetization. This may give rise to a robust and precisely controllable switching behavior, more degrees of freedom in shape and arrangement of the magnets, and finally a denser layout than existing approaches with in-plane magnetization. We have demonstrated the basic logic functions of inverter, fan-out and majority gate, where we use a global magnetic field both as clock and energy supply.

As a completely new approach, we propose the use of vertical field coupling in the z-direction for creation of true 3D integrated circuits and systems. This may offer, when using several functional layers, a very high packing density and very flexible architectures. Embodiments are based on successful pilot experiments in our own technology. With this, one can design larger systems. Therefore, we describe the architecture for arithmetic logic units and FPGAs. Those profit a lot from NML due to the inherent non-volatility and programmability during operation, and especially from the 3D integration, where an extra layer may be used for the programming function. The contents of this disclosure enable generation of more complex circuits and complete system architectures than in the conventional 2D technique. It may contain clocking and synchronization schemes, including buffer circuits corresponding to CMOS-flip-flops. Methods and structures for the generation of the external clocking fields are also presented here.

Nanomagnetic logic (NML) is an emerging computing method and attracts increasing interest in international industrial research departments. This is mainly due to its ultralow power consumption and the non-volatile logic states. There is also no need for electrical interconnects inside the magnetically active regions of the NML gates, as information is propagated and processed by pure magnetic field-coupling interaction of single-domain magnetic dots. The International Technology Roadmap of Semiconductors [1] includes NML since 2009 in the chapter "Non-FET, Non Charge-Based, 'Beyond CMOS' Devices" of the Emerging Research Devices (ERD) report, thus propagating the potential of nanomagnetics as an extension towards low-power non-volatile logic which cannot be reached by future CMOS generations [1]. Moreover, the Non-volatile logic program of the DARPA US Department of Defense which started in 2010 (in which the inventors are participating), supports research for novel non-volatile logic circuits working at room temperature [2].

In other words, nanomagnetic logic (NML) attracts increasing interest in the international research Community and also in industry because of its potentially ultra-low power consumption and the non-volatile logic states. The International Technology Roadmap includes NML since 2009 in the chapter "Non-FET, Non Charge-Based 'Beyond CMOS' Devices" of the Emerging Research Devices (ERD) part, thus claiming the potential of Nanomagnetics as an extension towards low power, non-volatile logic which cannot be reached by future CMOS generations [1]. Moreover, the Non-volatile logic program of the US Department of Defense, DARPA, which started in 2010, supports research for novel non-volatile logic circuits working at room temperature [2].

NML makes use of the fact that below a certain critical size ferromagnetic islands become single-domain (the so-called single-domain limit) and due to crystalline or shape anisotropy show bi-stable magnetization states. For NML applications they are fabricated in such a way (engineering shape, multilayer films or crystal growth), that there are two stable magnetization states, which can be assigned to the bit values '0' and '1'. For logic functionality, either the manipulation of domain-walls or magnetostatic stray-fields between single-domain dots are exploited.

In electrical digital computing implementations every single device (transistor) is electrically connected through complex wiring. For "3D" integration, complicated and area consuming through-silicon vias are implemented, which only allow for interlayer wiring of 2D planar circuit blocks, not for signal transfer within a logic block. By contrast, nanomagnetic field-coupled devices implement both the signal transfer and the Computing ability via magnetic coupling fields (no wiring), and hence are most naturally suitable for real 3D integration.

Three different approaches for NML devices have been proposed as listed below. a) domain wall logic where magnetic domain walls in thin ferromagnetic wires are manipulated to gain logic functionality, and b)+c) field-coupled logic concepts, where magnetic coupling-fields of single-domain magnets are exploited for computing operations.

a) Magnetic domain wall logic in in-plane magnetic material as it has been mainly developed at Imperial College, London by the group of R. P. Cowburn [3] [4] [5] [6] [7].

b) Permalloy dots with in-plane magnetization which have been intensively investigated at the Center for Nanoscience and Technology at University of Notre Dame, Indiana, USA [8] [9] [10] [11] [12] [13] [14].

c) Co/Pt multilayer logic devices with out-of-plane magnetization which have been fabricated at TU München, Lehrstuhl für Technische Elektronik (LTE) by our group [15][16] [17] [18] and modeled at Lehrstuhl für Nanoelektronik, Prof. Lugli, [19] [20] [21] by the group of Dr. G. Csaba, University of Notre Dame, USA.

With respect to a—magnetic domain wall logic, one implementation of pure ferromagnetic logic gates is the so-called magnetic domain wall logic. It was pioneered already in the 1960th by D. H. Smith and R. J. Spain [22, 23]. Domain walls (DWs), the interfaces between two magnetization states, were found to be highly mobile in a soft-magnetic wire and hence were utilized to both transfer Information and separate binary states defined by the direction of magnetization. The ideas were rediscovered in the beginning of the 21st Century by Allwood et al. [3], demonstrating a sub-micrometer NOT-gate and shift-register by means of 200 nm Wide and typically 5 nm thick permalloy wires. The two types of possible DWs, namely 'head-to-head' and 'tail-to-tail' (due to the magnetization direction at the interface), can be propagated through complex networks of nanowires under the action of an externally applied rotating magnetic field. The external field acts both as a clocking field and a 'power supply'. Bifurcations of the wire for fan-out (cloning of domain walls), cusps for NOT-operation and a crossing are incorporated to manipulate the domain wall inside the wires, realizing Boolean gates and registers [4, 24, 25]. The domain-wall conductors used are fabricated by either FIB direct milling into a permalloy film or e-beam patterning and lift-off. The correct computational function strongly depends on smooth edges and precise control of angles and shapes. Complex structures, e.g. 'serial-in parallel-out shift registers' or 'cloning functions' have already been demonstrated [26]. In [27] the extensions to Multiplexers, Counters and D-latch flip-flops are investigated by Simulation. Recent publications demonstrate an asymmetric Not-gate and shift-register [6] and investigate the chirality dependence [7]. To our knowledge, no integrated electrical input or output has been demonstrated. In addition, signal crossing is an unsolved challenge.

With respect to b—field-coupled NML from in-plane magnetized permalloy dots, the permalloy (Py, e.g. $Ni_{80}Fe_{20}$) dots are commonly of ellipsoidal shape (e.g. 60×90 $nm^2$) and have thicknesses of 10 nm or below. These nanomagnets are bi-stable, as their remanent magnetization (magnetization at zero external magnetic field) governed by shape anisotropy always points along the long (ellipsoidal) axis. A magnetic field may rotate the magnetization away from the long axis, but when removing the field, the nanomagnet switches to either of the two stable states. Placing several of these magnets side by side along the short axis results in a chain (or array in a 2D arrangement) of dipole-coupled nanomagnets that favor antiparallel alignment of the magnetization. This is due to the stray field of the magnets acting on each other in close vicinity, trying to magnetize their neighbors in the opposite direction. Clocking can be performed by applying an external magnetic field along the short (hard-) axis of the dots [28, 12] often referred to as hard-axis or adiabatic clocking. This external field turns the magnetic moments of all magnets orthogonal to the preferred magnetic anisotropy. This is an unstable state of the system, and when the field is removed, the nanomagnets relax into a lowest energy state with anti-parallel ordering.

The basic logic gate of this technology is the majority gate which has 3 inputs and 1 output. The majority gate is a so-called universal gate, implying that all Boolean functions can be realized by it [29]. More complex logic function blocks using this technique have been proposed, but not yet fabricated, including a 2-bit full adder [28], a 3-bit counter [30], a programmable logic array [31], or an 8-bit discrete cosine transformation (DCT) using systolic arrays, which could be used in JPEG image compression [32]. Theoretical comparison with 45 nm CMOS technology predicts an up to 290 times and 46 times improvement in energy consumption and area, respectively. Experimentally, the influence of non-ideal shapes of the Permalloy dots on the switching behavior and on error rates has been studied [33], whereas the majority gate was demonstrated [9]. The nanomagnetic fan-out operation (cloning of signals) was shown [34] and non-majority based logic is reviewed [14]. A topical review on shape-based NML, i.e. Py-nanodots with in-plane magnetization [13]. In summary, the in-plane field-coupled logic faces similar obstacles as domain-wall logic in terms of signal crossings. Furthermore, directed signal flow remains an unsolved challenge as long as the field is globally applied and variations in dot fabrication may lead to considerable error rates in chains of field-coupled dots [35].

With respect to c—field-coupled NML from out-of-plane magnetized multilayers, in out-of-plane NML, the easy-axis of magnetization is perpendicular to the film plane and the ferromagnetic films exhibit strong out-of-plane anisotropy. This is very desirable from an architectural point of view, as nanomagnetic dot configurations and logic gates can be utilized in both lateral dimensions of the film plane. Furthermore, the magnetic properties of the layers/dots can be controlled by (focused) ion beam (FIB) irradiation, providing directed signal flow and hence overcoming complicated local clocking concepts.

This concept uses of out-of-plane NML may use, for instance, Co/Pt or Co/Ni multilayer films, which show a strong ferromagnetic moment perpendicular to the film surface. This is due to the crystallographic anisotropy of the material. It has been shown already [36], that the ferromagnetic switching threshold of these films can be influenced on a broad scale using ion beam radiation. At sufficient FIB dose, the films can be changed from hard-ferromagnetic via soft-ferromagnetic to paramagnetic characteristics [37]. At TU München (TUM) this has been utilized to engineer the properties of ferromagnetic nanodots. NML devices with out-of-plane anisotropy were predicted [29] and micro-magnetically modeled [19, 21]. For the first time our group at TUM realized a 3-input majority gate with non-reciprocal dot-coupling [38].

The out-of-plane topology allows for enhanced flexibility concerning the shape and the switching field of the magnetic dots using variable doses in the FIB irradiation [17, 18, 39]. Furthermore, predictive estimations [16] indicate, that the out-of-plane media Co/Pt is competitive with CMOS in terms of device density and switching energy. The fabrication of magnetic Computing components is compatible with Silicon technologies, so it is possible to create integrated CMOS/NML Systems e.g. for a NML processing unit embedded in a CMOS environment [40].

In other words, the application of NML makes use of the fact that below a certain critical size ferromagnetic islands become single-domain (the so-called single-domain limit). For NML applications they are fabricated in such a way that due to crystalline or shape anisotropy they show bi-stable magnetization states, so that the bit values '0' and '1' can be assigned to the two stable states. For logic functionality, either the propagation of domain-walls or magnetostatic stray-fields between single-domain dots are exploited.

Three different approaches for nanomagnetic logic have been proposed as listed below. a) and d) are based on field-coupling between nanomagnets, whereas b) applies the manipulation of domain walls in thin ferromagnetic wires. In c) we list the related field of electrical Quantum Cellular Automata (QCA), a particular unconventional logic architecture which might be used for NML Systems.

a) Permalloy dots with in-plane magnetization which have been intensively investigated at the Center for Nanoscience and Technology at University of Notre Dame, Indiana, USA [8] [10] [13].

b) Magnetic domain wall logic as it has been developed at Imperial College, London by the group of R. P. Cowburn [45] [7].

c) Quantum Cellular Automata (QCA) are a possible NML architecture. In existing implementations quantum dots are realized as electronic charges fabricated in metal or semiconductor dots [46].

d) Co/Pt multilayer logic devices with out-of-plane magnetization which have been realized by Focused Ion Beam (FIB) patterning [15] [16] [17] [18] at TU München by our group, and micromagnetically modeled [19] [20] [47] by the group of P. Lugi and G. Csaba, who is currently Professor at University of Notre Dame.

With respect to a—permalloy dots, the permalloy (e.g. $Ni_{80}Fe_{20}$) dots have an ellipsoidal shape (e.g. $60\times 90\,nm^2$) and a thickness of 10 nm or below. These nanomagnets are bi-stable, as their remanent magnetization (lowest energy state at zero external magnetic fields governed by shape anisotropy) always points along the long axis. A magnetic field can rotate the magnetization away from the long axis, but when removing the field, the nanomagnet switches to either of the two stable states. Placing several of these magnets side by side along the short axis results in a chain (or array in a 2D arrangement) of dipole-coupled nanomagnets that favor antiparallel alignment of the magnetizations. This is due to the stray field of the magnets acting on each other in close vicinity, trying to magnetize their neighbors in the opposite direction. Clocking can be performed by applying an external magnetic field along the short axis of the dots [28] [12], often referred to as hard-axis or adiabatic clocking. This external field turns the magnetic moments of all magnets orthogonal to the preferred magnetic anisotropy. This is an unstable State of the System, and when the field is removed, the nanomagnets relax into a lowest energy state with antiparallel ordering.

The basic logic gates of this technology are the inverter and the majority gate which has 3 inputs and 1 output. The Majority gate is a so-called universal gate, implying that all Boolean functions can be realized by them. Logic function blocks using this technique have been proposed, but not yet fabricated, including a 2-bitfull adder [28], a 3-bit counter [30], a programmable logic array [31], or an 8-bit discrete cosine transformation (DCT) using systolic arrays, which could be used in JPEG image compression [32]. Current theoretical estimations of power consumption for permalloy nanomagnetic circuits predicted factors of 50 to 290 improvement in power consumption for typical circuits compared to CMOS for similar or even reduced area and delay [12] [11] [32]. A magnetic Signal crossing is not possible in this technology, making magnetic to electrical interfaces necessary within larger logic blocks, which increases cost and complexity. The influence of non-ideal shapes of the Permalloy dots on the switching behavior was investigated [33] and on error rates in the circuits [48]. Considerable error rates of e.g. 10% for a field-coupled wire of 15 dots were found for an adiabatic clocking scheme with 2 us pulses along the hard axis.

In terms of b—magnetic domain wall logic, the magnetic domain wall logic concept utilizes a mobile interface between regions of oppositely aligned magnetization in a magnetic wire. In particular, a sub-micrometer planar nanowire made from a soft magnetic material such as Permalloy (e.g. $Ni_{80}Fe_{20}$) has been shown to form an excellent conduit for domain walls. The high shape anisotropy of the nanowire ensures that magnetization aligns with the long axis of the wire. The two possible directions form the basis of the binary information representation, with a magnetic domain wall acting as the transition edge between changing signals. Domain walls can be propagated through complex networks of nanowires under the influence of an externally applied magnetic field. This field rotates in the plane of the device and acts as both the clock and the power supply. Four basic logic functions (NOT, AND, fan-out, and cross-over) as well as a 5-bit shift register have been demonstrated in [24] operating simultaneously under the action of a Single globally applied rotating magnetic field. In the extensions to Multiplexers, Counters and D-latch flip-flops have been investigated [27]. Recent publications demonstrate an asymmetric Not-gate and shift-register [6] and investigate the chirality dependence [7]. To our knowledge, no integrated electrical input or output has been demonstrated. In addition, Signal crossing is an unsolved challenge.

With respect to c—electrical QCA devices and circuits, it is to be noted that besides implementing the Standard logic functions in NML, one can also look for alternative circuits and architectures that might better fit to the NML devices. One such approach is the use of Quantum Cellular Automata (QCA), which consist of fine grained, cellular building blocks, where Information is propagated through electrostatic (or magnetostatic) interaction, instead of electrical current flow. They have been investigated up to now for electronic Systems, where the quantum dot elements consist of electronic charges in metal or semiconductor dots or in Single molecules. Although a majority gate was experimentally demonstrated [49], no larger circuits have been experimentally achieved so far. Furthermore, estimations predict either a very low frequency or requirement of cryogenic operating temperatures. However, the circuit theory is more advanced than in Nanomagnetic QCAs, and various designs for digital logic circuits have been published already [50]. In 2004 a serial bit stream analyzer (SBSA) was described, which allows the detection of an arbitrary given pattern in a sequential bit stream and applies 39 majority gates for an 8-bit realization [51]. In 2008 an arithmetic logic unit (ALU) was presented, that uses a 16 to 1 multiplexer and 16 processing units for adding, subtracting, shifting and various other arithmetic and logic operations of 4-bit words [52]. In 2009 a carry delay multiplier (CDM) was described, that makes use of the intrinsic serial clocking scheme of QCA circuits and realizes a multiplication unit which requires one serial and one parallel input [53]. For the application in field programmable gate arrays (FPGA) two different realizations have been proposed: a look-up table (LUT), which uses 2 majority gates and 1 memory cell per element [54], and a multiplexer (MUX) based implementation, which consumes 3 majority gates for each configurable logic block (CLB) [55] [31]. Recent publications on magnetic QCAs demonstrate an asymmetric Not-gate and shift-register [6] and investigate the chirality dependence [7].

Using the embodiments, it will be possible to transfer and adapt the concepts of electrical QCA to nanomagnetic logic, which will for the first time open the way to realize non-volatile QCA circuits working at room temperature. In other words, embodiments may operate at non-cryogenic temperatures of, for instance, more than 0° C., room temperature and/or above.

In terms of d—nanomagnetic dots/islands with out-of-plane magnetization, this concept uses Co/Pt multilayer films, which show a strong ferromagnetic effect perpendicular to the film surface ("out-of-plane") resulting from the film's crystallographic anisotropy. The ferromagnetic switching threshold can be influenced using ion beam radiation. At sufficient FIB dose, the films can be changed from hard-ferromagnetic via soft-ferromagnetic to paramagnetic behavior. At TU München (TUM) we have extensively utilized this property to engineer the properties of ferromagnetic nanodots and have for the first time realized a 3-input majority gate with nonreciprocal dot-coupling.

In summary, the out-of-plane technique allows higher flexibility concerning the shape and the arrangement of the magnetic dots and the adjustment of the switching field using variable FIB irradiation doses [17] [18] [38]. Estimations predict that the out-of-plane media Co/Pt is competitive with CMOS in terms of device density and switching energy [16].

Figure 10A:
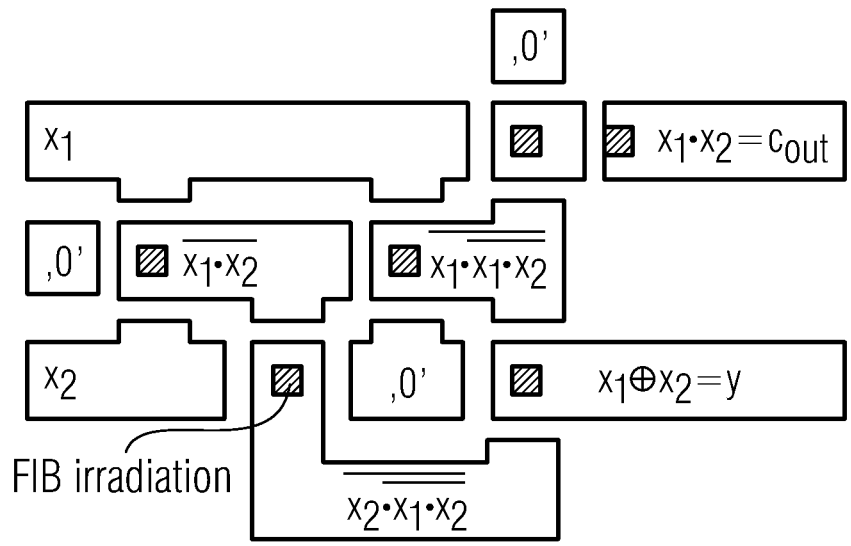
FIG. 10a shows a schematic overview of a two-bit half-adder as a nanomagnetic logic gate.
Figure 10B:
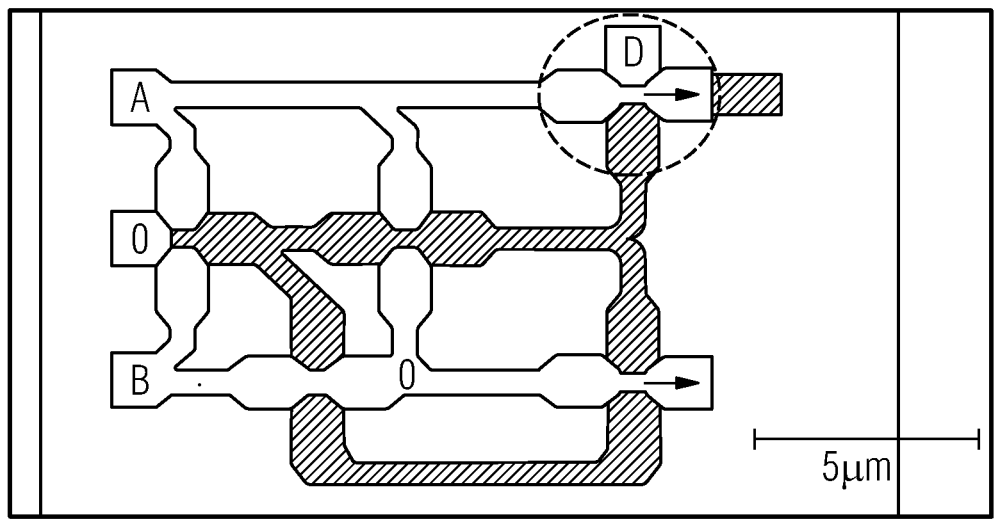
FIG. 10b shows a schematic representation of a MFM-image of a two-bit half-adder as depicted in FIG. 10a in operation.

FIG. 10a shows schematic representation of a half-adder layout, where only 4 clock cycles are needed for signal propagation from the first to the second majority gate. FIG. 10b shows an MFM picture (magnetic force microscope) of such an arrangement exhibiting mostly the correct computational result. However, due to a technology problem in this very first experiment, one faulty NAND decision at the Carry output is detected.

FIGS. 10a and 10b show a more complex nanomagnetic logic circuit in the form of a two-bit half-adder implemented in a two-dimensional layout. The different nanomagnetic structures comprise partially artificial nucleation centers 200, which are shown as hashed rectangles in FIG. 10a. Such a two-dimensional structure may, naturally, be combined with a nanomagnetic logic gate 100 according to an embodiment. In other words, for instance, in an electronic device 300 according to an embodiment, nanomagnetic logic gates with a two-dimensional design may also be implemented.

FIG. 10a shows a design of a 2-bit half-adder with strip-like magnetic islands (nanomagnetic structures). The adder has a total count of 11 magnets, 5 NAND gates and a critical path of 4 dots. In FIG. 10b the MFM image shows the magnetic up- and down states of the half-adder by different hatchings, exemplifying the very flexible design regarding dot shape and signal transfer.

Figure 11:
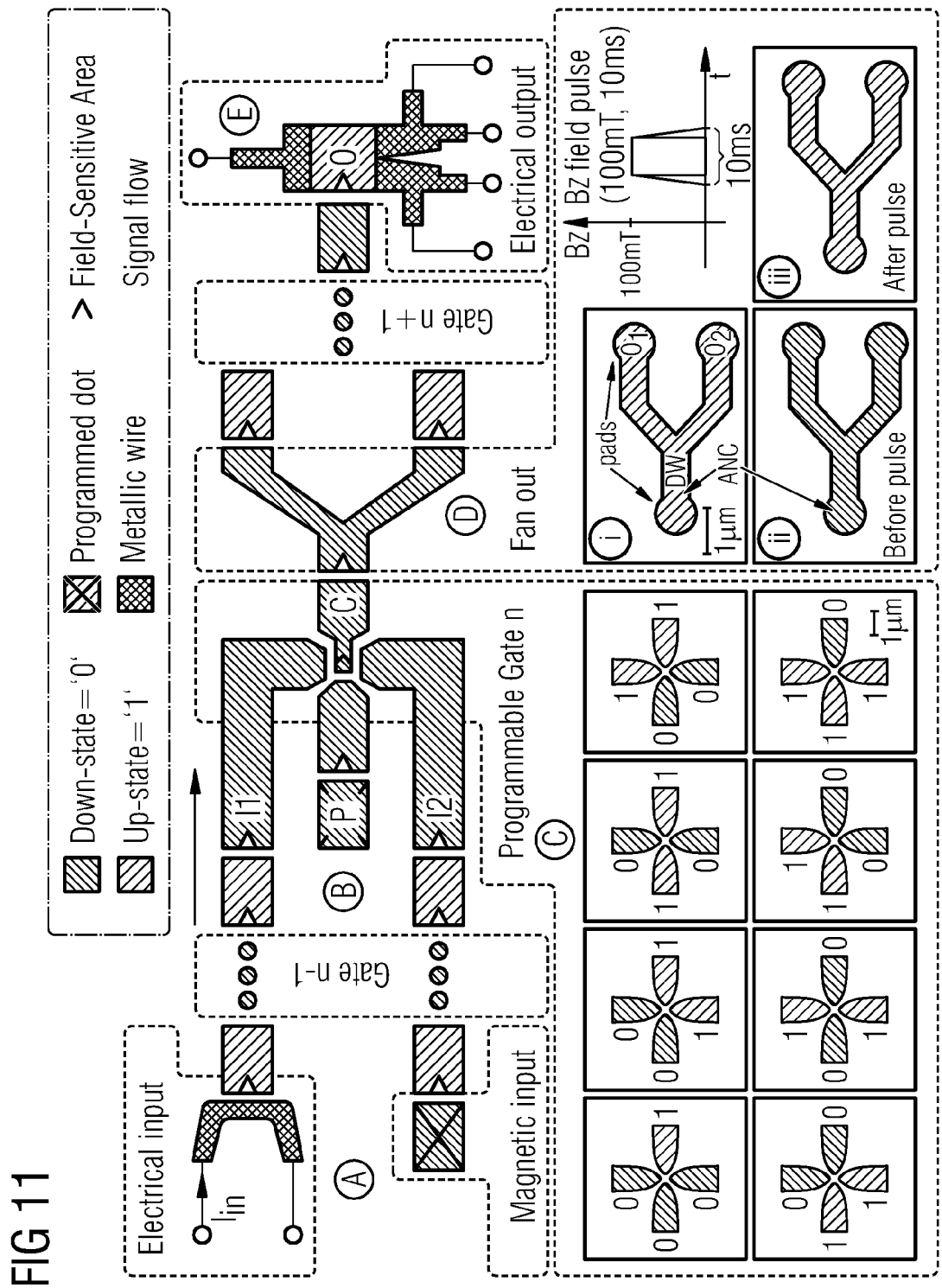
FIG. 11 shows a schematic view of a nanomagnetic logic device with electrical/magnetic input and electrical output.

FIG. 11 shows a more complex nanomagnetic logic system, the basic functions of which are summarized below. To be more precise, FIG. 11 illustrates an operation and components of an integrated programmable nanomagnetic logic device with electrical/magnetic input and an electrical output. Different parts of the NML device are referred to by A, . . . , E, whereas in the lower part of FIG. 11, MFM images of parts of the device are shown. Different magnetizations, which can be seen by using a magnetic force microscopy measurement (MFM) are illustrated in FIG. 11 by different hatchings. Moreover, FIG. 11 shows in a lower part a field pulse of an external magnetic field, which can be used for clocking the device.

Block A illustrates inputs to the NML gate, which can be electric or magnetic. So mixing of signal inputs created internally in the nanomagnetic signal processor and coming from outside sensors or circuits can be realized, providing a very flexible architecture e.g. for filter or pattern recognition applications.

Block B shows a 3-input majority gate, which can be programmed to function as NAND- or NOR-gate depending on the magnetization of the programming dot P. This programming operation can eventually be performed during run-time.

Block C shows magnetic force microscopy (MFM) measurements of a majority gate, which shows the correct function for all eight different input patterns. This is due to a technique developed by us, which defines the signal flow direction from the inputs to the output dot. It prevents reverse influence from the output to the inputs, which occurs in other NML approaches as there the geometry is fully symmetrical for all four nanomagnets.

Block D shows a branching structure to realize signal fanouts. The MFM measurements (i: topography, ii: magnetic phase before pulse, iii: magnetic phase after pulse also shown in FIG. 11) show, that the magnetization is switched in a deterministic way for both outputs, cloning the magnetic state of the input.

Block E shows the electrical output schematically. We realized and demonstrated a second structure using the Extraordinary Hall-effect, where the sign of the output current difference is dictated by the magnetic polarization of the output dot O. One advantage of this arrangement is that the output State of the magnet is directly sensed without interfering with the field from its neighbor.

It should be noted that FIG. 11 is not showing an important part of the complete system, which may be realized externally: The clocking (relaxing the adjacent magnets into the antiparallel state) may be performed by spatially homogeneous magnetic field pulses generated from solenoids close to the NML, which may be part of an embodiment herein. FIB generated artificial nucleation centers may allow for unidirectional signal flow from left to right in the graph as depicted by the arrows in Blocks A, B, D and E of FIG. 11.

State-of-the-art electrical and magnetic computing implementations may, however, show some disadvantages, one or more of which an embodiment may eventually improve.

In terms of magnetic implementations, a standard 2D (planar) nanomagnetic logic may exclude signal crossings, making the design of computing systems extremely difficult. Furthermore, due to limited field-coupling strength between nanomagnets, device complexity may be limited to programmable 2 input NAND/NOR-structures, equivalent to a majority decision. An integration density may not be significantly exceeding CMOS-implementations, as a footprint may be limited to the lithography limits as also known from CMOS technology.

In terms of electrical implementations, a complexity of electrical wiring in 2D as well as future 3D CMOS implementations may result in numerous processing steps with extremely expensive mask sets. It may also cause high area consumption and high power consumption, for computing and also for the electrical clocking system. Furthermore, a current leakage through thin oxides in ultimately scaled CMOS may become a major source for power consumption.

Embodiments comprise 3D integrated nanomagnetic computing devices. State-of-the-art of out-of-plane NML-technology has been performed in our group with international partners. The experimental realization of a 2-bit full adder is currently conducted. This proves the feasibility of 2D NML, but does not give solutions to the limitations described above.

The embodiments described herein may allow to implement a highly planar, but at the same time true 3D integrated computing device, by stacking several functional layers of nanomagnets, separated by thin planarizing layers and clocked with a global magnetic field.

In terms of the potential of 3D magnetic field-coupled devices, it seems to be quite likely that in the foreseeable future no emerging nano-device can outperform CMOS-based circuits in general purpose, Boolean logic circuits. The future of microelectronics probably lies in diversification [1], where novel devices with their corresponding computing architectures are developed and optimized for special tasks. Nanomagnetic computing devices can have great potential applications in memory intensive, low-power applications, where robustness, synchronicity and parallel pipelined computing may be or may become more important than extremely high speed. In such cases also the zero-leakage property and the non-volatility, avoiding power-up and standby losses, may be of advantage. Below, we give an outline of possible system parameters and proposed potential applications for the 3D integrated nanomagnetic computing device.

In terms of scalability, the irradiation technique for generating artificial nucleation centers is at present approved down to the 50 nm range. With our new 3D concept, 50 nm Co/Pt or Co/Ni strips can be used for a programmable NAND/NOR-function on two stacked functional layers. Hence, a programmable NAND/NOR may fit in a 200 nm×200 nm area, and the density per programmable NAND/NOR-function is $2.5 \cdot 10^9/cm^2$.

By stacking 10 NML device layers (which is not the limit for stacking) in a 3D arrangement, the density would be $2.5 \cdot 10^{10}/cm^2$. In [41] the area of a 4-transistor NAND gate is given as $175F^2$, which is $1.1 \cdot 10^9/cm^2$ in a 22 nm-technology. In this comparison, the overall footprint of a scaled nanomagnetic 3D circuit is more than one order of magnitude smaller than in Si-CMOS. Note also that even if the size of a single nanomagnet is bigger than the channel length of end-of-roadmap CMOS-devices, in field-coupled devices no additional area is consumed for electrical device insulation, neither for contacts and signal wiring, as contactless field coupling is used for logic operations. Also clock/supply wiring and clocking circuitry do not necessarily require extra area due to the vertically applied magnetic power clock. It is worthwhile to mention that the needed process technology for NML has not to be newly invented but can be adopted from CMOS technology, especially high resolution optical lithography and implanter technology (for ion irradiation) for large wafer processing.

In terms of speed, computing speed was long considered to be the weakest point of magnetic computing. While ultrafast magnetization processes can happen on the picosecond time scale, reversal of nanomagnetic dots takes place within nanoseconds for our Co/Pt system, as modeled with OOMMF [42]. A sample calculation for a 150 nm long Co/Pt dot results in a switching time of t=1.1 ns, corresponding to a domain wall propagation speed v of approximately 130 m/s. Note that this speed very much depends on film parameters, applied clocking field and FIB irradiation parameters. The field-induced propagation speed of a 4 ML Co/Ni strip (ML=monolayer) was determined to be in the 20 m/s range for medium applied fields [43]. Taking this latter conservative estimate and a system clock frequency of 50 MHz, the domain wall would propagate 200 nm per clocking cycle which defines the maximum length for a nanomagnetic dot, sufficient for scaled NML gate implementations.

Considering binary throughput, for a 50 MHz clock and the calculated device density of $2.5 \cdot 10^9$ programmable NAND/NOR-functions per $cm^2$, a binary throughput of 1.25 Gbit/ns/$cm^2$ can be estimated. The projected value for Si-CMOS (end of roadmap) is 238 Gbit/ns/$cm^2$ at clock frequencies in the GHz range [1]. By taking into account that the computing is non-volatile and a micro-pipeline architecture is provided inherently, very high throughput at a moderate clocking frequency may be achieved. We think that NML is particularly suited for specialized computational tasks like patterning matching or digital data filtering, as it can be reprogrammed during runtime to name just one example.

In terms of power dissipation, the potential barrier between the two states of a Co/Pt nanomagnet is a few hundred room temperature $k_B T$ ($k_B$ being the Boltzmann constant). With purely hard axis clocking, as proposed for our NML system, this is the amount of energy dissipated during the switching process in the magnets. Hence, worst case calculation for scaled 3D capable NML devices results in $P_{density}=4 \cdot 100\ k_B T/2.5 \cdot 10^{10}\ cm_{-2} \cdot 50\ MHz=2\ W/cm_2$. For the clock generation circuitry, harmonic excitation via an on-chip inductor may be power efficient and currently investigated for power supplies on-chip [44]. First calculations predict that a 100 μm×100 μm area can be clocked with a standard on-chip inductor of L=40 nH in the 50 MHz range dissipating 3 $W/cm_2$. First calculations at full NML clocking speed predict an upper dissipation limit of 5 $Watt/cm^2$ in the NML computing system. Here it is assumed, that every magnet is switched in each clocking cycle, which will not happen in most use cases. This value does not change for 3D integrated logic, so power efficiency will further increase. It should be noted that nanomagnetic logic systems may have zero leakage and therefore no static power dissipation, and their instant on/off capability may result in large power savings when not always operated at maximum speed and data throughput.

In other words, a dissipated power density of the magnet $P_{den}$ may be approximately $100 \cdot k_B T \cdot 50\ MHz/(200\ nm)^2 \cdot 10 = 0.5\ Wcm^{-2}$ for a system design comprising 10 functional NML layer assemblies and an areal density of $(200\ nm)^2$ per NAND/NOR gate. Hence, the dissipated power of a magnet with 0.5 $Wcm^{-2}$ is typically much smaller than that of a coil having a dissipation of about 3 $Wcm^{-2}$ or less at 50 MHz. Therefore, the dissipated power pf a NAND gate ($W_{NAND}$) is about 0.4 aJ for the magnets and approximately 2.4 aJ for the coil. In other words, the loss is approximately 45-times with a data throughput reduced by approximately 30% compared to a Si-CMOS system with a loss $P_{den}=160\ Wcm^{-2}$ or approximately 100 aJ for the CMOS. The binary throughput for such a NML system may be about 1.25 GBit $ns^{-1}\ cm^{-2}$ compared to 1.6 GBit $ns^{-1}\ cm^{-2}$.

In terms of the instant on/off capability and non-volatility many computing systems run idle for parts of the time and consume power unnecessarily. The fact that nanomagnetic circuits may be powered on/off instantly—without the need of any special additional device or circuitry—may result in large power savings and may make local embedded non-volatile memory unnecessary. The natural combination of non-volatile memory and logic can have special architectural advantages. This fact can also compensate for the relatively low speed of magnetic computing devices. In a high-performance computing system, external memory access is generally far slower than CPU clock times, and a complex memory hierarchy (cache memories) is typically required to speed-up computations. Memory-intensive computing tasks could be performed more efficiently—and potentially even faster—on magnetic computing devices than in conventional circuits. With an embodiment comprising 3D geometry, memory cells may eventually be placed in very close proximity under or over the logic.

In terms of robustness, as the information processing is not charge-based, the circuit may be radiation hard and shows a wide temperature tolerance due to absence of leakage currents.

In terms of other potential benefits, the proposed NML system may be highly planar, follows the rules for a top-down approach and, hence, may be highly suitable to be integrated in the backend process of standard CMOS or novel MRAM devices. Furthermore, since the magnetic layers are deposited by low-temperature sputtering and the ion beam used for magnetic patterning decays vertically on a 30-50 nm length scale, our NML devices according to an embodiment may allow for very dense 3D integration. Furthermore, in NML fabrication, only 2 mask steps per functional layer may be needed, one for Co/Pt island fabrication and one for ion patterning on wafer scale. This may be very desirable from an economic point of view.

An important point for embodiments is the extension of our work on Co/Pt magnetic films from 2D NML devices and single gates towards real 3D integrated circuits and systems. A basic implementation of embodiments is shown in FIG. 12.

As magnetic field-coupling is acting in all three different spatial directions (x, y, z), it can be exploited for true 3D implementations, without the complex task of electrically connecting every switching element (as it is the case in electronic (CMOS) digital circuits). Embodiments may further use a scheme, which may eventually boost logic functionality by one or more orders of magnitude. Real 3D stacked NML circuits, which are also coupled in the 3rd or z-dimension and isolated by dielectric planarizing layers, may combine the planar fabrication technology with a true 3D computing ability. Our approach of asymmetric dot-coupling due to, but not limited to localized FIB patterning is again used here.

Such a "natural" 3D computing system may allow for complex and dense computation, as the whole "volume" may be used for computing and not a single functional "layer" only. However, in terms of fabrication technology, the systems remains planar, as the devices may be comprised of layers with thicknesses in the range of 10 nm. All major technologies applied for CMOS fabrication, e.g. high resolution lithography and ion implanting techniques may be adopted for the described computing system. As one completely new Version of NML structures, 3D arrangements of dots and other nanomagnetic structures use vertical field coupling. Furthermore, we will extend our simulation tools for the design of complex NML functions. A further part of the description is dedicated to applications, their structure according to an embodiment, and how they may be implemented to obtain a good efficiency and performance.

Figure 12:
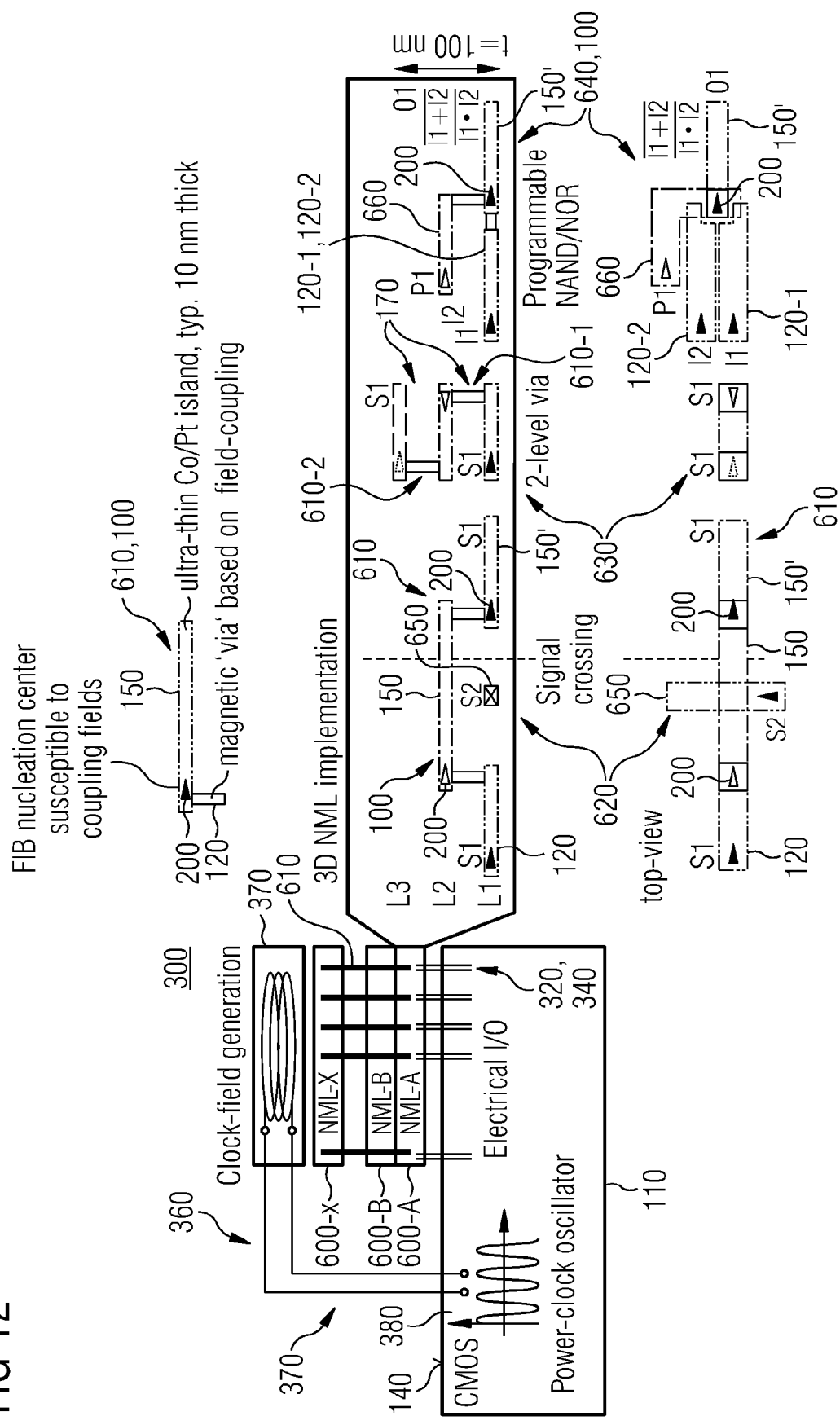
FIG. 12 shows a schematic view of an electronic device according to an embodiment.

FIG. 12 shows a schematic cross-sectional view of an electronic device 300 according to an embodiment. The electronic device 300 comprises a substrate 110 comprising a control circuit 380 of a magnetic field generator 370, which—in the embodiment shown in FIG. 12—is implemented in CMOS technology and comprises a power-clock oscillator, which is coupled to an electrical conductor 370 for the clock-field generation, which is implemented here as a coil comprising several turns.

The substrate 110 further comprises an electrical input circuit 320 and an electrical output circuit 340 which is coupled to at least one nanomagnetic logic active layer assembly 600-A, 600-B, 600-X, which are stacked onto one another and arranged in parallel or on the main surface 140 of the substrate 110. At least one of the nanomagnetic logic layer assemblies 600 comprises a nanomagnetic logic gate 100 according to an embodiment. Therefore, at least one of a nanomagnetic logic layer assembly 600 comprises at least a first layer 130 and a second layer 160.

However, also in between the nanomagnetic logic layer assemblies 600, nanomagnetic logic gates 100 according to an embodiment may be implemented. For instance, as vertical black lines, FIG. 12 shows a plurality of magnetic vias 610 which allow information to be transported from one nanomagnetic logic layer assembly 600 to another one. Since a magnetic via 610 also represents one of the most simple nanomagnetic logic gates 100 according to an embodiment, for a magnetic via 610 which is configured to transport, for instance, an information-carrying signal from NML layer assembly 600-A to NML layer assembly 600-B, the first layer 130 comprising the first structure 120 is part of the NML layer assembly 600-A, while the second layer 160 comprising the second structure 150 and the artificial nucleation center 200 is part of the NML layer assembly 600-B. The same also applies to magnetic vias allowing an information-carrying signal to be transported to a NML layer assembly 600 being further apart than the directly neighboring NML layer assembly 600, to a magnetic via 610 allowing an information-carrying signal to be transported in the opposite direction and to magnetic vias 610 configured and arranged to allow an information-carrying signal to be transported between other than the previously-mentioned NML layer assemblies 600.

To illustrate this a little further, FIG. 12 shows in an upper part a simplified sketch of one possible implementation of a magnetic via 610. As outlined before, the first structure 120 is arranged in the first layer 130 and the second structure 150 is arranged in the second layer 160, wherein the second structure 150 also comprises the artificial nucleation center 200, which may, for instance, be fabricated by FIB irradiation. As pointed out in FIG. 12, due to the mentioned fabrication technology, the artificial nucleation center 200 is also referred to as FIB nucleation center, which is susceptible to coupling fields.

In the embodiment depicted in FIG. 12, the second structure 150 is formed by an ultra-thin cobalt/platinum island (Co/Pt) with a typical thickness of approximately 10 nm thickness. However, as outlined before, in other embodiments, the second structure 150 may be implemented differently. The magnetic via 610 is, as all nanomagnetic logic gates according to an embodiment, based on a field-coupling. Dimensions, materials and material compositions may differ significantly in different embodiments. Any magnetic materials or material compositions, such as the ones mentioned, may be used, to name just a few options.

Apart from the magnetic vias 610 interconnecting different NML layer assemblies 600, FIG. 12 also shows several further nanomagnetic logic gates 100 according to an embodiment. FIG. 12 shows in its right part a schematic magnification of the first NML layer assembly 600-A comprising three stacked layers referred to as L1, L2 and L3 in FIG. 12, which, depending on the nanomagnetic logic gate 100, each may serve as the first or second layer 130, 160.

Here, the layer L2 is arranged in between the layers L1 and L3, wherein the layer L1 is closest to the main surface 140 of the substrate 110. In between each of the neighboring layers L1, L2 and L3, an insulating layer 170 is arranged to electrically insulate the input and second structures 120, 150 arranged in the respective layers L1, L2 and L3 from one another.

FIG. 12 shows both a cross-sectional view and a top view of a signal crossing 620, a two-level via 630 and a programmable NAND/NOR-gate 640.

Starting with the signal crossing 620, the signal crossing comprising in the embodiment shown in FIG. 12a nanomagnetic logic gate 100 with a first structure 120 arranged in layer L1 (first layer 130) and a second structure 150 arranged in layer L2 (second layer 160). It furthermore comprises a nanomagnetic transfer structure which is also arranged in the first layer 130 or layer L1. The nanomagnetic transfer structure 650 is arranged such that a projection of the second structure 150 onto the first layer 130 (layer L1) crosses the nanomagnetic transfer structure 650.

As already described in the context of FIG. 1, the artificial nucleation center 200 of the second structure 150 is arranged such that a projection of the artificial nucleation center 200 onto the first layer 130 (layer L1) falls together with the first structure 120. As a consequence, the magnetic field caused by the first structure 120 can eventually change the magnetization of the artificial nucleation center 200 and, hence, the magnetization of the second structure 150. However, since the nanomagnetic transfer structure 650 is located such that a magnetic field caused by the nanomagnetic transfer structure 650 is weak enough not to influence the artificial nucleation center 200 of the second structure 150, signals can be transferred independent of one another in the nanomagnetic logic gate 100 from the first structure 120 into the second structure 150 and along the nanomagnetic transfer structure 650.

The signal crossing 620 further comprises a magnetic via 610 as described, for instance, in the context of FIG. 1. However, here, the signal flow is in the inverse direction from layer L2 into layer L1. Hence, compared to the nanomagnetic logic gate 100 previously described, the roles of the first and second layers 130, 160 with respect to layers L1 and L2 are reversed. The first structure of the via 610 is the second structure 150 of the previously described nanomagnetic logic gate and the via 610 further comprises in layer L1 a second structure 150', at which a signal provided to the signal crossing at the first structure 120 is transported, when the predefined conditions are fulfilled.

In other words, the signal crossing 620 as shown in FIG. 12 can be considered a concatenation of a nanomagnetic logic gate 100 comprising a nanomagnetic transfer structure 650 as described and a magnetic via 610. Naturally, the previously-described order of the nanomagnetic logic gate 100 and the magnetic via 610 may equally well be reversed. In this case, the role of layers L1 and L2 with respect to being the first and second layers 130, 160, may eventually have to be inverted as well.

FIG. 12 further shows a two-level via 630, which may, for instance, be implemented as a concatenation of two magnetic vias 610-1, 610-2. Hence, for the lower or first magnetic via 610 as depicted in FIG. 12, layer L1 is the first layer 130, whereas layer L2 is the second layer 160. For the second magnetic via 610-2, layer L2 is the first layer 130, comprising the first structure and layer L3 is the second layer 160. Each of the vias 610 may, for instance, be implemented as described in the context of FIG. 1 and the nanomagnetic logic gate 100 shown therein.

Both, the signal crossing 620 and the two-level via 630, allow a transport of a signal S1. The signal crossing S2 may further allow a signal S2 to be transferred in a direction different, for instance, perpendicular, to that of signal S1.

Finally, FIG. 12 also shows a nanomagnetic logic gate 100 being a programmable NAND/NOR-gate 640. The programmable NAND/NOR-gate 640 comprises in the first layer 130, which is layer L2 in the embodiment shown here, a mode input structure 660, while a first and second input structure 120-1, 120-2 are both arranged in the second layer 160, which they also share with the second structure 150'. The programmable NAND/NOR-gate 640 works essentially as a majority gate. Depending on the magnetization of the mode input structure 660, the magnetization of the second structure 150' may be changeable according to a logical NAND-relationship or according to a logical NOR-relationship in response to the magnetic field components provided by the first and second input structures 120-1, 120-2, depending on the magnetic field component provided by the mode input structure 660. In the embodiment shown in FIG. 12, the artificial nucleation center 200 of the second structure 150' is arranged such that the magnetization of the mode input structure 660 may also be essentially perpendicular to the main surface of the substrate 110. However, as, for instance, outlined in the context of FIG. 2, in a different embodiment, the mode input structure 660 may also be arranged such that the magnetization of the mode input structure 660 may be chosen to be essentially parallel to the main surface 140 and, hence, comprising an in-plane magnetization. As a consequence, it may be more easily and more reliably possible to program the mode input structure 660 independently of the first structures 120 since the magnetic field for programming the mode input structure 660 may eventually be also an in-plane magnetic field parallel to the main surface 140. However, this may eventually require a further magnetic field generator to be implemented.

As outlined before, here, the first input structure 120-1, the second input structure 120-2 and the second structure 150 are arranged in the second layer implemented here as layer L1. The mode input structure 660 is arranged in the first layer implemented here as layer L2. Naturally, in other embodiments, a different arrangement may be possible.

FIG. 13 shows a truth table for the NAND/NOR-gate 640 as shown in FIG. 12. With a down magnetization corresponding to the binary state 0 and an up magnetization corresponding to a binary state 1, FIG. 13 shows that when the mode input structure 660 is set to the binary state 0 (down magnetization), the NAND/NOR-gate 640 operates as a NOR gate, whereas in the case of the mode input structure 660 having an up magnetization (binary state 1), the NAND/NOR-gate 640 operates as a NAND-gate at its second structure 150 with the output value O2.

Naturally, apart from the previously-disclosed NAND/NOR-gate 640, also other logical gates such as an AND gate, an OR gate or another logical gate may be implemented.

Hence, FIG. 12 shows an example of 3D nanomagnetic logic integration. An important aspect of embodiments is to enable a transfer of the existing planar, single layer NML devices into a true 3D digital logic circuit architecture, where all three dimensions are used for field coupled computing. Another important aspect is to overcome the NML routing problem. Our current work shows that out-of-plane media are the best candidate for NML devices. However, current implementations lack the possibility for magnetic signal routing, i.e. signal crossings and the possibility for feedback. This may be overcome by at least some embodiments by extending the single functional computing layer to stacked planes of 3D interacting field-coupled nanomagnets. In FIG. 12a hybrid CMOS/NML system with 3D NML structures is shown.

In FIG. 12 a true 3D integrated hybrid CMOS/NML system is shown. The NML circuits may be stacked in the z-dimension by a dielectric separation layer (insulating layer 170). Field coupling acts strongly also in the z-direction, such that the magnets can be locally sensitized by FIB irradiation, and complex logic functionality in 3D dot arrangements becomes feasible, to name just some examples.

By introducing separation layers of thin spin-on dielectric, vertical nanomagnetic inter dot distances of <50 nm may be achieved, sufficient for strong dipolar ferromagnetic coupling between stacked dots and wires. The technique of local FIB irradiation is applied for each NML layer such that magnetic Signals can propagate via field-coupling without the need of electrical current flow in lateral and vertical direction. In other words, electrical interconnects within the magnetic computing stack are entirely substituted by so-called 'magnetic vias'. Such vias may be formed by a FIB induced weak spots (artificial nucleation center 200) in close proximity to an adjacent nanomagnet. The strong coupling fields of the nanomagnet superpose on the weak spot in such a way, that both magnets align in the same magnetization direction when clocked with the external magnetic field. Note, that vertical signal propagation takes place in one clocking cycle such that vertical vias are set instantaneously within one clock. In other words, magnets that are linked by vias are ferromagnetically tied together to form a single-domain magnet over a certain distance. Electric and magnetic transducers are only needed for in- and output, making true 3D stacking possible. At the same time, costly electrical interconnects that are limiting 3D integration in CMOS technologies may be avoided or at least reduced.

The embodiments described herein show that extending the existing devices to the third dimension may lead to highly increased functionality and a straight-forward circuit and system design. FIG. 12 shows the design of an example signal crossing, a 2-level magnetic via interconnecting 3 levels and a robust and programmable NAND/NOR function as defined by the magnetization of the programming dot P1. A three-layer Stack of Co/Pt is exemplarily shown here for demonstration. For reasons of hierarchical system design, it might be advantageous to have e.g. layer L1 and L2 for computing functionality and layer L3 for signal routing. Such three layers already form a fully functional computing system. But the system is not limited to just three layers. Stacking blocks of NML systems on top of each other (NML-A 600-A, NML-B 600-B, . . . , NML-X 600-X) may lead to a hierarchical and high performance digital Information processing system.

A further important point for embodiments is the clock generation, which is implemented here by an integrated micro-coil. Clocking frequencies in the 50 MHz range can be achieved. Note that a hybrid NML/CMOS Implementation is not the main purpose of embodiments, but it should be mentioned, that the structural design is compatible with such a hybrid integration.

In yet other words, FIG. 12 shows an embodiment of a 3D integrated hybrid CMOS/NML system. The NML devices or gates are stacked in the z-dimension, separated by a dielectric layer, thin enough that field coupling acts strongly also in the z-direction forming so-called magnetic vias. The magnets may be locally sensitized by ion beams e.g. FIB (indicated by the arrows), and complex logic functions in real 3D arrangements of dots become feasible.

In the following, a description of the fabrication of embodiments will be described. The Co/Pt and Co/Ni dots and stripes are highly planar structures with typical thicknesses of 10 nm and lateral sizes in the 100 nm to 1 μm range. Hence, for patterning all the knowledge of CMOS large-scale integration and planar fabrication technology can be reused. On first sight, deposition of several functional layers of Co/Pt followed by dielectric planarization steps seems to be easily attainable. However, it is a well-known fact, that magnetic multilayer films are highly sensitive to the smoothness of the substrate and seed layer. Therefore, one major challenge for NML fabrication is the deposition of several highest quality functional layers of Co/Pt, engineered by FIB irradiation and magnetically interacting by field-coupling.

Figure 14B:
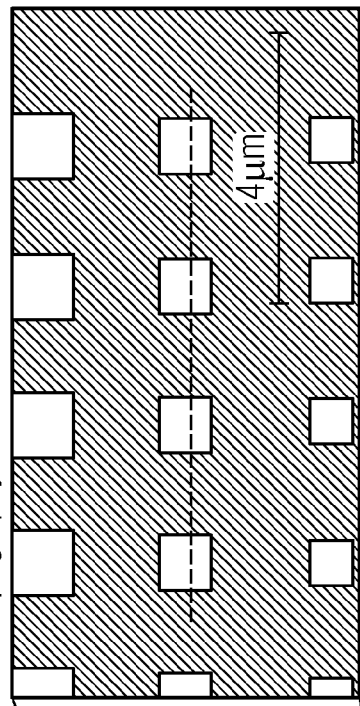
Figure 14C:
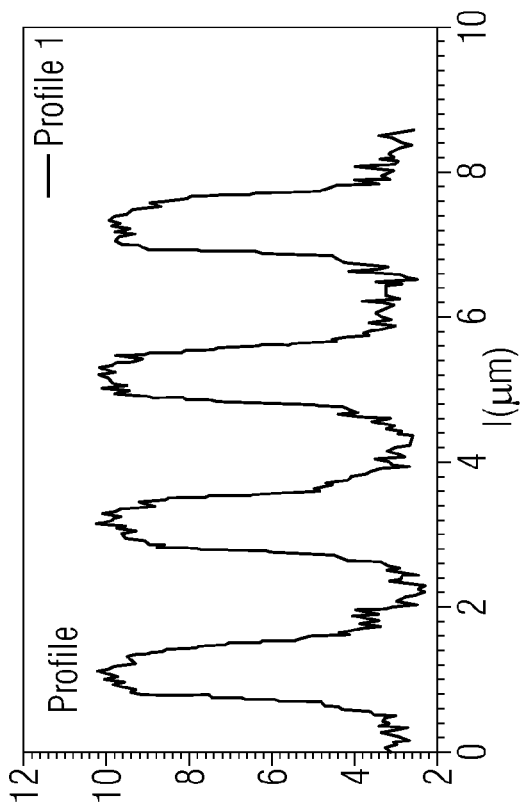
FIG. 14c shows a profile of the AFM-topography shown in FIG. 14b.
Figure 14A:
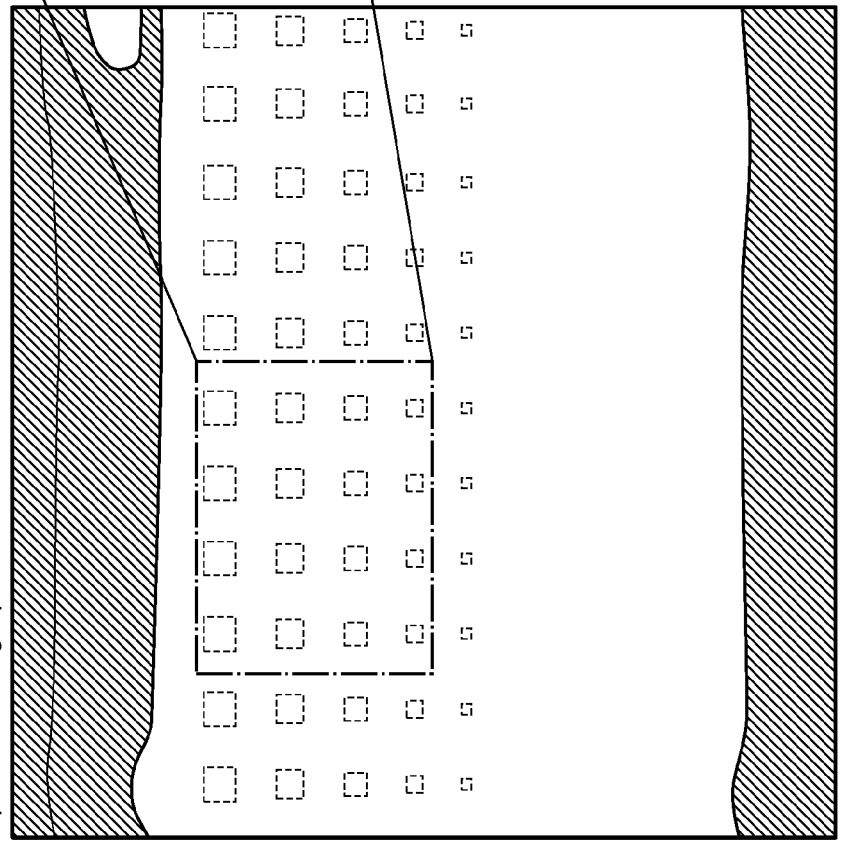
FIG. 14a shows an optical micrograph.

In FIGS. 14a, 14b and 14c results of feasibility studies in multilevel Co/Pt deposition are illustrated. The optical micrograph of FIG. 14a shows a Co/Pt film, which was sputterdeposited on top of an array of separated Co/Pt islands, separated by a thin spin-on dielectric. The metallic films deposited are only in the range of 10 nm and hence appear semitransparent in the optical micrograph of FIG. 14a. The same structure is measured by atomic force microscopy (AFM), the result of which is shown in FIG. 14b to observe the two dimensional topography. The plot in FIG. 14c is a cross-section or profile along the dot-array, showing the planarization capability with a reduction in the dot mesa height from more than 32 nm before planarization to less than 10 nm, sufficient for undisturbed magnetic signal propagation.

In other words, FIG. 14a shows an optical micrograph of a Co/Pt film deposited on top of an array of single domain Co/Pt islands with a spin-on dielectric as the separation or insulating layer. In FIG. 14b the AFM topography image shows the planarization capability of the dielectric with remaining 10 nm dot mesas analyzed in the cross-sectional view of FIG. 14c.

Figure 15:
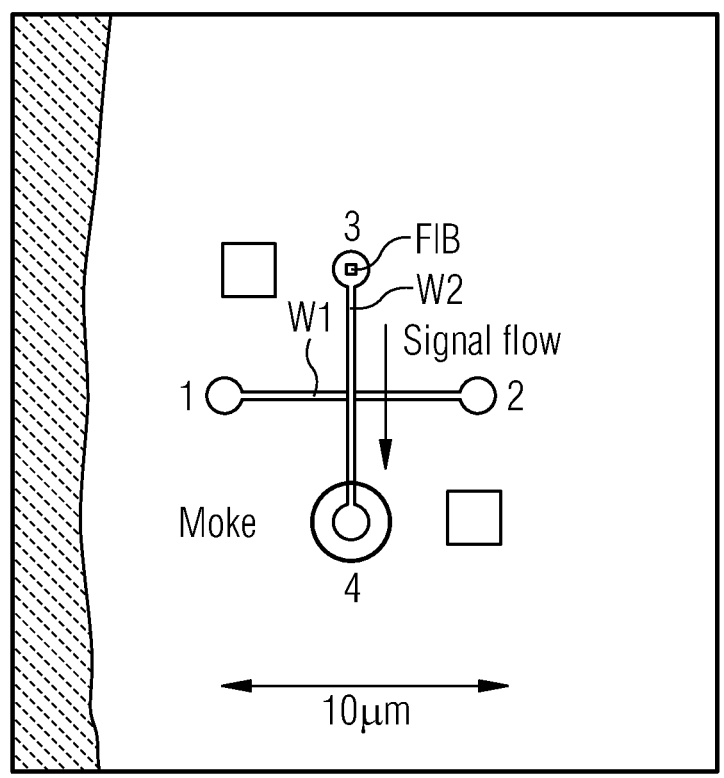
FIG. 15 shows an optical micrograph of a test structure for an undisturbed signal propagation in two crossed magnetic wires.

In FIG. 15 an optical micrograph of an experimental demonstration of undisturbed magnetic signal propagation in two crossed magnetic wires is shown. In other words, FIG. 15 shows an optical micrograph of a crossing structure according to an embodiment. The nanomagnetic structure connecting the dots labeled "1" and "2" are arranged underneath the nanomagnetic structure connecting the dots labeled "3" and "4" in FIG. 15.

Two 5-multilayer Co/Pt wires are crossed, separated by a 30 nm spin-on dielectric. Before FIB irradiation, a mean switching field (SF) is in the order of 160 mT for both wires as shown in the table of FIG. 16. By FIB irradiation, the SF of pad 3 is reduced to 73 mT, now governing the SF of the whole wire W2. MOKE measurements (Magneto-Optic Kerr Effect) confirm that the mean value of the switching field on pad 3 and 4 is equal and not dependent on the magnetization state of wire W1. Hence, a magnetic domain state in W2 is transferred from pad 3 to pad 4 independent of W1 demonstrating NML signal crossing.

The optical micrograph of FIG. 15 shows the two crossed wires that are fabricated with a 30 nm spin-coated dielectric separation layer. The wires are 10 μm long and 500 nm wide and are well within the single-domain limit. Keeping the magnetic state of W1 fixed in one of the possible up or down magnetization states, W2 can be reversed at a mean SF of 73 mT which is measured by MOKE on pad 3 and 4. As the distributions are equal on both pads independent on the state of the lower wire W1, it is experimentally proven that a magnetic signal can be transferred from pad 3 to pad 4. Thus, this setup demonstrates for the first time a magnetic signal crossing element in out-of-plane NML, which is one substantial part of an embodiment.

A process used here in order to fabricate the invented complex 3D integrated NML complex gate from out-of-plane magnetic media can be subdivided into 3 steps:

3D Fabrication Technology:

Deposition and patterning technology to gain 2-level and later 3-level functional NML layers separated by a spin-on dielectric in order to obtain robust vertical field-coupling in sub-micrometer 3D nanomagnetic arrangements.

3D Basic Gate Structures:

Patterning of 2-level NML structures i.e. crossings and strip lines for signal propagation, magnetic vias and robust NAND/NOR gates in order to generate the basic building blocks, needed for use in a 3D complex gate.

3D Complex System Design and Fabrication:

Arranging the structures in order to form a 3D complex NML gate with electrical input by planar current pulsed wires and a global clocking circuitry by integrated spiral inductors or as a backup an external ferrite-core micro solenoid.

To turn to the 3D fabrication technology in more detail, planar NML gates in a single multilayer stack and their integration into microelectronics are state-of-the-art at our institute. In order to add the third dimension, several extensions are introduced. Especially the optimization of the inter-dielectric layer, robust control of the magnetic properties of the films grown on different seed layers and the precise alignment of the dot arrangements are of vital importance.

Further, a deposition of two- and three-level stacks separated by thin spin-on dielectric, e.g. HSQ, may be used. Adhesion layers on top of the HSQ (Ti, Cr, $O_2$ plasma treatment) may allow or even guarantee sufficient robustness for later patterning conditions. Co/Pt and Co/Ni stacks may be combined to obtain an optimal ferromagnetic film combination. Such films can be patterned in various geometries to tailor vertical coupling strengths.

To turn to the 3D basic gate structures in more detail, several operating NML structures have already been demonstrated, i.e. inverter chain, fan-out and the majority gate. For a 3D implementation, the demands on magnetic properties for every functional layer (L1, L2 and L3 as shown for instance in FIG. 12) are similar but the layout (e.g. dot geometries, arrangement) may differ for each layer, in order to achieve functional units over 2 and 3 levels of Co/Pt and Co/Ni. This may involve the following innovations proposed in connection with embodiments:

1. It may be advisable to have dot configurations, which are fabricated on three levels and connected via the so-called "magnetic vias". Such "vias" are fabricated by placing Co/Pt strips on top of each other and irradiating an artificial nucleation center into the top or bottom layer strip. At such irradiation spots, field coupling acts strongly and a signal can be transferred via field-coupling between the two layers. The depth of the FIB irradiation (e.g. acceleration voltage, stopping layers) may be controlled in order to pattern the top-most layer only.

2. Planar strips and different dot shapes from Co/Pt may be used in a two-level Co/Pt system in order to cross magnetic Signals without cross-talk. Directed signal transfer may be gained over 2 levels of Co/Pt, which are ferromagnetically coupled.

3. Domain wall conductors (planar strips) may be used for critical path optimization to reduce the dot count for complex logic functions.

4. A robust, compact NAND/NOR function in two levels of Co/Pt is one basic block of the 3D NML. The programming dot may be located or arranged above the computing area of a two input gates. It can be considered to be a programmed majority gate, where the programming dot is above the active computing area.

3D Complex System Design and Fabrication in Detail:

Construction of 3D complex logic blocks out of several NAND/NOR functions, with electrical input performed by current carrying wires and clocked by a global harmonic out-of-plane magnetic field is described next.

Compared to a 2D gate, the 3D gate can be optimized in terms of critical path (number of sequential nanomagnets) and robustness (statistical variations, switching field distributions). By design optimization, also using different dot shapes, dot count will be reduced, such that fewer clocking cycles are needed until the result appears at the output.

An external clocking circuitry may be constructed by external ferrite-core micro solenoids. Such inductors can be brought in dose vicinity to the chip surface and generate frequencies up to the MHz range with field amplitudes of at least 50 mT. This is a direct way of clocking the complex nanomagnetic gate. For more compact integration, the external micro-coil may be replaced by a fully integrated spiral-inductor, as for instance, shown in FIG. 3. Consequently, it may be possible to reach frequencies of up to 100 MHz.

Going back to FIG. 12, it also illustrates clocking concepts and synchronization. For the signal propagation along a chain of magnetic dots, a time varying magnetic field is required. A spatially homogeneous and global magnetic clocking field can be generated via on-chip inductors or chip-bonded inductors as depicted in the left part of FIG. 12 (clock-field generation). It propagates the signal along the partially irradiated dot chains and gates. The external field drives all dots regularly near to the "up-" and the "down-switching" threshold, where they switch to their correct computing state due to field-coupling depending on the neighboring dot magnetizations. For low power consumption of the clock, it is proposed to use an adiabatic power clock generator combined with efficient and specially designed on-chip inductors. As this clocking field is also the energy supply to the circuit, supply networks and complex electrical wiring for both clock and power distribution are superfluous. Also the well-known problems of clock skew and of supply bumps due to switching events known from CMOS circuits may eventually not be present with such global clocking.

Although a global clock serves for synchronized switching of the nanomagnets, the paths for NML signals within a circuit block can be of different lengths and thus may have to be synchronized between functional NML units. Commonly, it is proposed to insert an adequate number of nanomagnets in each signal line to obtain synchronous input data at each logic unit. But this may cause additional effort, area consumption and complicates the design. Making use of the 3D geometry, we invented latch stages to be inserted between blocks for synchronization and buffering. This reduces circuit complexity by a clearly structured hierarchical arrangement of NML functional blocks, and ensures synchronicity. This approach is similar to the use of flip-flops in CMOS circuits, where the signals are buffered and synchronized between combinatorial logic blocks.

FIG. 17 shows a schematic block diagram of an electronic device 300 according to an embodiment. The electronic device 300 comprises once again a substrate 110 comprising an area 310 in which several nanomagnetic logic gates are integrated. To be more precise, the area 310 is divided into several subareas 670-1, . . . , 670-5 which will be outlined in more detail below. The electronic device 300 further comprises an electrical input circuit 320 and an electrical output circuit 340, which are coupled to at least some of the nanomagnetic logic gates 100 to provide magnetic information into the nanomagnetic logic gate 100 in area 310 and to read out the results from at least some of a nanomagnetic logic gate 100 and to turn the results into electrical signals.

To be a little more specific, subarea 670-1 may be a complex gate, such as an 8-bit full-adder, to which the electrical input circuit 320 is coupled to provide via an according number of electrical input signals, information to be processed by the respective nanomagnetic logic gates comprised in area 310. The area 310 further comprises in subarea 670-2 a further complex gate, which may for instance, also be an 8-bit full-adder which, however, may obtain its data to be processed by a magnetic coupling.

Subarea 670-3, which is coupled by corresponding magnetic outputs to both subarea 670-1 and 670-2, comprises a synchronization and buffer nanomagnetic logic circuit, which may be configured to synchronize the results obtained from the nanomagnetic logic gates of the previously-mentioned subarea 670-1, 670-2 and to buffer the results before providing them via corresponding magnetic inputs to nanomagnetic logic gates 100, comprised in the further subareas 670-4 and 670-5, which may also comprise complex nanomagnetic logic gate structures such as 8-bit full-adders. The electrical output circuit 340 is then coupled to at least some of the nanomagnetic logic gates of the subareas 670-4 and 670-5.

To put it in more general terms, subarea 670-3 may comprise a nanomagnetic logic synchronization and buffer structure, which comprises a magnetic input and a magnetic output, and which is configured to synchronize and buffer magnetic signals obtained at the magnetic input to provide the obtained magnetic signals at its magnetic output in a synchronized form. The magnetic input of the nanomagnetic logic synchronization and buffer structure 680 may, for instance, be coupled to complex nanomagnetic logic gate structure 690 like the previously-mentioned multi-bit full-adder, multiplier, shift registers, or other complex logical gate structures. The complex nanomagnetic logic gate structure 690 may also comprise other structures used for other computations, which may, for instance, be implemented in a conventional ALU (Arithmetic Logic Unit).

FIG. 17 depicts the topology for such an NML System: The outputs of the circuit blocks 670-1, 670-2 (e.g. 8-bit full-adders or similar complex combinatorial logic functions and structures) may be stored and transferred to the consecutive or following computing stages by the synchronization and buffer circuitry 690, for instance, in an synchronized form, comprising the previously mentioned latch stages. In other words, FIG. 17 shows the topology for buffering and synchronizing outputs of complex NML gates. The outputs may be stored in non-volatile latch stages, until they are synchronously transferred and distributed to the consecutive computing stages. In FIG. 17, the topology for buffering and synchronizing the outputs of complex NML gates is shown. The outputs may be stored in non-volatile latch stages, until they can be synchronously transferred and distributed to the consecutive computing stages.

Three different concepts for synchronization of NML functional logic units are proposed and are described here in detail.

First, by placing nanomagnetic islands in close vicinity (e.g. above or below the actual logic layer) a Co/Pt wire, which is basically a thin strip of Co/Pt which conducts domain walls, we may be able to control the domain wall propagation in the wire. Placing nanomagnetic islands of permalloy or soft-magnetic Co/Pt wires fabricated by sufficient FIB dose in a certain vertical distance to the output dot of combinatorial logic gates, the digital signal can be blocked or transferred depending on the magnetic state of the synchronization structures, i.e. the stray-field of the close-by magnets. In order to switch these transfer structures on top or below the logic layers, short pulses of externally generated in-plane fields are applied for clocking. Such pulses may be influencing the synchronization circuitry, but not the logic gates, which are mainly sensitive to out-of-plane fields. These structures may then act as gates for controlling the signal propagation. Recent experiments in our group show that such structures work similar to transfer gates as known from CMOS circuits and thus have shown the principal feasibility of this concept [58].

Second, a locally moving magnetic clocking field that drives the signals along a chain of magnetic dots from an input to an output is another method to synchronize NML computing signals. In some applications, it may be advantageous to have such a local clocking, e.g. if one wants to activate only a small portion of the NML circuitry at certain times. Also the activation of the magnetic flip-flops may be performed in this way. Such fields can be produced by a moving domain wall in an additional ferromagnetic layer [56] [57]. With this domain wall clocking approach, a magnetic clocking wire below or above the gates would not directly influence the NML logic devices, but carry a domain wall providing the required, time-varying clock field. This could facilitate fast switching of magnetic logic synchronization devices without the need to generate high-frequency (e.g. GHz) clock signals. Domain wall propagation may be triggered by global in-plane magnetic fields. The frequency may be chosen as a fraction of the main magnetic power-clock, for instance, for use of domain-wall clocking at the synchronization nodes between arithmetic units.

Figure 18A:
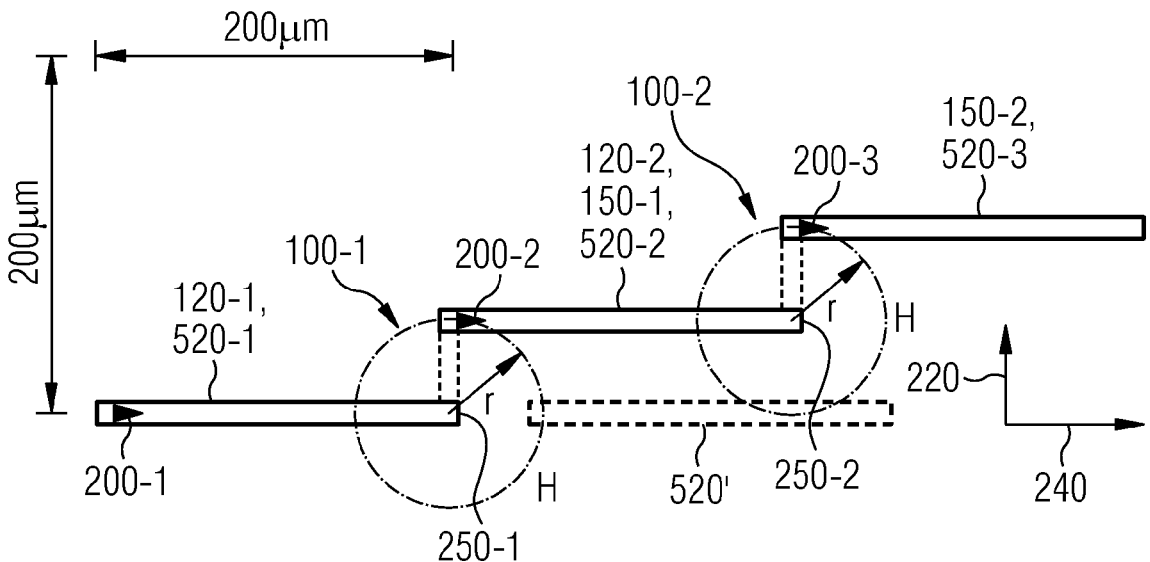
FIG. 18a shows a schematic view outlining the basic concept employed in embodiments.

FIG. 18a shows a schematic cross-section through two nanomagnetic logic gates 100-1, 100-2, which are coupled. The nanomagnetic logic gates 100 comprise three nanomagnetic structures 520-1, 520-2 and 520-3 which are all arranged in different layers. For instance, for the first nanomagnetic logic gate 100-1, the nanomagnetic structure 520-1 is the first structure 120-1, while the second nanomagnetic structure 520 is the second structure 150-1 of the nanomagnetic logic gate 100. An artificial nucleation center 200-2 is arranged at an edge 250-1 of the first structure 120-1 and arranged such that it is well within a certain radius r. The radius r is chosen such that the magnetic field perpendicular to the main surface 140 of the substrate 110 (not shown in FIG. 18a) is strong enough to alter the magnetization of the artificial nucleation center 200-2, when the predetermined condition is fulfilled.

Similarly, also the second nanomagnetic logic gate 100 comprises a first structure 120-2, which is identical to the second structure 150-1 and, therefore, with the second nanomagnetic structure 520-2. At an edge 250-2 which is opposite to the artificial nucleation center 202-2, a second structure 150-2 of the second nanomagnetic logic gate 100 is arranged in the form of the third nanomagnetic structure 520-3. Also, the third artificial nucleation center 200-3 is positioned at a distance r from the edge 250-2.

It is to be noted that FIG. 18a represents a drawing to the scale. Assuming that a further nanomagnetic structure 520' is implemented in the same layer as the first nanomagnetic structure 520-1, due to the fact that the magnetic field caused by the nanomagnetic structures 520 are essentially similar in all directions, the magnetic information can be transported from the first nanomagnetic structure 520-1 to either the second nanomagnetic structure 520-2 in the framework of the nanomagnetic logic gate 100-1 according to an embodiment or, for instance, by implementing an artificial nucleation center in the framework of the further nanomagnetic structure 520', to this nanomagnetic structure. However, when it is avoided to place an artificial nucleation center in the area indicated by the circle having the radius r around edge 250-2 inside the further nanomagnetic structure 520', the magnetization of that nanomagnetic structure 520 is typically not influenced.

Figure 18B:
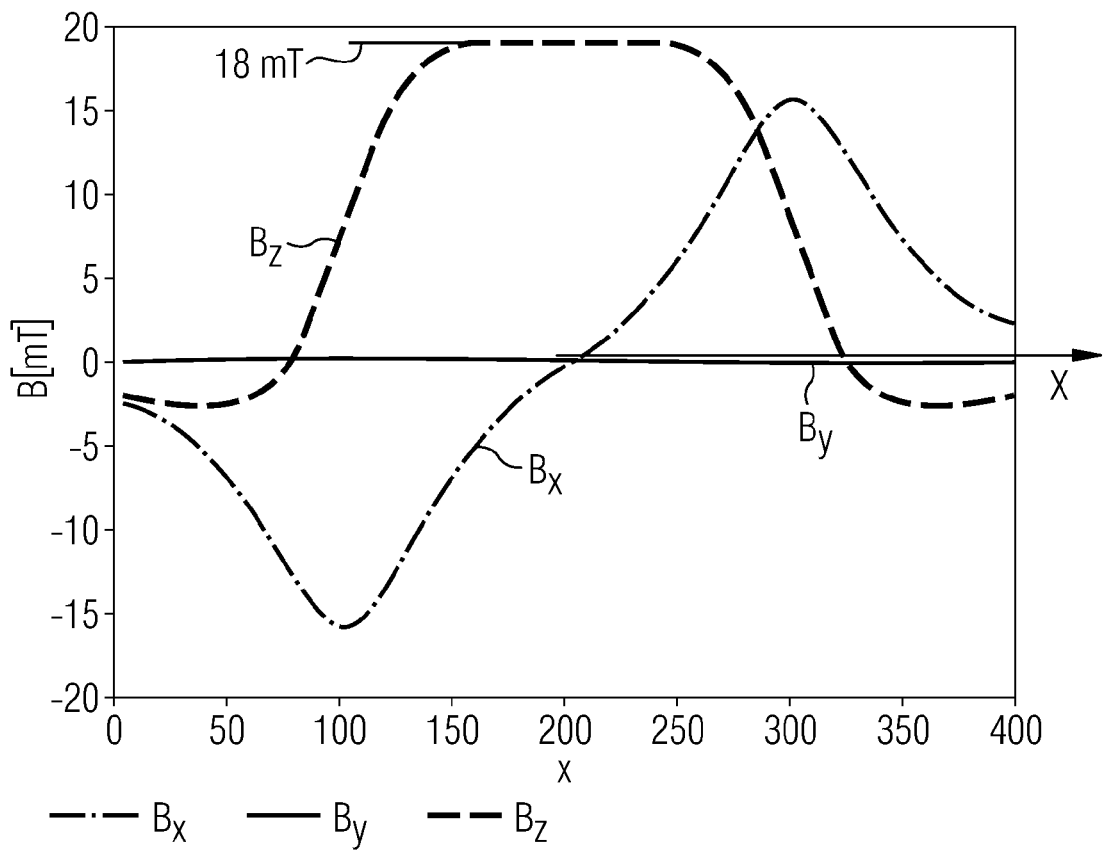
FIG. 18b shows magnetic field densities of different components of a magnetic field provided by another magnetic structure.

In other words, FIG. 18a illustrates that the field coupling operates in all spatial directions. This is also demonstrated by FIG. 18b showing for the three magnetic field components $B_x$, $B_y$ and $B_z$ along the previously-defined directions x, y, z, the magnetic field densities. When positioning the corresponding second structures along with their artificial nucleation centers 200 in the areas of approximately the highest magnetic field densities, the field coupling may be used essentially in both directions along the extension direction 240 and along the direction 220 corresponding to the x-direction and the z-direction, respectively. To be even a little more precise, FIG. 18b shows the magnetic field density at a distance of 40 nm.

In other words, to exploit the field coupling, planar magnets separated and planarized with a 40 nm thick dielectric layer along with an alignment precision of 50 nm or better with respect to the different layers along the x- and y-directions, may yield the desired field coupling, when the artificial nucleation centers can be fabricated with a vertical control of the ion radiation.

Figure 19A:
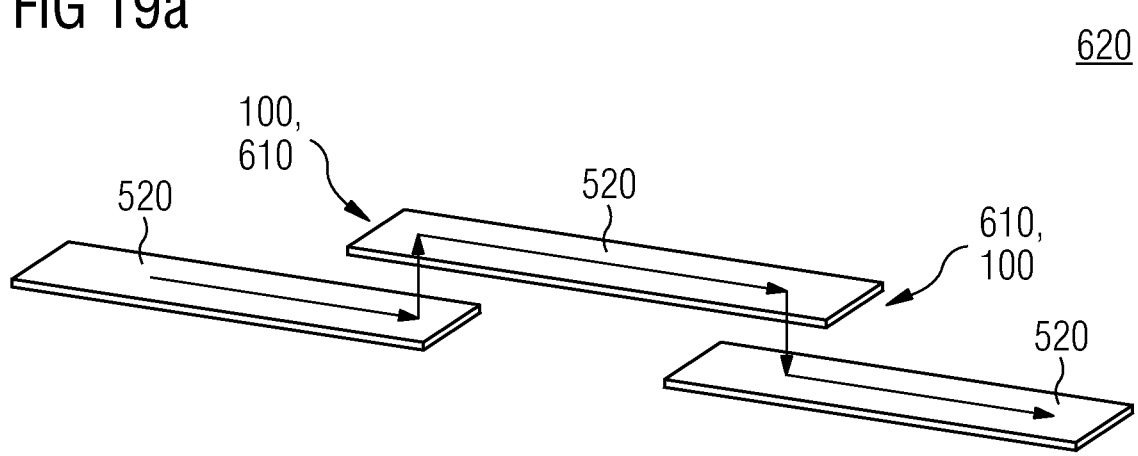
FIG. 19a shows a strongly simplified perspective view of a signal crossing according to an embodiment.

As already outlined, nanomagnetic logic gates 100 may, for instance, be used to implement a signal crossing 620. FIG. 19a shows a strongly simplified perspective view of such a signal crossing structure 620 comprising two nanomagnetic logic gates 100 in the form of magnetic vias 610 as outlined before.

Figure 19B:
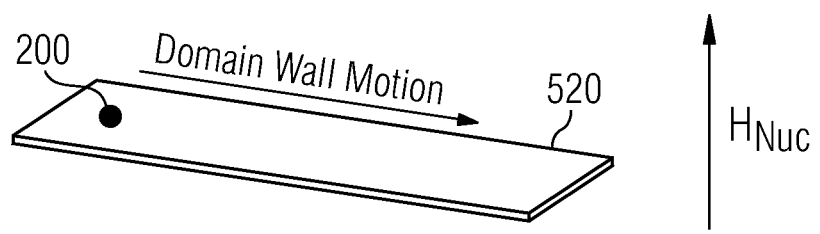
FIG. 19b shows a perspective view of a nanomagnetic structure comprising an artificial nucleation center.

To achieve the desired directed signal flow, any nanomagnetic structure 520 into which a magnetic field is to be coupled into to change its magnetization essentially perpendicular to the main surface 140 of the substrate 110 comprises an artificial nucleation center 200 as shown in FIG. 19b. The artificial nucleation center 200 may, for instance, be fabricated by a focused ion beam irradiation as outlined before. When the magnetization of the artificial nucleation center 200 is changed, a domain wall motion or DW motion is initiated which results in a change of the magnetization of the whole nanomagnetic structure 520 in response to an externally-applied magnetic field of a sufficient strength $H_{Nuc}$.

FIG. 20b shows the signal crossing as already shown in FIG. 12. FIGS. 20b and 20c each show MFM-measurements of the structure shown in FIG. 20a, wherein the upper parts of the FIGS. 20b and 20c show the initial states and the lower parts of the respective shows the magnetizations after applying an external magnetic field of −70 mT and +71 mT, respectively. In the situation of FIG. 20b, the nanomagnetic transfer structure 650 is initialized with the binary state 0 (magnetization M4=0). The same is also true for the magnetization of the first structure 120 (magnetization M1=0), while the magnetizations of the second structure 150 and the further second structure 150' are both initially in the binary state 1 (M2=M3=1). After applying the previously-mentioned magnetic field, the magnetization of the two second structures 150, 150' switch to the binary state 0.

In the situation shown in FIG. 20c, the initialization state is inverse to that of FIG. 20b. After applying the magnetic field of +71 mT, the magnetizations of the second structures 150, 150' also flip (M2=M3=1).

These measurements depicted in FIG. 20 show that the signal crossing structure 620 based on two Co/Pt layers and a HSQ insulating layer work as expected.

Figure 21A:
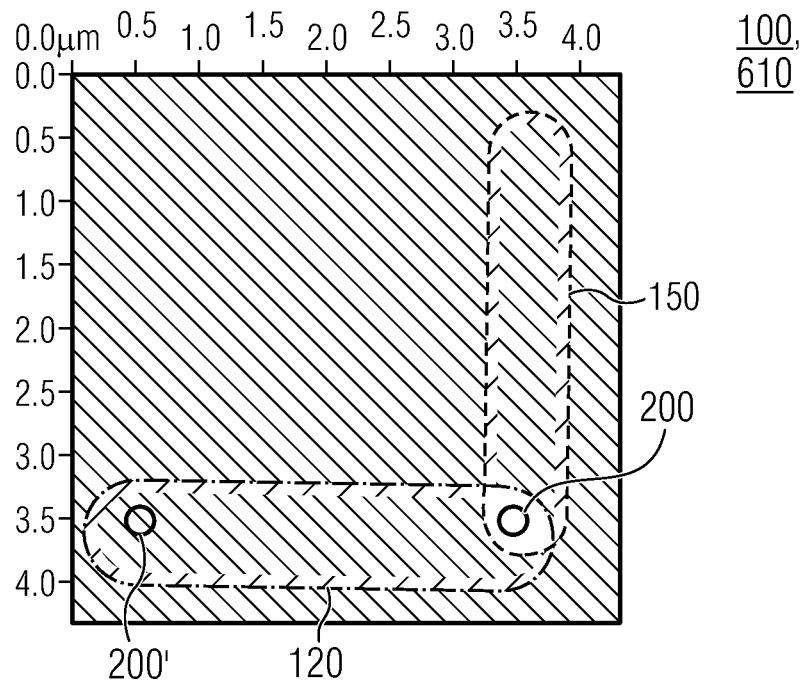
FIG. 21a shows a topography of a nanomagnetic logic gate 100 according to an embodiment.

To further illustrate the field coupling capabilities, FIG. 21a shows a topography of an angled nanomagnetic logic gate 100 in the form of a magnetic via 610. The nanomagnetic logic gate 100 once again comprises a first structure 120, a second structure 150 and an artificial nucleation center 200, wherein the first structure 120 is arranged in a top layer and the second structure 150 is arranged in a bottom layer. As a consequence, the first structure 120 is also referred to as the top magnet, while the second structure 150 is referred to as the bottom magnet.

Figure 21B:
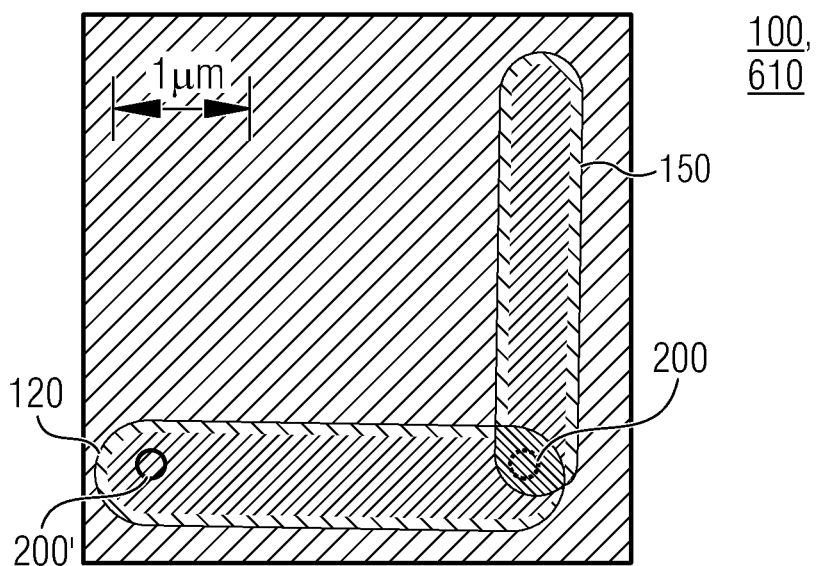
Figure 22:
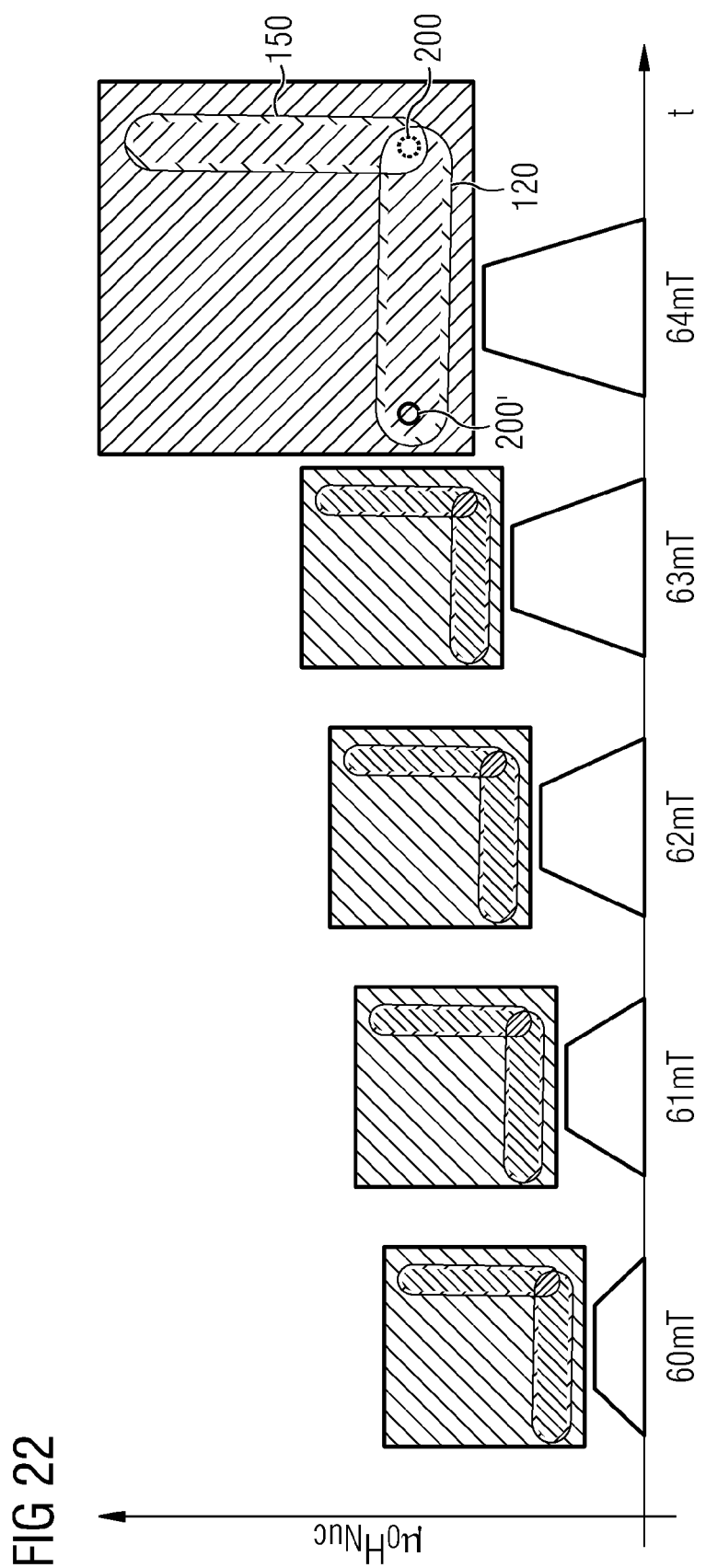

FIG. 21b shows the results of a MFM-measurement performed on the nanomagnetic logic gate 100 shown in FIG. 21a. To be more precise FIG. 21b shows an initial state before an experiment is conducted which is shown in FIG. 22. Both the first structure and the second structure are in the binary state 0. In the experimental setup shown in FIGS. 21a and 21b, it is to be noted that also the first structure 120 comprises an artificial nucleation center 200'. The artificial nucleation center 200' is designed such that its coercive field strength is lower or equal than that of the artificial nucleation center 200. Therefore, the magnetization of the first structure 120 will first switch or flip once a sufficiently high magnetic field is coupled into the artificial nucleation center 200'. However, it is expected that due to the magnetic coupling of the artificial nucleation center of the second structure 150, also the magnetization of the second structure 150 will follow that of the first structure 120.

FIG. 22 then shows the experimental results of similar MFM-measurements once the nanomagnetic logic gate 100 according to an embodiment is subjected to a sequence of magnetic pulses with an increasing magnetic field strength. Starting with 60 mT up to 62 mT, the magnetizations of neither of the input nor the second structures 120, 150 changes. However, when the magnetic field of 64 mT is applied, the artificial nucleation center 200' of the first structure 120 flips, causing also the magnetization of the first structure 120 to flip. This causes the magnetization of the artificial nucleation center 200 of the second structure 150 to switch, which in turn also flips the magnetization of the second structure 150. This, in other words, demonstrates once again the field coupling of a magnetic via 610 as one embodiment of a nanomagnetic logic gate 100.

Figure 23A:
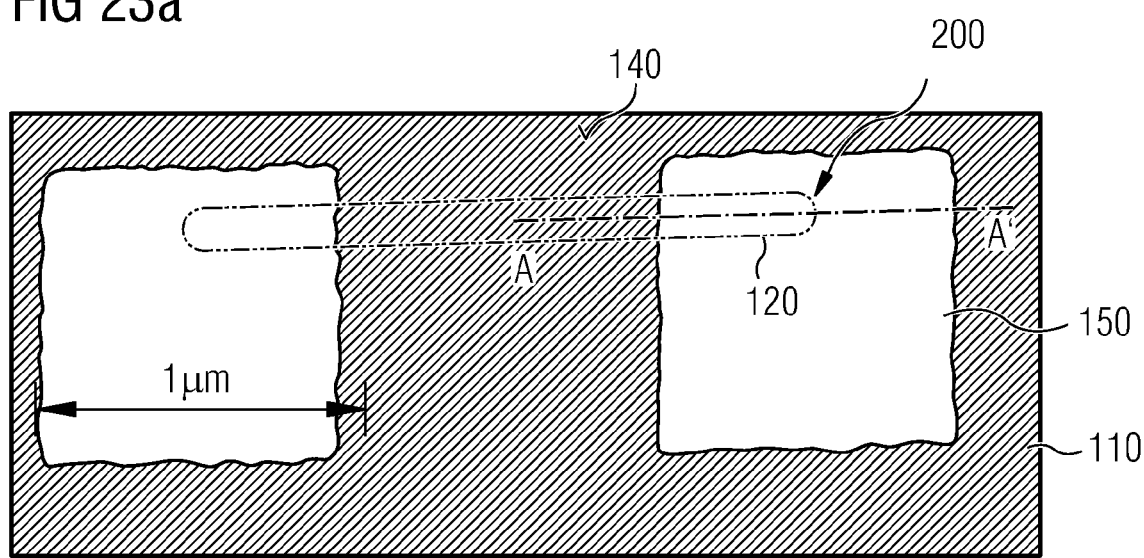
FIG. 23a shows a scanning electron microscopy picture of a programmable permalloy-input using in-plane magnetization.
Figure 23B:
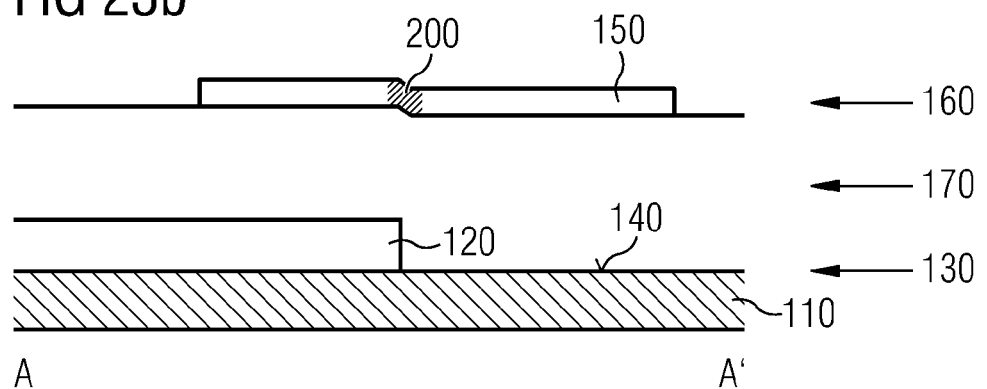

To illustrate that it is also possible to use in-plane magnetic field as first structures, FIG. 23*a* shows a scanning electron microscopy picture (SEM) showing a second structure 150 based on a cobalt/platinum multilayer (Co/Pt) comprising a FIB-induced artificial nucleation center 200. The second structure 150 is arranged in an upper layer (second layer 160) while the first structure is fabricated from permalloy and arranged in the first layer 130 directly on the main surface 140 of the substrate 110. The first structure 120 is separated and electrically insulated from the second structure 150 by a dielectric and insulating layer 170. The permalloy first structure 120 comprises an in-plane magnetization parallel to the main surface 140. However, since the first structure 120 comprises an essentially dipole-like magnetic field, the artificial nucleation center 200 is also subjected to a magnetic field component perpendicular to the main surface 140 by the magnetization of the first structure 120. The experimental results of this experiment show that it is possible to program the cobalt/platinum-based second structure 150 using an in-plane magnetization.

Figure 24:
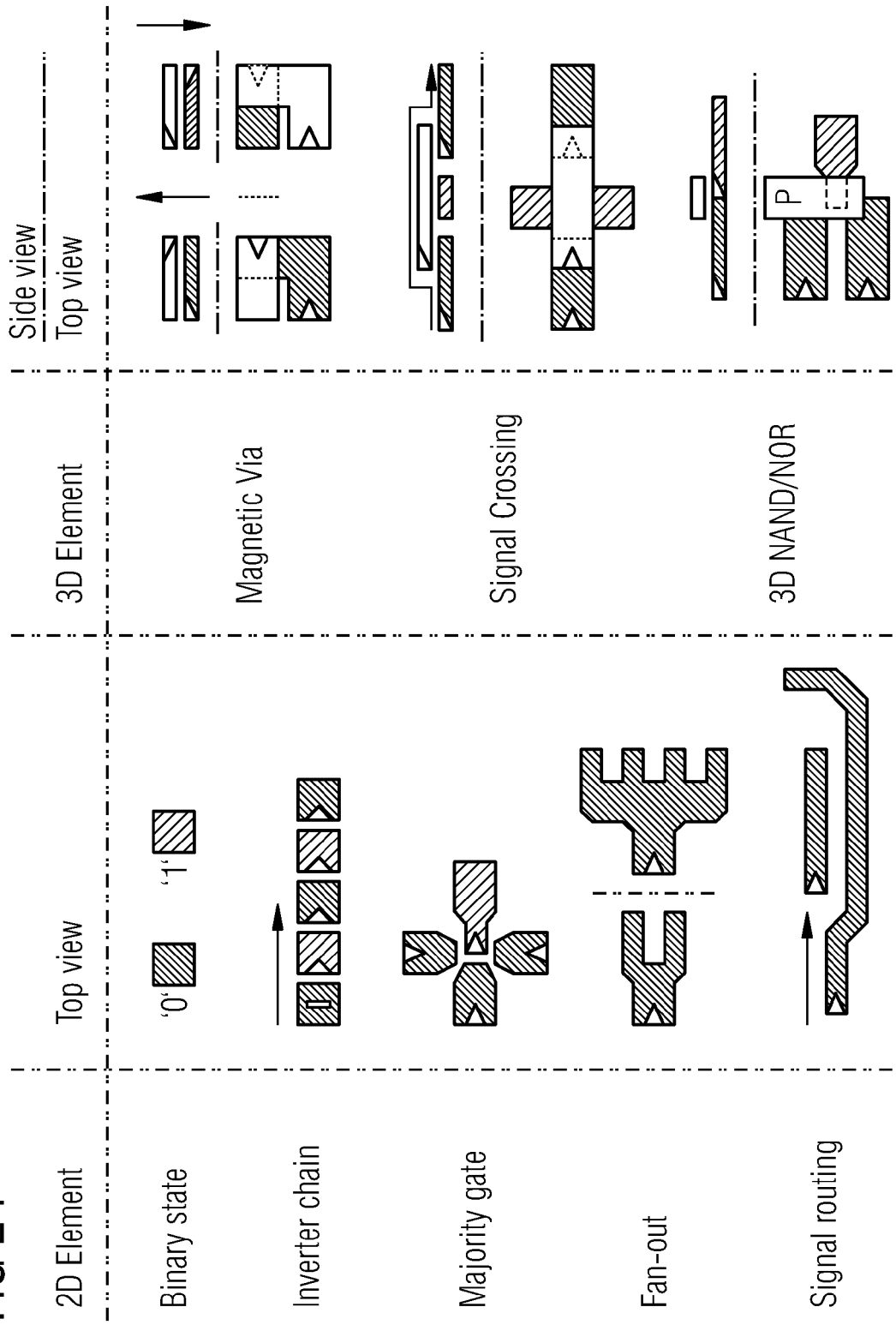
FIG. 24 shows an overview of two-dimensional and three-dimensional nanomagnetic logic gates.

FIG. 24 shows a schematic overview of several two-dimensional nanomagnetic logic gates in the left part of FIG. 24 and several three-dimensional nanomagnetic logic gates according to an embodiment in the right part of the FIG. 24. For instance, in the right part the previously-described magnetic via structure 610, the signal crossing 620 and the programmable three-dimensional NAND/NOR-gate 640 is shown. In the left part of FIG. 24 two-dimensional structures, which may be combined with nanomagnetic gates 100 according to an embodiment are shown, for instance, comprising storage cells with binary states, an inverter chain, a majority gate, a fan-out structure with two outputs and four outputs and several signal routing options. It is to be noted that in FIG. 24 the artificial nucleation centers 200 are depicted by small triangles.

Figure 25:
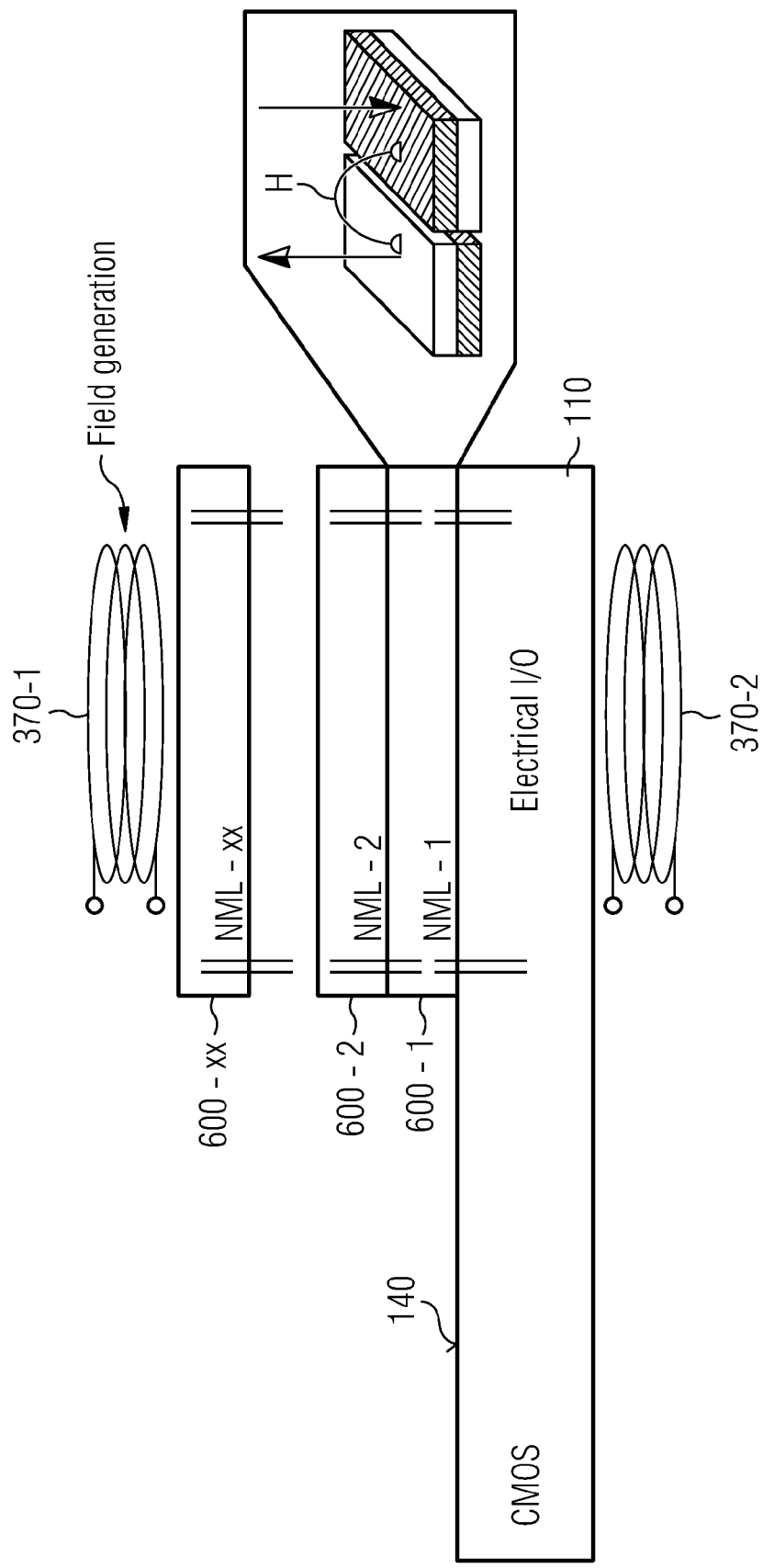
FIG. 25 shows a schematic cross-section through an electronic device according to an embodiment.

FIG. 25 shows a cross-section through an electronic device 300 according to an embodiment. The electronic device 300 comprises a substrate 110 with several nanomagnetic layer assemblies 600-1, 600-2 and 600-*xx* as already shown and discussed in FIG. 12. The nanomagnetic logic layer assemblies 600 comprise nanomagnetic logic gates and other nanomagnetic logic structures, which is indicated by the two coupled dots shown on the right-hand side of FIG. 25.

To provide the clocked magnetic field, the electronic device 300 comprises two electric conductors 370-1, 370-2, which are arranged on both sides of the substrate 110 and the nanomagnetic logic layer assembly 600 arranged on the main surface 140 of the substrate 110. The electrical conductors 370 are formed as coils and part of a magnetic field generator 360 which is only partially shown in FIG. 25.

The electrical device 300 as shown in FIG. 25 may comprise both CMOS-components and nanomagnetic logic components, therefore, representing a CMOS/NML system, which may be used for memory-intensive and parallel computations carried out in the NML sections of the device 300. The electronic device 300 may offer a reconfigurability of the NML sections in the runtime environment, whereas the CMOS structures may, for instance, comprise a central processing unit (CPU) and other interfaces for communication with further components. In other words, the electronic device 300 may be used as a nanomagnetic co-processor.

FIG. 26 shows a further embodiment of an electronic device 300 which is similar to the one shown in FIG. 12. Therefore, reference is made with respect to the description of FIG. 12.

However, the electronic device 300 as shown in FIG. 26 differs from the one shown in FIG. 12 by, for instance, the magnetic field generator 360. The magnetic field generator 360 comprises also a control circuit 380 comprised in the substrate 110 as a CMOS power-clock oscillator, but the electrical conductor 370 implemented as a coil, uses a magnetic yoke 700 to guide the magnetic field provided by the electrical conductor 370. To be more precise, the magnetic yoke 700 is arranged on top of the main surface 140 and configured in such a way that the nanomagnetic layer assemblies 600 and, hence, the nanomagnetic logic gates, are arranged in between two legs 710-1, 710-2 of the yoke 700. The coil-like electrical conductor 370 is arranged in a base part 720 of the yoke 700.

Figure 27A:
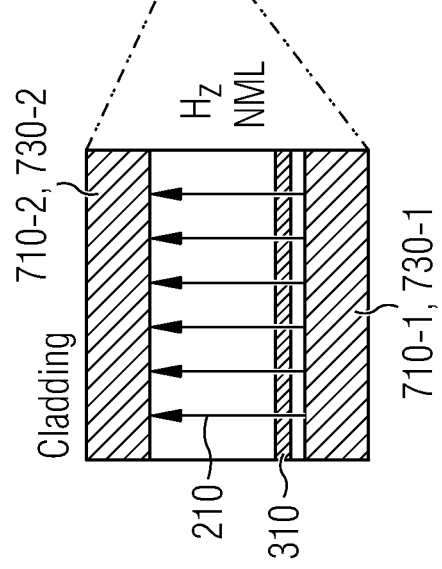
FIG. 27a shows a top view of an on-chip adapter as a possible clock implementation.

FIG. 27*a* shows a top view of an on-chip inductor as the electrical conductor 370 as a possible clock implementation. The electrical conductor 370 is meander-like structured and separates several ten micrometers wide, for instance, 40 μm-wide areas 310, in which nanomagnetic logic gates 100 according to an embodiment may be arranged.

Figure 27C:
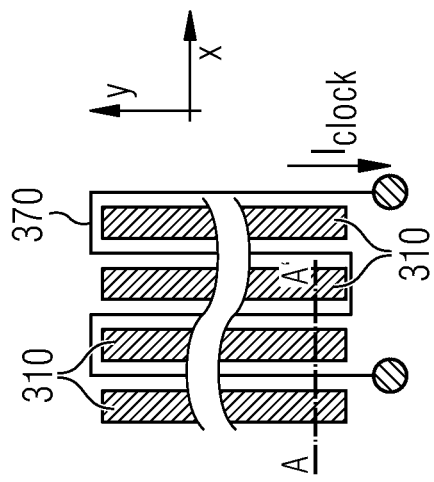
FIG. 27c shows an enlarged view of a cross-section of FIG. 27b.
Figure 27B:
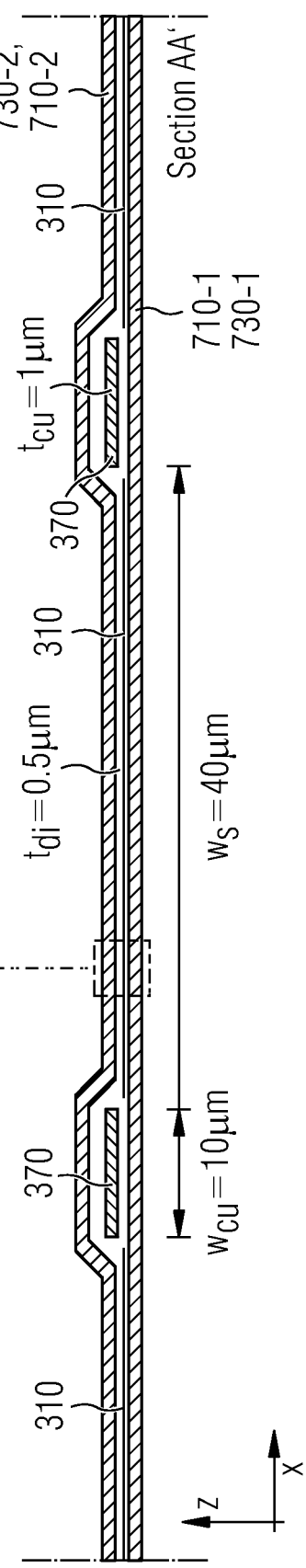

FIG. 27*b* shows a cross-sectional view through the on-chip inductor shown in FIG. 27*a* along a line A-A'. FIG. 27*b* shows that the electrical conductors 370 are formed as an approximately 10 μm-wide strip made of copper (Cu) which is separated from cladding layers 730 forming the legs 710-1, 710-2 by a dielectric layer of, for instance, approximately 500 nm thickness. In between the areas of the electrical conductors 370, the areas 310 are arranged which may comprise the nanomagnetic logic gates 100 according to an embodiment and which are, due to their arrangement, also referred to as clocking zones.

As materials for the cladding layers 730 of the legs 710 of the yoke 700 in principle any soft magnetic material may be used. For instance, the previously mentioned permalloy, but also other materials such as CoZrTa, a cobalt-zirconium-tantalum-alloy. Moreover, it should be noted that the dimensions shown in FIGS. 27*a* to 27*c* may, naturally, be varied according to the special needs of an application.

FIG. 27*c* shows an enlarged cross-section with the external magnetic field caused and guided by the legs 710 of the yoke 700.

In other words, the magnetic field generator 360 may comprise a first cladding layer 730-1 and a second cladding layer 730-2 between which at least one nanomagnetic logic gate 100 according to an embodiment is arranged, wherein the cladding layers 730-1, 730-2 are essentially parallel-aligned with the main surface 140 of a substrate 100. Furthermore, an electrical conductor 370 of the magnetic field generator 360 may be arranged in between the first and second cladding layers 730-1, 730-2.

Concerning 3D magnetic circuits and the basic elements, besides the established majority gate also other basic logic circuits (NAND, NOR, XOR, MUX, Memory Cell etc.) and other switching elements and gates with more than 3 inputs can be generated with the 3D devices. They can also be employed as key element for gates with multiple inputs of different coupling weight, which could be used for 3D neuronal networks or for error-correcting code (ECC) algorithms, where such functions are needed.

A special challenge of NML has been up to now the cross-over element, which realizes the crossing of 2 wires with separate signals. In electrical CMOS circuits this is generally done by using two levels of metallization isolated by a dielectric layer and 2 connecting contact vias. In the domain wall logic technique cross-over elements have been realized directly, which make use of the vector property of the magnetic field [27]. A rather area-consuming, i.e. expensive crossover element, is described that uses 5 majority gates but can be realized in one plane without a second layer [28].

Recent experiments in our group prove that a cross-over element can be realized according employing an embodiment in a similar fashion as in electrical circuits. The crossing of two Co/Pt wires on two separate vertical magnetic metallization layers (i.e. functional layers of Co/Pt) will allow for magnetic signal crossings, whereas the "via" is realized by vertical coupling fields in a vertical dot stack, with local FIB irradiation of the nanomagnets according to the intended direction of signal propagation as indicated by the small arrows in some of the figures to mention one process example. These cross-over elements are essential for the 3D NML proposed here in NML logic blocks as well as in the two synchronization schemes described above.

In terms of the architectures, a variety of applications, which today are realized in CMOS technology as, for instance, memory arrays, ALUs (arithmetic logic unit), FPGAs (field-programmable gate array), DSPs (digital signal processor), image recognition by systolic arrays may be implemented in 3D NML using the logic gates, the clocking scheme, the geometrical arrangement, and all I/O interfaces as depicted the figures. In all these applications, there may be important advantages of nanomagnetic logic with regard to non-volatility, low power consumption (zero leakage, zero stand-by power) and robustness. The latter may be due to radiation hardness and lack of leakage currents, which can disturb charge-based signals.

For instance, the universal majority decision allows for very high logic density, which cannot exploited so far in 2D NML.

Concerning memory arrays, embedded memories may be a substantial part of all computing systems. In NML, a magnetic memory can be embedded in a natural way without extra processes. Besides the basic non-volatile memory cell which is inherently present in each nanomagnet, also the address decoder, bitline and wordline access to the cells by special clocking schemes as well as read and write input/output pads to transfer data to the electrical environment can be realized in 3D NML. This applies also to redundancy concepts by use of programming dots, which correspond to electrical fuses, in a specific magnetic layer.

Concerning Arithmetic Logic Units (ALU), an ALU similar to the electrical QCA in [52] may be realized with Co/Pt nanomagnets using 3D geometry. In an exemplary embodiment, two 4-bit words can be used as inputs and one 4-bit word will be produced as output. Several select bits will allow to choose between different operations, namely NOT, NAND, NOR, XOR, PARITY, SHIFT LEFT, SHIFT RIGHT, IDENT, ADD, SUBTRACT, INCREASE, DECREASE, ROTATE LEFT, ROTATE RIGHT, and possibly also MULTIPLY.

Concerning Field Programmable Gate Arrays (FPGAs), field programmable custom logic has become indispensable for applications with fast development cycles and limited quantities. Due to its non-volatile character NML is inherently well suited for FPGAs. The majority gate can be reprogrammed to NAND or NOR functions during runtime, and the configuration does not necessarily have to be loaded from a non-volatile memory into the logic cells after each power up. This way, arrays of configurable logic blocks (CLBs) may be customized into a variety of logic gates. For this application the 3D integration may be of special advantage again, providing extra layers for the programming above or below the computing layers. As an example, soft-magnetic elongated dots (e.g. permalloy ellipsoids) above/below the programmable dot of a majority gate may be highly sensitive to in-plane fields and are easily switched by proper field pulses. When triggered for switching, the logic function may be immediately altered from NAND to NOR and vice-versa, providing a large design space for complex logic functionality.

Using an embodiment may allow an easy integration due to a lack of electrical interconnections. Additionally or alternatively, a power consumption may be reduced due to the non-volatile logic structures. Moreover, as a further alternative or an additional benefit, it may be possible to simplify manufacturing a logical gate structure due to a smaller amount of process steps.

Embodiments may be used, designed and tested using simulations and manufacturing of field coupled devices and circuits in magnetic multilayers. Applications may come from the fields of microelectronic, security, cryptography, processors, low-loss systems with integrated memories and other applications.

3D NML systems may exhibit the following properties and characteristics. They may be non-volatile. In other words, they may use stable, read-hard magnetic states at room temperature employing the novel architecture discussed above allowing re-programmability and a merging of memory and logic. In terms of the power, a NML system may provide a low power consumption of less than $1000 \cdot k_B T$ for a single switching event. It may be possible to use a synchronous power-clock by magnetic fields and perhaps even energy recycling. Moreover, a NML system may have a low or even zero-leakage. In principle, no electrical currents and no metallic wires are required. Electrical input/output may be implemented via an integration of hybrid NML/CMOS systems. As outlined before, a high data throughput may be achievable at an ultra-low-power consumption. The binary throughput of the NML system may be, for instance, 1.25 GBit $ns^{-1}$ $cm^{-2}$ at 2.8 aJ/operation, compared to a CMOS system having a 1.6 GBit $ns^{-1}$ $cm^{-2}$ at 100 aJ/operation.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Embodiments may relate to a processor, a controller and the like, such as digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the figures are conceptual only. Their function may be carried out through the operation of program logic, through dedicated logic, through the interaction of program control and dedicated logic, the particular technique being selectable by the implementer as more specifically understood from the context.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

What is claimed is:

1. A nanomagnetic logic gate arranged on a substrate, comprising:
   at least one nanomagnetic first structure;
   at least one nanomagnetic second structure; and
   at least two layers comprising a first layer and a second layer,
   wherein the at least one first structure is arranged in the first layer on or parallel to a main surface of the substrate;
   wherein the at least one second structure is arranged in the second layer parallel to the first layer, the structures arranged in the first layer and the second layer being electrically insulated from one another by an insulating layer arranged between the first layer and the second layer; and
   wherein the at least one second structure comprises an artificial nucleation center arranged such that a magnetic field component essentially perpendicular to the main surface provided by the at least one first structure couples to the artificial nucleation center such that a magnetization of the second structure is changeable in response to the magnetic field component coupled into the artificial nucleation center, when a predetermined condition is fulfilled.

2. The nanomagnetic logic gate according to claim 1, wherein a magnetization of the at least one second structure depends, based on a logical relationship, deterministically on a magnetization of the at least one first structure.

3. The nanomagnetic logic gate according to claim 1, wherein a magnetization of the at least one second structure comprises a ferromagnetic-like behavior comprising a coercive field strength such that subjecting the second structure to a magnetic field component perpendicular to the main surface larger than its coercive field strength causes the magnetization of the second structure to align essentially parallel to the magnetic field component.

4. The nanomagnetic logic gate according to claim 1, wherein the artificial nucleation center comprises a coercive field strength smaller than the coercive field strength of the second structure outside the artificial nucleation center.

5. The nanomagnetic logic gate according to claim 1, wherein the predetermined condition is fulfilled, when the nanomagnetic logic gate is subjected to an external magnetic field component perpendicular to the main surface with a magnetic field strength larger than the coercive field strength of the artificial nucleation center and smaller than the coercive field strength of the second structure outside the artificial nucleation center.

6. The nanomagnetic logic gate according to claim 1, wherein the nanomagnetic first and second structures are formed from at least two respective magnetic films and a further film sandwiched in between the at least two respective magnetic films.

7. The nanomagnetic logic gate according to claim 1, wherein the artificial nucleation center comprises a lower structural anisotropy than that of the second structure outside the artificial nucleation center.

8. The nanomagnetic logic gate according to claim 1, wherein the artificial nucleation center is located at an edge or close to the edge of the at least one second structure.

9. The nanomagnetic logic gate according to claim 1, wherein the nanomagnetic first and second structures comprise a height perpendicular to the main surface and a width parallel to the main surface such that the nanomagnetic structures are in a static case in a single-domain limit with respect to directions corresponding to the height and the width.

10. The nanomagnetic logic gate according to claim 1, wherein the nanomagnetic logic gate is a programmable NAND/NOR gate comprising an output structure as one of the at least one second structures, a mode input structure as one of the at least one first structures, a first input structure and a second input structure arranged such that magnetic field components provided by the mode input structure, the first input structure and the second input structure couple to the artificial nucleation center of the output structure, and wherein the artificial nucleation center is arranged such that the magnetization of the output structure is changeable according to a NAND-relationship or according to a NOR-relationship in response to the magnetic field components provided by the first input structure and the second input structure depending on the magnetic field component provided by the mode input structure.

11. The nanomagnetic logic gate according to claim 10, wherein the first input structure, the second input structure and the output structure are arranged in the second layer and wherein the mode input structure is arranged in the first layer.

12. The nanomagnetic logic gate according to claim 11, wherein the mode input structure comprises a nanomagnetic structure comprising a magnetization essentially parallel to the main surface.

13. The nanomagnetic logic gate according to claim 1, comprising an input structure as one of the at least one first structures in the first layer, an output structure as one of the at least one second structures in the second layer and a nanomagnetic transfer structure in the first layer or the second layer, wherein the nanomagnetic transfer structure crosses a projection of the output structure along a direction perpendicular to the main surface into the first layer, when the nanomagnetic transfer structure is comprised in the first layer, and wherein the nanomagnetic transfer structure crosses a projection of the input structure along a direction perpendicular to the main surface into the second layer, when the nanomagnetic transfer structure is comprised in the second layer.

14. An electronic device, comprising:
a substrate and at least one nanomagnetic logic gate arranged on the substrate, the nanomagnetic logic gate comprising at least one nanomagnetic first structure, at least one nanomagnetic second structure and at least two layers comprising a first layer and a second layer, respectively, wherein the at least one first structure is arranged in the first layer on or parallel to a main surface of the substrate, wherein the at least one second structure is arranged in the second layer parallel to the first layer, the first and second structures arranged in the first layer and the second layer, respectively, being electrically insulated from one another by an insulating layer arranged between the first layer and the second layer, and wherein the at least one second structure comprises an artificial nucleation center arranged such that a magnetic field component essentially perpendicular to the main surface provided by the at least one first structure couples to the artificial nucleation center such that a magnetization of the second structure is changeable in response to the magnetic field component coupled into the artificial nucleation center, when a predetermined condition is fulfilled;
at least one electrical input circuit arranged and configured to influence a magnetization of the at least one first structure of the at least one nanomagnetic logic gate in response to an electrical input signal; and
at least one electrical output circuit configured to sense a magnetization or a change of the magnetization of the at least one second structure of the at least one nanomagnetic logic gate, the electrical output circuit being further configured to generate an electrical output signal in response to the sensed magnetization or the sensed change of the magnetization.

15. The electronic device according to claim 14, further comprising a magnetic field generator arranged and configured to provide a clocked external magnetic field to the at least one nanomagnetic logic gate.

* * * * *